United States Patent
Shiraishi et al.

(10) Patent No.: US 7,550,043 B2
(45) Date of Patent: Jun. 23, 2009

(54) SUBSTRATE PROCESSING METHOD AND SUBSTRATE PROCESSING APPARATUS

(75) Inventors: Masatoshi Shiraishi, Kumamoto (JP); Masatsugu Nakama, Kumamoto (JP); Hideyuki Takamori, Tokyo (JP)

(73) Assignee: Tokyo Electron Limited, Tokyo (JP)

( * ) Notice: Subject to any disclaimer, the term of this patent is extended or adjusted under 35 U.S.C. 154(b) by 514 days.

(21) Appl. No.: 10/735,926

(22) Filed: Dec. 16, 2003

(65) Prior Publication Data

US 2004/0126713 A1  Jul. 1, 2004

(30) Foreign Application Priority Data

Dec. 20, 2002 (JP) ............................. 2002-370789
Mar. 17, 2003 (JP) ............................. 2003-072292
Sep. 26, 2003 (JP) ............................. 2003-336552

(51) Int. Cl.
*B05C 11/10* (2006.01)
*G03D 5/00* (2006.01)

(52) U.S. Cl. .......................... 118/52; 118/16; 396/604; 396/611

(58) Field of Classification Search .................. None
See application file for complete search history.

(56) References Cited

U.S. PATENT DOCUMENTS

| 5,626,913 | A | * | 5/1997 | Tomoeda et al. | ............ | 427/299 |
| 6,300,043 | B1 | * | 10/2001 | Konishi et al. | .............. | 430/327 |
| 6,371,667 | B1 | * | 4/2002 | Kitano et al. | ............... | 396/611 |
| 2001/0003964 | A1 | * | 6/2001 | Kitano et al. | ................ | 118/50 |
| 2002/0076658 | A1 | * | 6/2002 | Matsushita et al. | .......... | 430/322 |
| 2002/0123011 | A1 | * | 9/2002 | Kawano et al. | ............. | 430/330 |

FOREIGN PATENT DOCUMENTS

| JP | 05-197160 | | 8/1993 |
| JP | 06-089856 | | 3/1994 |
| JP | 06-188184 | | 7/1994 |
| JP | 07-078749 | | 3/1995 |
| JP | 09-232217 | A1 | 9/1997 |
| JP | 11-097329 | A | 4/1999 |
| JP | 2000-181048 | | 6/2000 |
| JP | 2002-148808 | A | 5/2002 |
| JP | 2003-045893 | A | 2/2003 |

OTHER PUBLICATIONS

JPO Office Action dated Jul. 10, 2007, App. No. 2003-336552 (2 pages).
JPO Office Action dated Sep. 11, 2007, App. No. 2003-336552 (2 pages).

\* cited by examiner

*Primary Examiner*—John A McPherson
*Assistant Examiner*—Daborah Chacko David
(74) *Attorney, Agent, or Firm*—Rader, Fishman & Grauer, PLLC

(57) ABSTRACT

A processing chamber actually performs a heating process for a substrate. The processing chamber has an upper plate, a lower plate, and an exhaust opening. The upper plate heats a resist from a front surface of the substrate. The lower plate heats the resist from a rear surface of the substrate. The exhaust opening exhausts gas from the processing chamber. The upper plate is disposed in such a manner that it can be raised and lowered in the processing chamber by an upper air cylinder that composes an upper driving mechanism. The lower plate is disposed on a floor of the processing chamber. The exhaust opening is connected to a pump through a pipe. Heating temperature and heating time of the upper plate and the lower plate are controlled by a heating control portion. A pressure in the processing chamber is controlled by a pump. The pump is controlled by a pressure controlling portion.

4 Claims, 38 Drawing Sheets

| OPTIMUM CONTROL RANGES | TEMPERATURE OF UPPER PLATE | TEMPERATURE OF LOWER PLATE | EXHAUST GAS PRESSURE | HEATING TIME |
|---|---|---|---|---|
| | 70°C~200°C | 90°C~150°C | 5Pa~100Pa | 60sec~300sec |
| NOVOLAK TYPE RESIN | 70°C~200°C | 135°C | 10Pa~50Pa | 180sec |

FIG.24

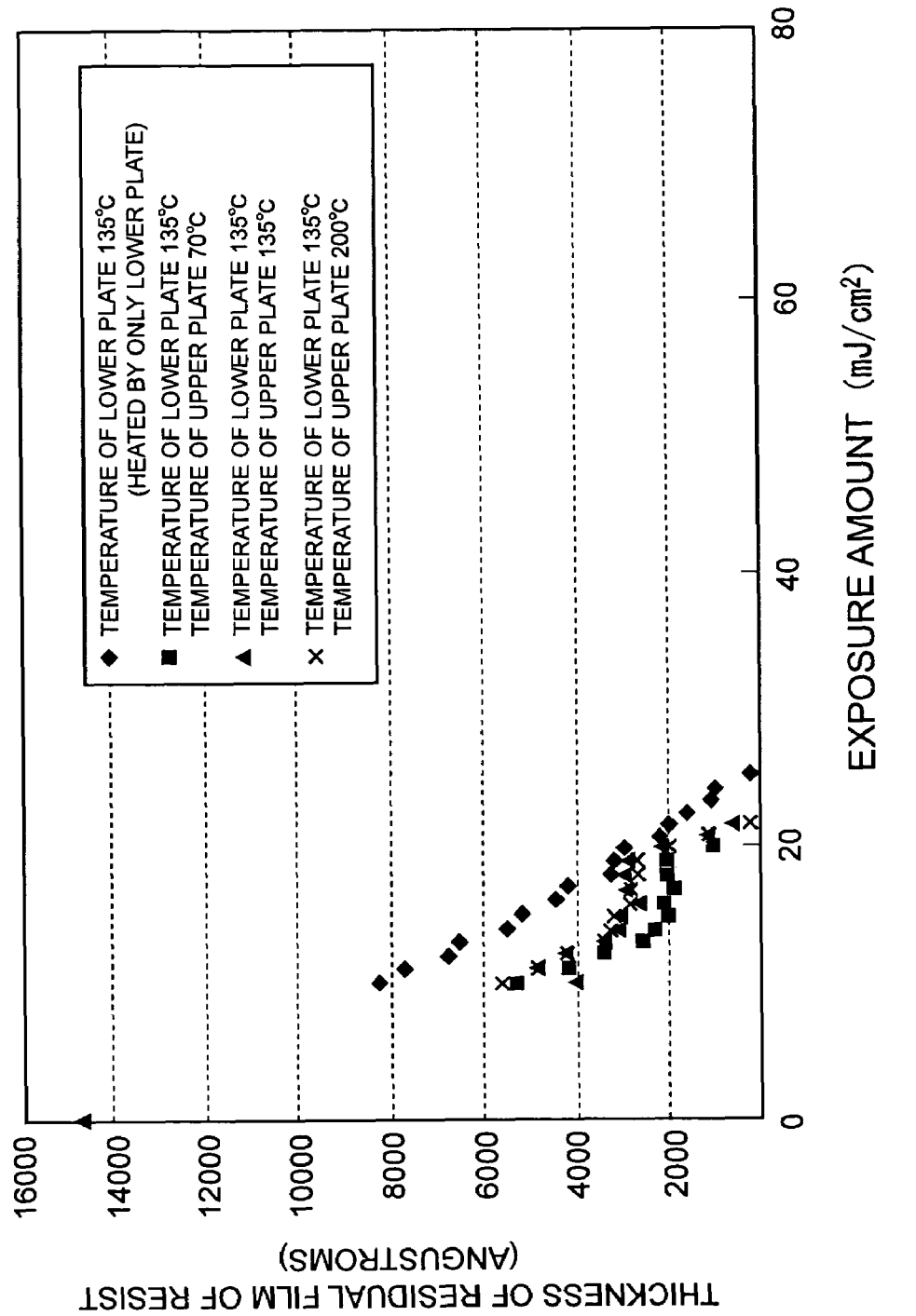

COMPARISON OF SENSITIVITY CURVES OF FPD AND CT

SUBSTRATE PROCESSING METHOD AND SUBSTRATE PROCESSING APPARATUS

BACKGROUND OF THE INVENTION

1. Field of the Invention

The present invention relates to a substrate processing method and a substrate processing apparatus for processing a glass substrate and a semiconductor substrate used for a liquid crystal display device and so forth.

2. Description of the Related Art

In a producing process for a liquid crystal display (LCD), a photolithography technology for producing a semiconductor device is also used to form an indium tin oxide (ITO) thin film and an electrode pattern on a glass substrate for an LCD. In the photolithography technology, photoresist is coated on a glass substrate. Thereafter, the photoresist on the glass substrate is exposed and developed.

As an example of the exposing method, a so-called half-exposing method is known. In the ordinary exposing method, a portion not to be exposed is covered with a mask so as to insulate it from light. In contrast, in the half-exposing method, a half-tone mask or the like that has regions with different transmittances. With the half-tone mask, a region whose exposure amount is smaller than the other regions, namely, a region whose exposure depth is smaller than the other regions can intentionally be formed. As a result, the exposure depths of regions can be varied like a region covered with a mask (namely, a fully exposed region), a region covered with a half-tone mask (namely, a lightly exposed region), and a region that is covered with a mask (namely, a non-exposed region). As a result, with one mask, a film having different resist film thicknesses can be formed. As a result, the half-exposing method allows the number of masks to be decreased. Consequently, the process time necessary for replacing masks can be shortened (as disclosed in for example Japanese Patent Laid-Open Publication No. HEI 09-080740 paragraphs 0002, 0003, and so forth).

A half-tone mask has a plurality of half-light insulating regions of the same shape and same area. Thus, the depths and widths of half-exposed regions have to be the same.

However, actually, when a photoresist is half-exposed, the depths and widths of half-exposed regions vary. As a result, a residual film of the developed resist becomes nonuniform. In other words, the aspect ratio and pitch of the developed resist pattern become nonuniform. In reality, the residual film of the developed resist deviates by 10 percent or more against a desired value. Thus, the distances of a plurality of electrodes that have etched become nonuniform. As a result, switching times of different regions of one device vary. Thus, when a picture is displayed on for example an LCD, color shading and so forth result in.

SUMMARY OF THE INVENTION

The present invention is made from the foregoing point of view. An object of the present invention is to provide a substrate processing method and a substrate processing apparatus that allow the uniformity of a residual film of a half-exposed region to be improved and the distances of formed electrodes to become uniform.

To accomplish the foregoing object, an aspect of the present invention is a substrate processing method, comprising the steps of: (a) coating a resist on a substrate so as to form a resist film thereon; (b) controlling a distribution of a dissolving characteristic against a developing solution used for a developing process in a direction of a thickness of the resist film, wherein the step (b) being performed before the developing process is performed for the substrate coated with the resist film.

According to the present invention, the dissolving characteristics of a resist against a developing solution are distributed in the direction of the thickness (depth) of a resist film. As a result, a layer that is easily dissolvable against the developing solution and a layer that is uneasily dissolvable against the developing solution are contrastively formed. In other words, a layer in which the development of the resist is promoted and a layer in which the development of the resist is demoted can be formed. As a result, the reaction speeds of the development can be varied in the direction of the thickness of the film. For example, when a layer that is easily dissolvable against the developing solution is formed on the front surface side of the resist film, only the front side can be developed. Thus, even if the exposure depths and exposure widths vary with half-exposed regions, the uniformity of the residual film of the half-exposed regions can be improved. As a result, the distances of electrodes that will be formed later become uniform.

A region in which a layer that is easily dissolvable against the developing solution is formed, is, for example, a region having a predetermined depth (a desired depth for which the resist is half-exposed) from the front surface of the resist for which the resist is half-exposed.

The half-exposing method is an exposing method that is performed with for example a half-tone mask having regions with different transmittances so as to intentionally form a region whose exposure amount (exposure depth) is smaller than the other regions.

According to an embodiment of the present invention, the step (a) has the step of coating on the substrate a resist that contains a material having an affinity against the developing solution used for the developing process. The step (b) has the step of performing a predetermined process for the resist coated on the substrate so as to non-uniformly distribute the material in the direction of the thickness of the resist film. According to the present invention, since a material having an affinity is nonuniformly distributed on the front surface side of the resist film, a layer that is easily dissolvable against the developing solution can be formed in a region on the front surface side. The predetermined process is for example a thermal process or a pressure reducing process. One of these processes or both thereof may be performed.

According to an embodiment of the present invention, the step (b) has the step of supplying the developing solution used for the developing process to the resist coated on the substrate so as to form an uneasily dissolvable layer on a front surface side of the resist film. When exposure light is irradiated to the resist, a chemical reaction takes place therein and the resist is reformed to a matter that is easily dissolvable against the developing solution. When the developing time is constant, there is a correlation of exposure energy and the thickness of resist that has been developed. In other words, when exposure light whose exposure energy is equal to or smaller than a predetermined value is irradiated to the resist, it does not react. In contrast, when the exposure energy exceeds a predetermined value, the reaction of the resist sharply increases. Thus, with a small increase of exposure energy, the thickness of the resist largely decreases. Since the half-exposing method causes the resist that sharply exposure-reacts to be stopped in the middle, the thickness of the developed resist largely varies with a small deviation of the exposure time and exposure intensity.

According to the present invention, before the resist is exposed, the developing solution is supplied to the resist so as to form an uneasily dissolvable layer. Thus, the resist in the region in which the uneasily dissolvable layer is formed slowly exposure-reacts. Thus, even if the exposure time and exposure intensity slightly deviate, the thickness of the resist that has been developed does not largely vary. The exposure depth of the resist can be easily controlled. As a result, after the resist is developed, the uniformity of a residual film of a region that is half-exposed can be improved. Thus, the distances of electrodes become uniform.

Another aspect of the present invention is a substrate processing method, comprising the steps of: (a) coating a resist on a substrate so as to form a resist film thereon; and (b) controlling a moisture content of the resist coated on the substrate in a direction of a thickness of the resist film. According to the present invention, at the step (b), the distribution of the reaction characteristic of the resist against exposure light used for the exposing process for the substrate is controlled in the direction of the thickness of the resist. To cause the resist to chemically react with exposure light, the resist should contain a predetermined amount of moisture. If the resist does not contain sufficient moisture, even if the resist is exposed, it hardly reacts. Unless the resist exposure-reacts, it does not dissolve against the developing solution. According to the present invention, the moisture content of the resist is controlled so that a region that contains the predetermined amount of moisture securely reacts in the resist film. As a result, the reaction speed of the resist can be varied in the direction of the film thickness. Thus, when a layer whose exposure-reaction is promoted is formed on the front surface side of the resist film under control of the moisture, only the surface side can be developed. Thus, even if the exposure depth and exposure width vary with half-exposed regions, the uniformity of the residual film of the resist of the half-exposed regions can be improved. Thus, the distances of electrodes that will be formed later become uniform.

According to the aspect of the present invention, the substrate processing method further comprises the step of: drying the resist film coated at the step (a) before the step (b) is performed, wherein the step (b) is performed by supplying moisture on a front surface of the dried resist film so as to control the moisture content. After the resist film is dried, since moisture is supplied thereto, the moisture content can be relatively easily controlled.

Another aspect of the present invention is a substrate processing apparatus, comprising: resist film forming means for coating a resist on a substrate so as to form a resist film thereon; and controlling means for controlling a distribution of a dissolving characteristic of the resist against a developing solution used for developing the resist in a direction of a thickness of the resist film.

According to the present invention, since the dissolving characteristic of the resist against the developing solution is distributed in the direction of the thickness (depth) of the resist film, a layer that is easily dissolvable against the developing solution and a layer that is uneasily dissolvable against the developing solution can be contrastively formed. Thus, even if the exposure depth and exposure width vary with half-exposed regions, the uniformity of the residual film of the resist of the half-exposed regions can be improved. Thus, the distances of electrodes that will be formed later become uniform.

Another aspect of the present invention is a substrate processing method, comprising the steps of: (a) coating a resist on a first surface of a substrate; (b) heating the resist coated on the first surface of the substrate from the first surface side and a second surface side opposite to the first surface of the substrate; and (c) half-exposing the heated resist.

In such a structure, the resist can be dried from the rear surface side of the substrate. In addition, the front surface of the resist can be baked and hardened. The front surface of the resist is baked and hardened so as to prevent moisture from evaporating from the rear surface that is heated. As a result, a constant amount of moisture resides in the resist. Consequently, a flat layer whose moisture content is small is formed on the rear surface side of the resist. A layer that contains residual moisture is formed from the front surface of the resist to the intermediate portion thereof. To cause the resist to exposure-react, moisture is required. When the resist is half-exposed, a region whose water content is small does not exposure-react. Thus, the flat layer on the rear surface side of the resist is not exposed. When the resist is developed, the flat layer that does not exposure-react becomes a residual film. As a result, a flat layer as a residual film that is not affected by exposure amount can be formed after the resist is developed. Thus, the dissolving characteristic of the resist can be controlled in the direction of the depth of the resist. Consequently, the uniformity of a residual film of a region that has been half-exposed can be improved.

According to the aspect of the present invention, wherein the step (b) has the steps of: (d) heating the substrate from the first surface side at a first temperature; and (e) heating the substrate from the second surface side at a second temperature. In such a structure, since the first temperature and the second temperature can be independently set, even if a different type of a resist is used, it can be independently heated in those steps at optimum temperatures.

According to the aspect of the present invention, wherein the step (d) is performed by heating the substrate from the first surface side at a temperature in the range from 70° C. to 200° C. In such a structure, when the first temperature is varied in the range from 70° C. to 200° C., the resist can be heated at an optimum temperature corresponding to the type thereof.

According to the aspect of the present invention, the step (e) has the step of heating the substrate from the second surface side at a temperature in the range from 90° C. to 150° C. In such a structure, when the second temperature is varied in the range from 90° C. to 150° C., the resist can be heated at an optimum temperature corresponding to the type thereof.

According to the aspect of the present invention, (f) controlling a pressure applied at least to the resist during the step (b). In such a structure, even if a different type of a resist is used, it can be heated at its step under an optimum pressure.

According to the aspect of the present invention, the step (f) has the step of reducing the pressure applied to the resist from the atmospheric pressure by 5 Pa to 100 Pa. In such a structure, when the pressure applied to the resist is variably decreased from the atmospheric pressure by 5 Pa to 100 Pa, even if a different type of a resist is used, it can be heated under an optimum pressure corresponding to the type of the resist.

According to the aspect of the present invention, the step (b) has the step of controlling a heating time for which the resist is heated in the range from 60 seconds to 300 seconds. In such a structure, when the heating time for the resist is varied in the range from 60 seconds to 300 seconds, even if a different type of a resist is used, it can be heated for an optimum heating time corresponding to the type of the resist.

Another aspect of the present invention is a substrate processing apparatus capable of transferring a substrate, having a first surface and a second surface opposite to the first surface, to an exposing unit for half-exposing a resist coated on the substrate, comprising: a coating portion for coating the resist on the first surface of the substrate; a heating portion for heating the resist coated on the first surface of the substrate from the first surface side and the second surface side; and an interface portion for allowing the substrate heated by the heating portion to be transferred to the exposing unit.

In such a structure, the resist coated by the coating portion can be dried from the rear surface side of the substrate by the heating portion. In addition, the front surface of the resist can be heated from the front surface side of the substrate by the heating portion. As a result, the front surface of the resist can be baked and hardened. The front surface of the resist is baked and hardened so as to prevent moisture from evaporating from the rear surface that is heated. As a result, a constant amount of moisture resides in the resist. Consequently, a flat layer whose moisture content is small is formed on the rear surface side of the resist. A layer that contains residual moisture is formed from the front surface of the resist to the intermediate portion thereof. To cause the resist to exposure-react, moisture is required. When the resist is half-exposed, a region whose water content is small does not exposure-react. Thus, the flat layer on the rear surface side of the resist is not exposed. When the resist is developed, the flat layer that does not exposure-react becomes a residual film. As a result, a flat layer as a residual film that is not affected by exposure amount can be formed after the resist is developed. Thus, the dissolving characteristic of the resist can be controlled in the direction of the depth of the resist. Consequently, the uniformity of a residual film of a region that has been half-exposed can be improved.

According to the aspect of the present invention, the heating portion has: a first heating plate for heating the resist coated on the first surface of the substrate from the first surface side at a first temperature; and a second heating plate for heating the resist coated on the first surface of the substrate from the second surface side at a second temperature. In such a structure, since the first heating plate heats the resist at the first temperature and the second heating plate heats the resist at the second temperature, the temperature can be independently set. Thus, even if a different type of a resist is used, these heating plates can heat the resist at an optimum temperature corresponding to the type thereof.

Another aspect of the present invention is a substrate processing method, comprising the steps of: (a) coating a first resist that exposure-reacts with a first exposure energy on a substrate; (b) coating a second resist that exposure-reacts with a second exposure energy that is smaller than the first exposure energy on the surface of the first resist; and (c) half-exposing the first resist and the second resist with a mask that causes the first resist to be exposed with the first exposure energy and the second resist to be exposed with the second exposure energy.

According to the present invention, the first resist that exposure-reacts with the first exposure energy and the second resist that exposure-reacts with the second exposure energy are coated in succession on the substrate. Thus, since the first resist and the second resist are half-exposed, for example the first resist does not exposure-react and the second resist exposure-reacts. As a result, the exposure reaction of the first resist can be separated from the exposure reaction of the second resist. Thus, after the resists are half-exposed, the uniformity of the residual film of the resists can be improved.

According to the aspect of the present invention, the substrate processing method further comprises the step of: (d) drying the first resist, wherein the step (d) is performed between the step (a) and the step (b). Thus, while the front surface of the first resist is dried, the second resist can be coated thereon. As a result, the first resist and the second resist can be prevented from being mixed. Thus, after the resists have been half-exposed, the uniformity of the residual film of the resists can be improved further.

According to the aspect of the present invention, the step (a) is performed while the substrate is being rotated. Thus, the surface of the first resist coated on the substrate can be made flat. In addition, the first resist coated on the substrate can be quickly dried.

According to the aspect of the present invention, the step (a) is performed while moving a first nozzle for coating the first resist on the surface of the substrate; or the step (b) is performed while moving a second nozzle for coating the second resist on the surface of the substrate. Thus, the second resist can be coated on the first resist. As a result, the first resist and the second resist can be prevented from being mixed.

According to the aspect of the present invention, the step (a) is performed while moving a first nozzle for coating the first resist on the surface of the substrate; and the step (b) is performed while moving a second nozzle for coating the second resist on the surface of the substrate. Thus, the second resist can be coated on the first resist. As a result, the first resist and the second resist can be prevented from being mixed. In addition, since the first nozzle and the second nozzle are moved along the substrate at the step (a) and the step (b), a mechanism that rotates the substrate can be omitted. Thus, the cost of the apparatus can be reduced.

According to the aspect of the present invention, the substrate processing method further comprises the step of: (e) coating an organic solvent on the surface of the first resist, wherein the step (e) is performed between the step (a) and the step (b), and wherein the second resist is coated on the surface of the first resist coated with the organic solvent. Thus, the layer of organic solvent coated on the front surface of the first resist prevents the first resist and the second resist from being mixed.

According to the aspect of the present invention, wherein the second exposure energy is 50 percent to 70 percent of the first exposure energy. In this case, a half-tone mask having a region with a transmittance in the range from 50 percent to 70 percent is used. Thus, when the second exposure energy is smaller than 50 percent of the first exposure energy, the second resist can be prevented from incorrectly reacting with the small energy of smaller than 50 percent of the first exposure energy. When the second exposure energy exceeds 70 percent of the first exposure energy, the value of the first exposure energy becomes close to the value of the second exposure energy. Thus, the exposure reaction of the first resist and the exposure reaction of the second resist can be separated.

Another aspect of the present invention is a substrate processing method, comprising the steps of: (a) coating a first resist that exposure-reacts with a first exposure energy on a substrate; (b) flattening a front surface of the first resist coated on the substrate; (c) coating a second resist that exposure-reacts with a second exposure energy that is smaller than the first exposure energy from the front surface side of the flattened first resist; and (d) half-exposing the first resist and the second resist with a mask that causes the first resist to be exposed with the first exposure energy and the second resist to be exposed with the second exposure energy.

According to the present invention, the substrate is rotated or ultrasonic wave is applied on the front surface of the first resist coated on the substrate so as to cause the front surface of the first resist to be flat. The second resist is coated on the front surface of the first resist that has become flat. Thus, the front surface of the first resist that is developed and exposed can be made flat.

Another aspect of the present invention is a substrate processing apparatus, comprising: a holding portion for holding a substrate; a first nozzle for coating to the substrate held by the holding portion a first resist that exposure-reacts with first exposure energy; a second nozzle for coating to a surface of the first resist a second resist that exposure-reacts with a second exposure energy smaller than the first exposure energy; and a driving portion for driving at least the second nozzle of the first nozzle and the second nozzle along with the surface of the substrate held by the holding portion.

According to such structure, the first resist that exposure-reacts with the first exposure energy and the second resist that exposure-reacts with the second exposure energy can be coated in this order on the substrate. Thus, since the first resist and the second resist are half-exposed with a half-tone mask having regions with different transmittances, for example the first resist does not exposure-react and the second resist exposure-reacts. As a result, the exposure reaction of the first resist can be separated from the exposure reaction of the second resist. Thus, after the resists are half-exposed, the uniformity of the residual film of the resists can be improved.

These and other objects, features and advantages of the present invention will become more apparent in light of the following detailed description of a best mode embodiment thereof, as illustrated in the accompanying drawings.

BRIEF DESCRIPTION OF DRAWINGS

FIG. 24 is a table showing optimum conditions of a heating process.

FIG. 27 is a graph showing the relation of the exposure amount and the thickness of a residual film of a resist that has been developed.

DESCRIPTION OF PREFERRED EMBODIMENTS

Next, with reference to the accompanying drawings, embodiments of the present invention will be described.

First Embodiment

Figure 1:
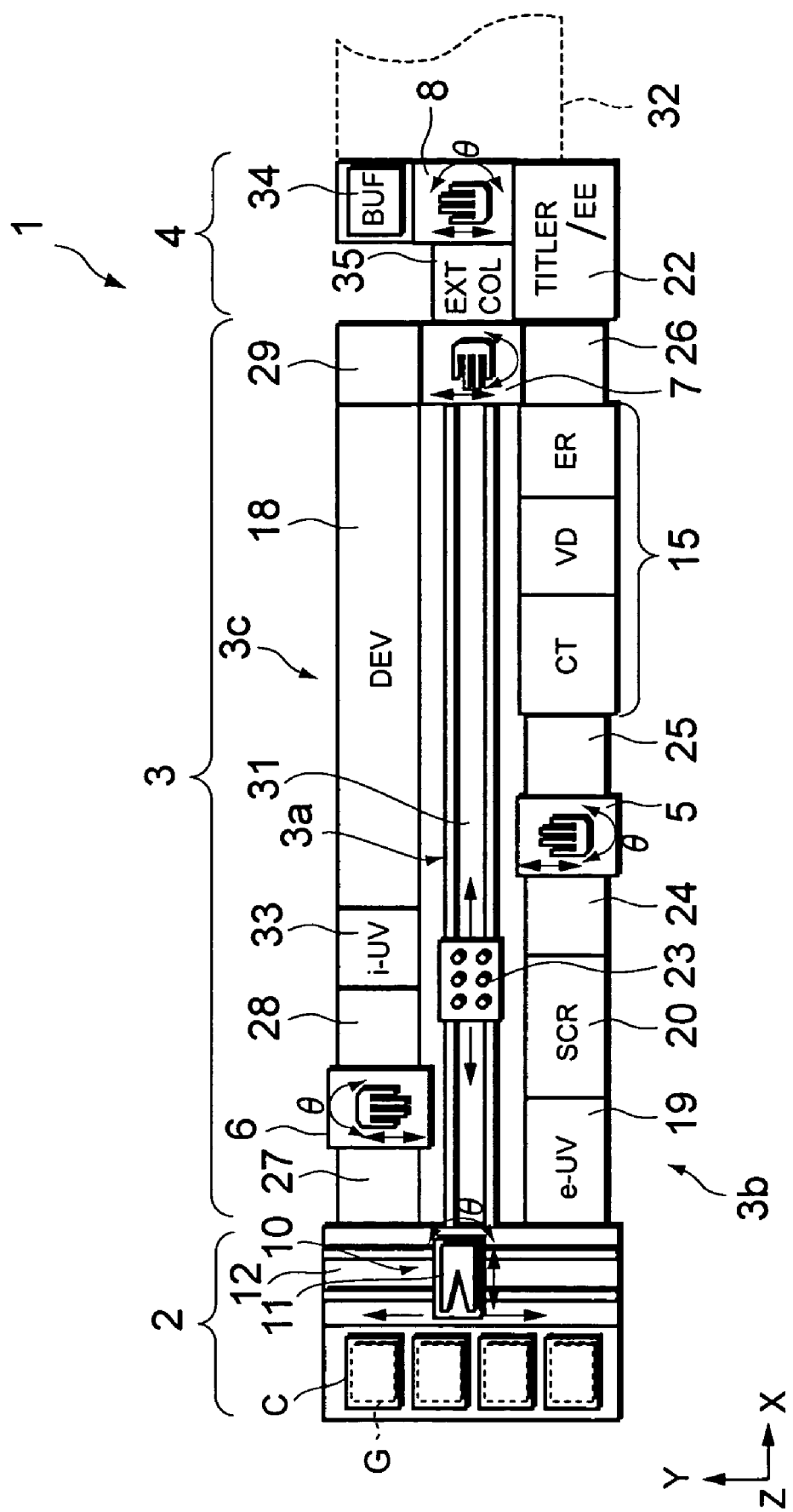
FIG. 1 is a plan view showing the overall structure of a coating and developing process system according to an embodiment of the present invention.
Figure 2:
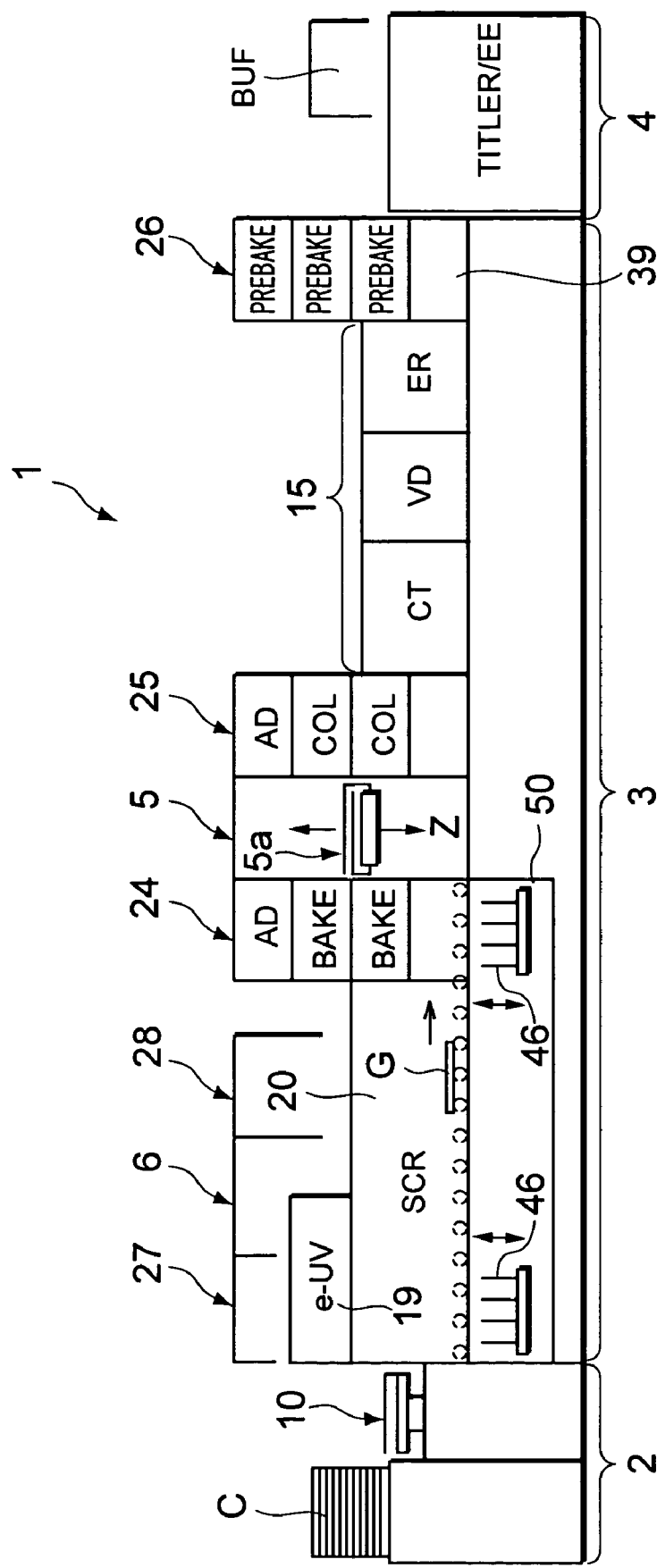
FIG. 2 is a front view showing the coating and developing process system shown in FIG. 1.
Figure 3:
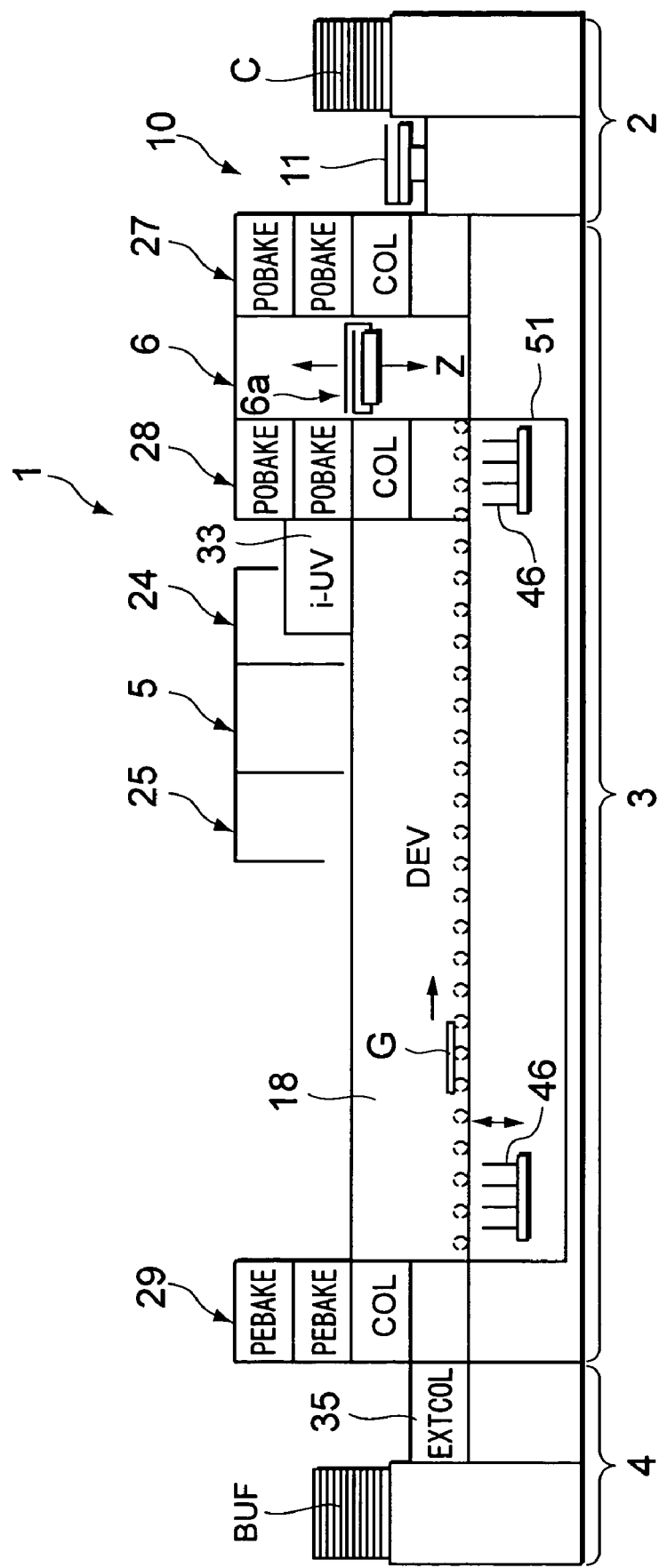
FIG. 3 is a rear view showing the coating and developing process system shown in FIG. 1.

FIG. 1 is a plan view showing a coating and developing process system for an LCD substrate according to a first embodiment of the present invention. FIG. 2 is a front view showing the system. FIG. 3 is a rear view showing the system.

The coating and developing process system 1 has a cassette station 2, a process portion 3, and an interface portion 4. On the cassette station 2, cassettes C are placed. Each of the cassettes C accommodates a plurality of glass substrates G. The process portion 3 has a plurality of process units that perform a sequence of processes including a resist coating process and a resist developing process for a substrate G. The interface portion 4 transfers a substrate G with an exposing unit 32. The cassette station 2 and the interface portion 4 are disposed at both ends of the process portion 3.

The cassette station 2 has a conveying mechanism 10 that conveys an LCD substrate between a cassette C and the process portion 3. The cassette station 2 loads and unloads a cassette C to and from the outside. The conveying mechanism 10 has a conveying arm 11 that can be moved on a conveying path 12 disposed in the direction of which the cassettes are placed. The conveying arm 11 conveys a substrate G between a cassette C and the process portion 3.

The process portion 3 has a main conveying portion 3a, an upstream portion 3b, and a downstream portion 3c. The main conveying portion 3a extends in a vertical direction (X direction) of the direction (Y direction) of which the cassettes C are placed on the cassette station 2. The upstream portion 3b has various process units including a resist coating process unit (CT) disposed along the main conveying portion 3a. The downstream portion 3c has various process units including a developing process unit (DEV) 18.

In addition, the main conveying portion 3a has a conveying path 31 that extends in the X direction and a conveying shuttle 23 that conveys a substrate G in the X direction along the conveying path 31. The conveying shuttle 23 conveys a substrate G while holding it with for example a holding pin. A vertically conveying unit 7 that transfers a substrate G between the process portion 3 and the interface portion 4 is disposed in the main conveying portion 3a adjacent to the interface portion 4.

A scrub-cleaning process unit (SCR) 20 that performs a cleaning process for a substrate G is disposed at an end portion of the upstream portion 3b adjacent to the cassette station 2. An excimer UV process unit (e-UV) 19 that removes organic matter from a substrate G is disposed upstream of the scrub-cleaning process unit (SCR) 20.

Thermal process blocks 24 and 25 are disposed adjacent to the scrub-cleaning process unit (SCR) 20. The thermal process blocks 24 and 25 each have many thermal process units that are piled up. A vertically conveying unit 5 is disposed between the thermal process blocks 24 and 25. A conveying arm 5a can be moved in the Z direction and horizontal direction and can be rotated in a θ direction. Thus, the conveying arm 5a is capable of accessing each thermal process unit of the thermal process blocks 24 and 25 and conveying a substrate G. The vertically conveying unit 7 of the process portion 3 has the same structure as the vertically conveying unit 5.

As shown in FIG. 2, the thermal process block 24 has two baking units (BAKE) that perform a heating process for a substrate G on which a resist is to be coated and an adhesion unit (AD) that performs a hydrophobic process for a substrate G with HMDS (Hexamethyldisalizane) gas. These units are piled up in the order. On the other hand, the thermal process block 25 has two cooling units (COL) that perform a cooling process for a substrate G and an adhesion unit (AD). These units are piled up in the order.

A resist process block 15 is disposed in the X direction adjacent to the thermal process block 25. The resist process block 15 has a resist coating process unit (CT) that coats a resist on a substrate G, a reduced pressure drying process unit (VD) that dries a resist coated on a substrate G under reduced pressure, and an edge remover (ER) that removes a resist from the periphery of a substrate G. The resist process block 15 has a sub arm (not shown) that is traveled from the resist coating process unit (CT) to the edge remover (ER). The sub arm conveys a substrate G in the resist process block 15.

A multi-staged thermal process block 26 is disposed adjacent to the resist process block 15. The thermal process block 26 has three pre-baking units (PREBAKE) that are piled up. The pre-baking units (PREBEKE) each perform a heating process for a substrate G on which a resist has been coated.

As shown in FIG. 3, a thermal process block 29 is disposed at an end of the downstream portion 3c adjacent to the interface portion 4. The thermal process block 29 has a cooling unit (COL) and two post-exposure baking units (PEBAKE) that perform a heating process after an exposing process is performed and before a developing process is performed. These units are piled up in the order.

A developing process unit (DEV) 18 that performs a developing process is disposed in the X direction adjacent to the thermal process block 29. Thermal process blocks 28 and 27 are disposed adjacent to the developing process unit (DEV) 18. A vertically conveying unit 6 is disposed between the thermal process blocks 28 and 27. The vertically conveying unit 6 has the same structure as the vertically conveying unit 5. The vertically conveying unit 6 is capable of accessing each thermal process unit of the thermal process blocks 28 and 27. An i-line process unit (i-UV) 33 is disposed at an end portion of the developing process unit (DEV) 18.

The thermal process block 28 has a cooling unit (COL) and two post-baking units (POBAKE) that each perform a heating process for a substrate G that has been developed. These units are piled up in the order. Likewise, the thermal process block 27 has a cooling unit (COL) and two post-baking units (POBAKE) that are piled up in the order.

The interface portion 4 has a titler and peripheral exposing unit (Titler/EE) 22 on the front side of the drawing. An extension cooling unit (EXTCOL) 35 is disposed adjacent to the vertically conveying unit 7. A buffer cassette 34 is disposed on the rear side of the drawing. A vertically conveying unit 8 that transfers a substrate G with the exposing unit 32 is disposed among the titler and peripheral exposing unit (Titler/EE) 22, the extension cooling unit (EXTCOL) 35, and the exposing unit 32. The vertically conveying unit 8 has the same structure as the vertically conveying unit 5.

In the process of the coating and developing process system 1, a substrate G that is removed from a cassette C is conveyed to the upstream portion 3b of the process portion 3. The excimer UV process unit (e-UV) 19 of the upstream portion 3b performs a surface reforming process and an organic matter removing process for the substrate G. Thereafter, the scrub-cleaning process unit (SCR) 20 performs a cleaning process and a drying process for the substrate G while almost horizontally conveying the substrate G. Thereafter, the conveying arm 5a of the vertically conveying unit removes the substrate G from the lowest stage of the thermal process block 24. A baking unit (BAKE) of the thermal process block 24 performs a heating process for the substrate G. The adhesion unit (AD) performs a process for spraying HMDS gas on the substrate G so as to improve adhesion of the glass substrate G to a resist film. Thereafter, a cooling unit (COL) of the thermal process block 25 performs a cooling process for the substrate G.

Thereafter, the substrate G is conveyed from the conveying arm 5a to the conveying shuttle 23. Thereafter, the substrate G is conveyed to the resist coating process unit (CT). After the resist coating process unit (CT) has performed a coating process for the substrate G with a resist, the reduced pressure drying process unit (VD) performs a reduced pressure drying process for the substrate G. The edge remover (ER) 48 performs a process for removing the resist from the periphery of the substrate G.

Thereafter, the substrate G is transferred from the conveying shuttle 23 to the conveying arm of the vertically conveying unit 7. A pre-baking unit (PREBAKE) of the thermal process block 26 performs a heating process for the substrate G. Thereafter, a cooling unit (COL) of the thermal process block 29 performs a cooling process for the substrate G. A moisture supplying unit 39 is disposed at the lowest stage of the thermal process block 26. Thereafter, the extension cooling unit (EXTCOL) 35 performs a cooling process for the substrate G. Thereafter, the exposing unit performs an exposing process for the substrate G.

Thereafter, the substrate G is conveyed to a pre-baking unit (PREBAKE) of the thermal process block 29 through the vertically conveying unit 8 and the vertically conveying unit 7. After the pre-baking unit (PREBAKE) has performed a heating process for the substrate G, the cooling unit (COL) performs a cooling process for the substrate G. Thereafter, the substrate G is conveyed to the developing process unit (DEV) 18 through the conveying arm of the vertically conveying unit 7. The developing process unit (DEV) 18 performs a developing process, a rise process, and a drying process for the substrate G while almost horizontally conveying the substrate G.

Thereafter, a conveying arm 6a of the vertically conveying unit 6 transfers the substrate G from the lowest stage of the thermal process block 28 to a post-baking unit (POBAKE) of the thermal process block 28 or 27. The post-baking unit (POBAKE) performs a heating process for the substrate G. A cooling unit (COL) performs a cooling process for the substrate G. Thereafter, the substrate G is transferred to the conveying mechanism 10 and then placed in a cassette C.

Figure 4:
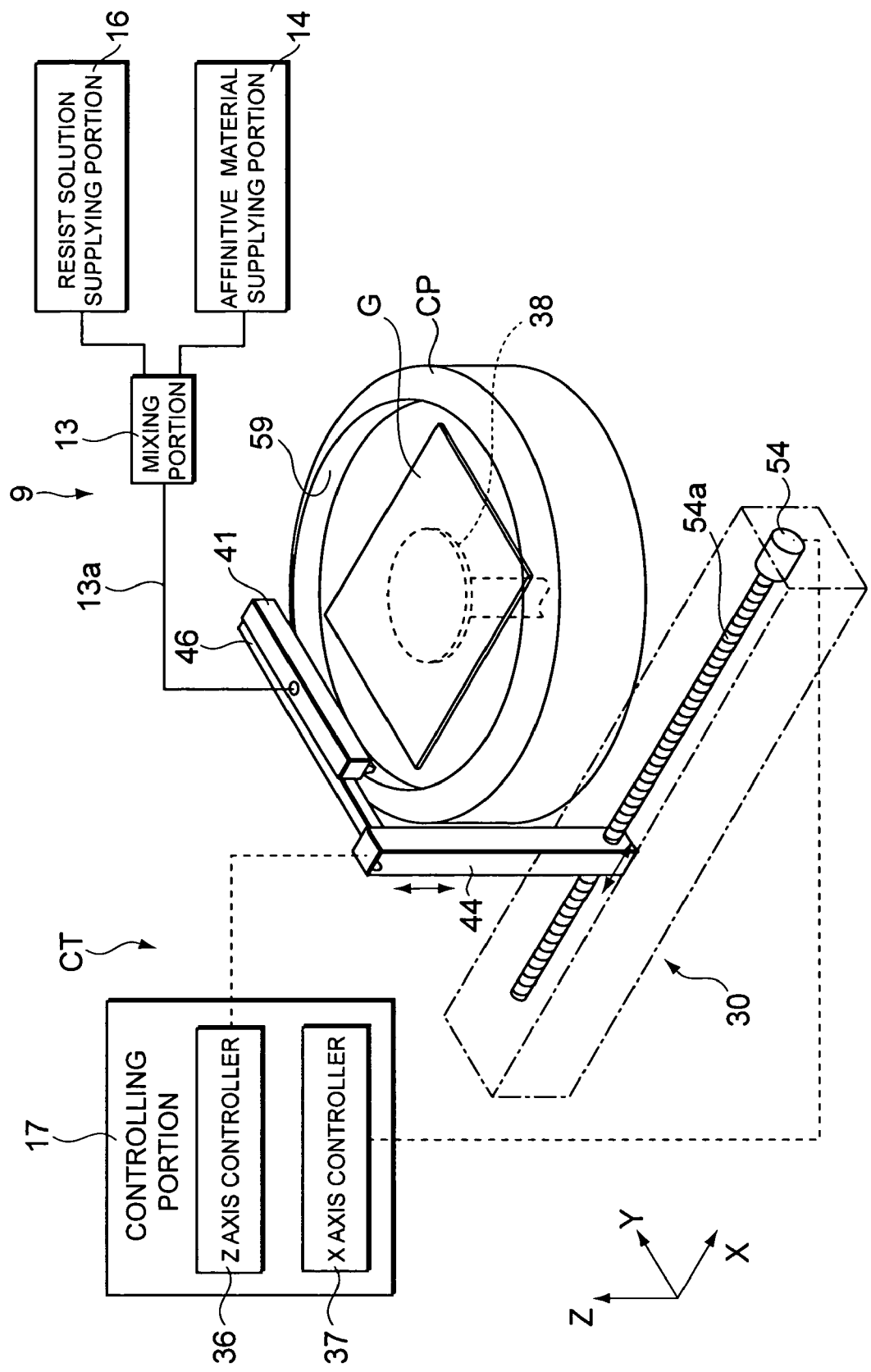
FIG. 4 is a perspective view showing a resist coating process unit according to an embodiment of the present invention.

Next, with reference to FIG. 4, the resist coating process unit (CT) will be described.

A cup CP that holds a substrate G is disposed at an almost center portion of the resist coating process unit (CT). A chuck member 38 is disposed in the cup CP. The chuck member 38 vacuum-sucks a substrate G. The chuck member 38 can be raised and lowered to and from the cup CP by a driving mechanism such as an air cylinder (not shown). Thus, the chuck member 38 is capable of receiving a substrate conveyed from the outside and transferring a substrate that has been processed by the unit CT to the outside.

A cover member (not shown) is disposed at an opening portion 59 of the cup. The cover member can be raised and lowered by an air cylinder or the like.

A driving unit 30 is disposed adjacent to the cup CP. The driving unit 30 is capable of moving a resist nozzle 41 in a horizontal direction (an X direction of the drawing).

A ball screw 54a is mounted on the driving unit 30. The ball screw 54a is rotated by a motor 54. A lower portion of a support member 44 is threaded to the ball screw 54a. The support member 44 supports a nozzle holding member 46 that holds the resist nozzle 41. The support member 44 can be moved in the X direction by the motor 54. A driving mechanism such as an air cylinder (not shown) is built in the support member 44. The driving mechanism moves the nozzle holding member 46 in the vertical direction (Z direction) so that the resist nozzle 41 can be raised and lowered. An X axis controller 37 and a Z axis controller 36 independently control moving amounts of the X axis and the Z axis, respectively.

The resist coating process unit (CT) has a mixed resist supplying portion 9. The mixed resist supplying portion 9 has a mixing portion 13, a supplying pipe 13a, an affinitive material supplying portion 14, a resist solution supplying portion 16, and a resist nozzle 41.

The resist solution supplying portion 16 supplies a resist solution. The affinitive material supplying portion 14 supplies a material affinitive with a developing solution used for the developing process unit (DEV) 18. The resist material is for example a novolak type resin. The material affinitive with the developing solution is for example a material that causes the contact angle to the developing solution to decrease.

The mixing portion 13 mixes the resist supplied from the resist solution supplying portion 16 with the affinitive material supplied from the affinitive material supplying portion 14. As will be described later, the mixing ratio of the resist solution and the affinitive material affects the thickness of a mixed resist layer R1 that contains the affinitive material. The mixed resist RR is supplied from the mixing portion 13 to the resist nozzle 41 through the supplying pipe 13a.

A real unit of the mixing portion 13 may be a static mixer (not shown). The resist solution supplying portion 16 has for example a tank (not shown) that stores a resist solution and a bellows pump that supplies the resist solution from the tank to the mixing portion 13. Like the resist solution supplying portion 16, the affinitive material supplying portion 14 has a vessel (not shown) such as a tank that stores the affinitive material and a bellows pump (not shown) that supplies the affinitive material to the mixing portion 13.

Next, with reference to FIG. 5, FIG. 6A to FIG. 6C, and FIG. 7A to FIG. 7D, a process for nonuniformly distributing the affinitive material in a resist film formed on a substrate will be described.

Figure 5:
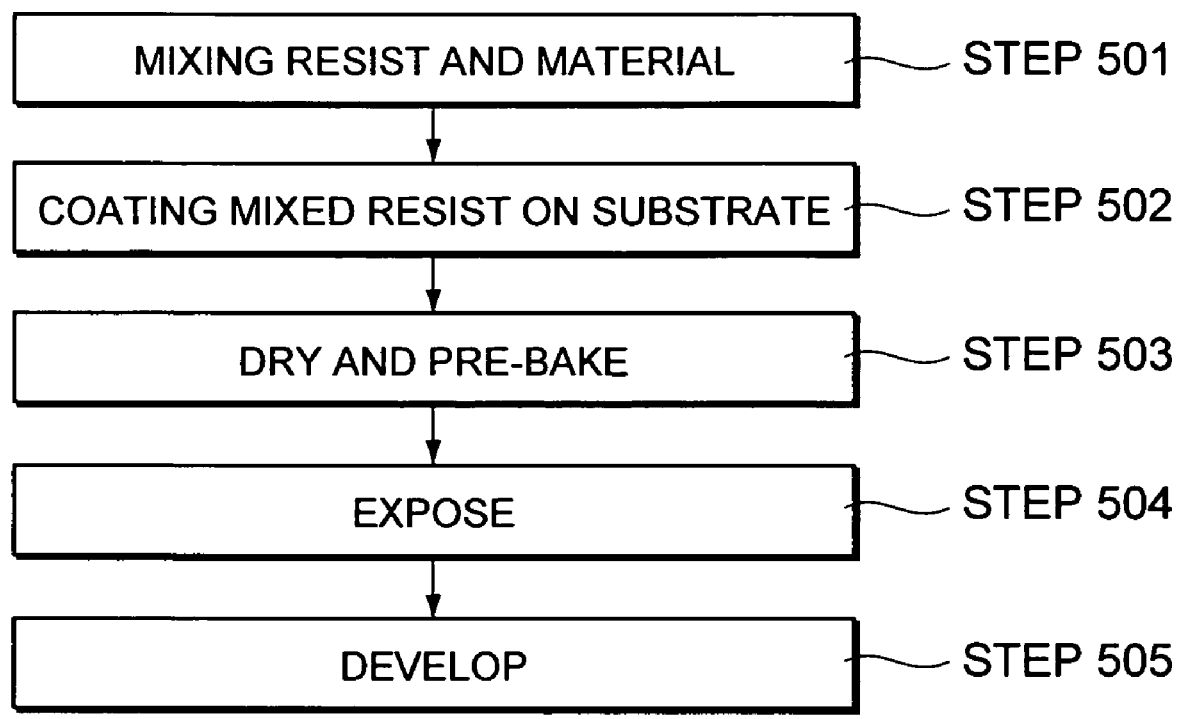
FIG. 5 is a flow chart showing steps according to an embodiment of the present invention.

FIG. 5 is a flow chart showing steps according to the present invention. FIG. 6A to FIG. 6C and FIG. 7A to FIG. 7D are sectional views showing the steps.

Figure 6A:
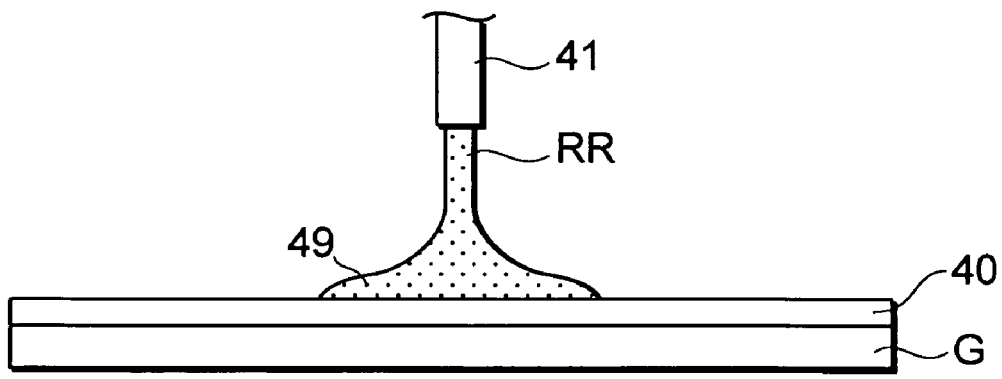
FIG. 6A to FIG. 6C are sectional views showing steps for forming a resist film on a substrate according to the first embodiment.
Figure 6B:
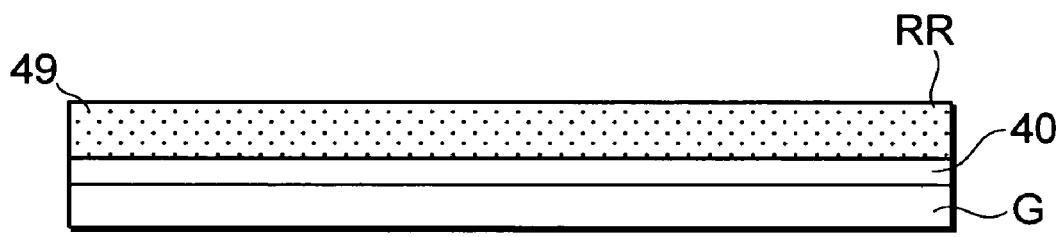
Figure 6C:
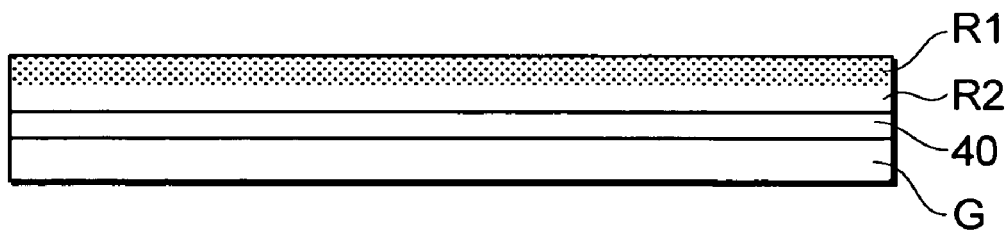

As described above, the resist solution and the affinitive material are mixed by the mixing portion 13 (at step 501). As shown in FIGS. 6A and 6B, the mixed resist RR mixed by the mixing portion 13 is coated on a base film and a metal film 40 formed on the substrate G through the resist nozzle 41 (at step 502). The reduced pressure drying process unit (VD) dries the mixed resist RR coated on the substrate under reduced pressure. A pre-baking unit of the thermal process block 26 performs a heating process for the mixed resist RR (at step 503). At the drying and heating steps, as shown in FIG. 6C, an affinitive material 49 is nonuniformly distributed on the front side of the mixed resist RR and thereby a mixed resist layer R1 is formed. It is known that when the mixed resist RR is heated at an increased evaporation speed, a photoactive acid generator (PAG) contained in the resist is nonuniformly distributed on the front surface of the mixed resist RR.

Figure 7A:
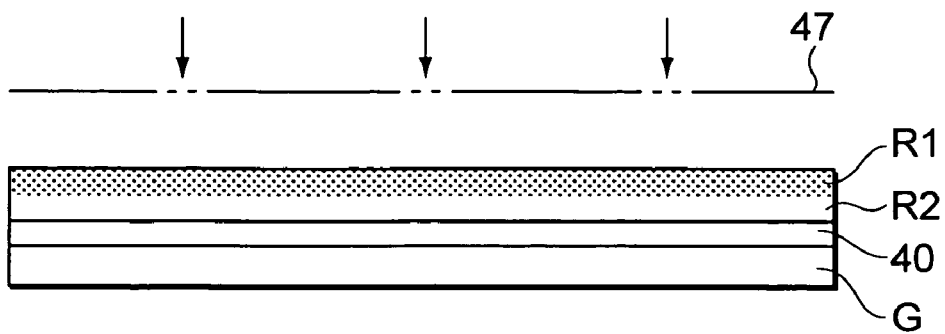
FIG. 7A to FIG. 7D are sectional views showing steps for exposing and developing the resist formed on the substrate according to the first embodiment.
Figure 7B:
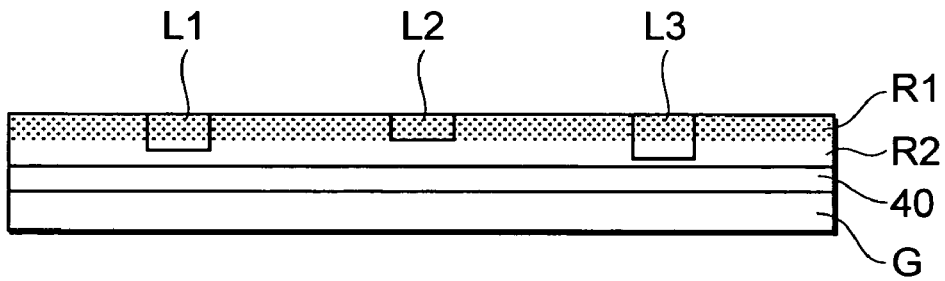

Next, as shown in FIG. 7A, a contrast layer 45 on which the mixed resist layer R1 and a resist layer R2 that does not contain the affinitive material 49 are formed is exposed with a half-tone mask 47 (at step 504). As shown in FIG. 7B, due to scattering of exposure light, exposed regions L1, L2, and L3 vary. In this example, for convenience, it is assumed that portions to exposure light is irradiated to the resist through a half-tone mask.

Figure 7C:
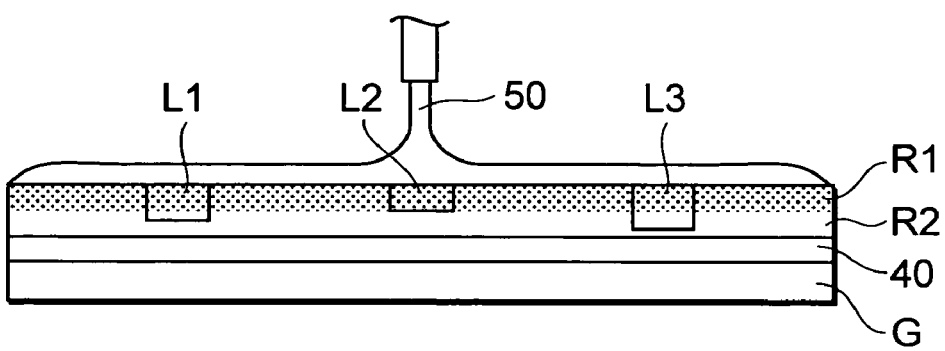
Figure 7D:
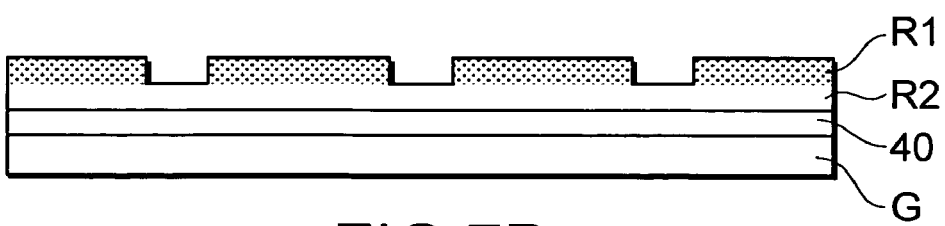

In this state, as shown in FIG. 7C, a developing solution 50 is coated on the mixed resist layer R1 so as to dissolve the exposed regions L1, L2, and L3 and develop them therewith (at step 505).

Figure 8A:
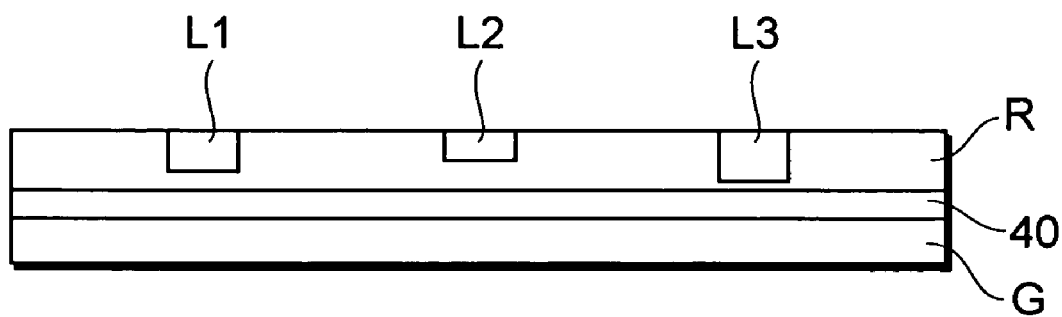
FIG. 8A to FIG. 8C are sectional views showing conventional steps for exposing and developing a substrate.
Figure 8B:
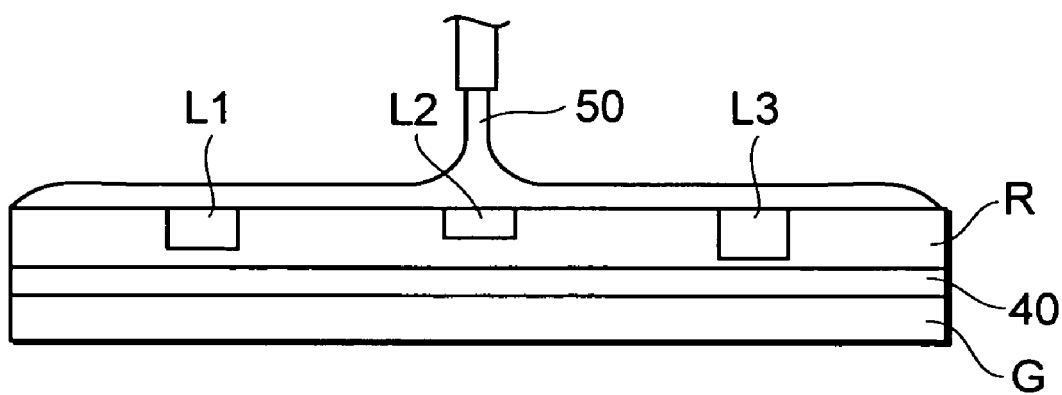
Figure 8C:
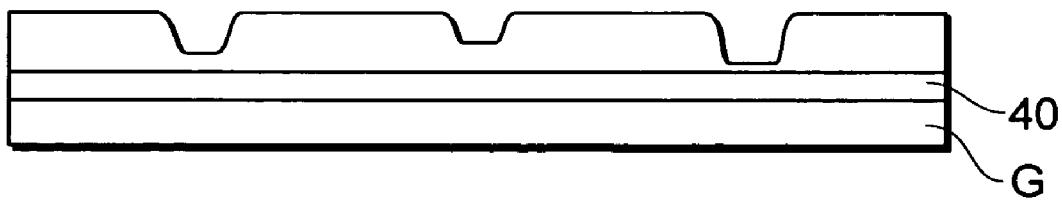

If the affinitive material 49 is not added to the resist R (namely, a regular resist is coated), resist patterns of different depths and widths may be left corresponding to the exposure depths of the regions L1, L2, and L3 after they are developed. For example, as shown in FIG. 8A, 8B, and 8C, when the developing solution is coated on the resist, the exposure depth of the region L1 is smaller than that of the region L2. Thus, the time for which the resist is exposed for the exposure depth becomes short. In addition, the time for which the non-exposure portion is exposed and corroded with the developing solution becomes short. Thus, when the region L2 is developed, a pattern that is narrower and shallower than the region L1 is formed. On the other hand, unlike with the case that the region L2 is developed, since the exposure depth of the region L3 is larger than that of the region L1, the time for which the non-exposed portion is corroded becomes long. As a result, a pattern that is wider and deeper than the region L1 is formed.

In contrast, according to the present embodiment, since the affinitive material has an affinity to the developing solution 50, it tends to reside in the mixed resist layer R1. As a result, the development of the mixed resist layer R1 is promoted. In contrast, the development of the resist layer R2 is demoted in comparison with the mixed resist layer R1. Thus, even if the exposure depths vary as with the regions L1, L2, and L3, only the mixed resist layer R1 is developed. When the depth of the mixed resist layer R1 is constant, the residual resist film that has been half-exposed becomes uniform (for example, the aspect ratio, the pitch, and so forth of the resist pattern that has been developed become constant). Thus, after the resist is etched, the distances of electrodes that are formed become uniform.

Since the depth of the mixed resist layer R1 is equal to the depth of the portion that is half-exposed and removed, the depth of the mixed resist layer R1 can be controlled by varying the additive ratio of the affinitive material to the resist solution.

Second Embodiment

Next, with reference to FIG. 9, FIG. 10A to FIG. 10F, FIG. 11A to FIG. 11D, and FIG. 12A to FIG. 12C, an embodiment that controls the amount of moisture contained in a resist formed on a substrate so as to control the distribution of a characteristic of the reaction of the resist against exposure light will be described as a second embodiment of the present invention. According to the present embodiment, for example a g-line resist is used.

Figure 9:
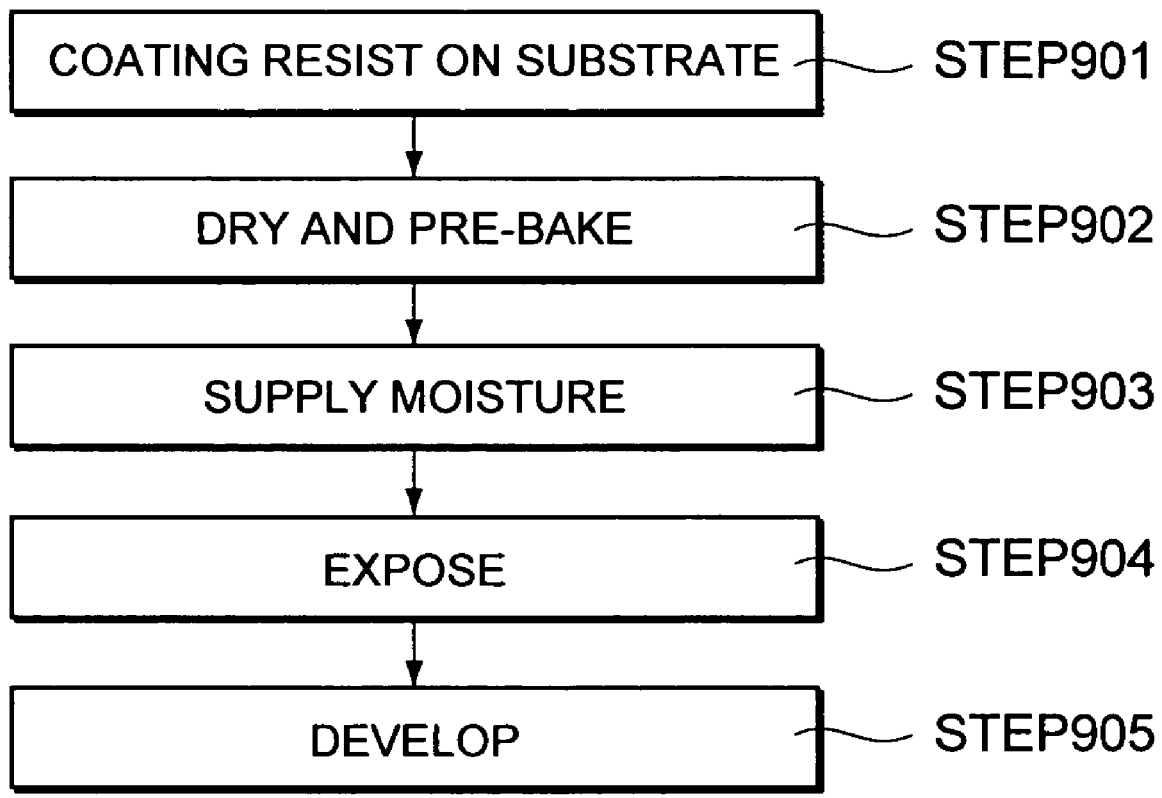
FIG. 9 is a flow chart showing steps according to a second embodiment of the present invention.
Figure 10A:
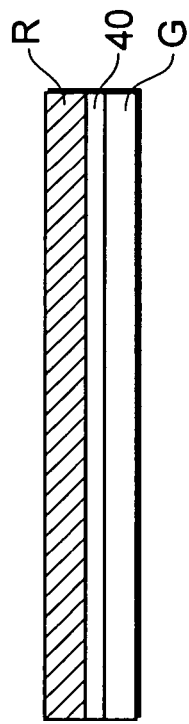
FIGS. 10A to 10F are sectional views showing steps for forming a resist film on a substrate according to the second embodiment of the present invention.
Figure 10B:
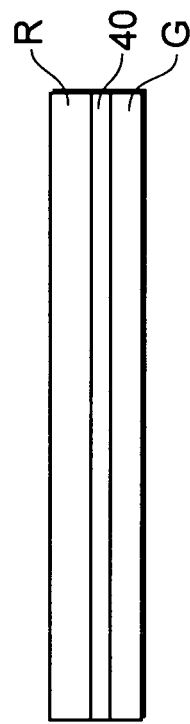
Figure 10C:
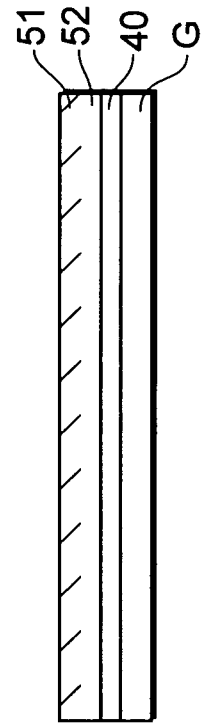
Figure 10D:
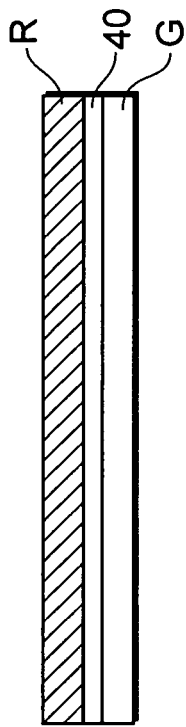
Figure 10E:
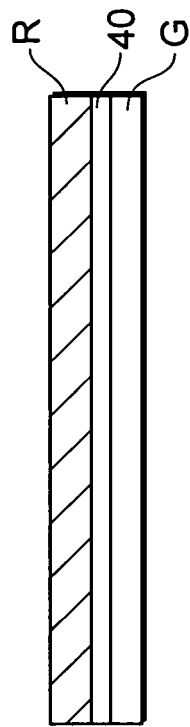
Figure 10F:
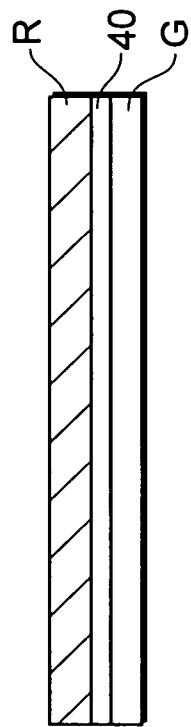

FIG. 9 is a flow chart showing steps according to the present invention. FIG. 10A to FIG. 10F and FIG. 11A to FIG. 11D are sectional views showing the steps according to the present invention and the related art. FIG. 10A, FIG. 10B, and FIG. 10C are sectional views showing steps according to the present invention. FIG. 10D, FIG. 10E, and FIG. 10F are sectional views showing steps according to the related art. In the following description, the steps according to the present invention and the steps according to the related art will be comparatively described.

As shown in FIG. 10A or FIG. 10D, a resist R is coated on a substrate through the resist nozzle 41 (at step 901). The resist R coated on the substrate is dried under reduced pressure by the reduced pressure drying process unit (VD). A pre-baking unit of the thermal process block 26 performs a heating process for the resist R (at step 902). When exposure light is irradiated to a positive-type resist, the irradiated portion of the resist is dissolvable against the developing solution 50. At that point, a chemical reaction as expressed in the accompanying drawing takes place. To do that, a predetermined amount of moisture ($H_2O$) is required.

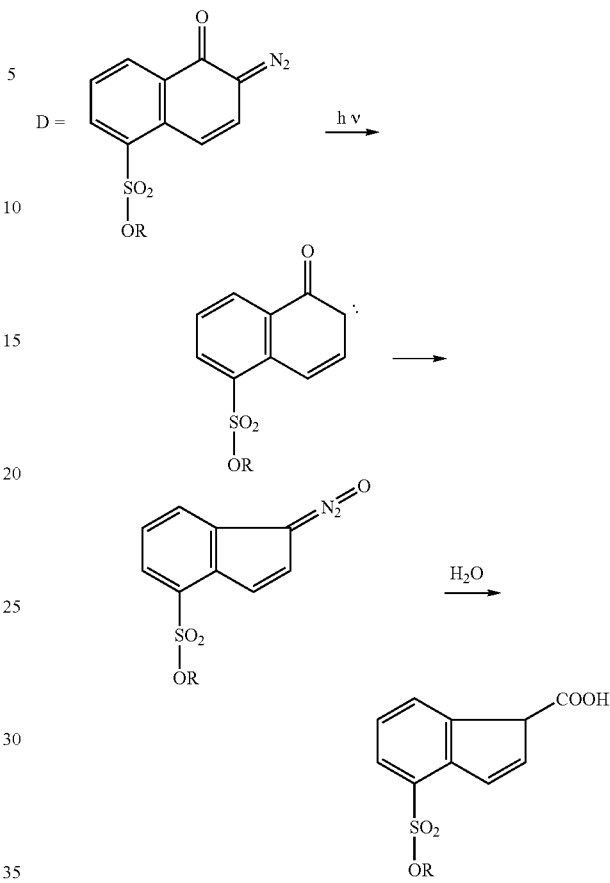

In the related art, as shown in FIG. 10E, a resist R is dried and heated in such a manner that it contains moisture necessary for exposing it. In contrast, according to the present invention, as shown in FIG. 10B, the resist R is excessively dried in such a manner that it does not contain moisture necessary for exposing it. In this state, as shown in FIG. 10C, moisture necessary for exposing the resist R is supplied to the front surface thereof. As a result, a moisture containing layer 51 that sufficiently contains moisture and a dry layer 52 that does not sufficiently contain moisture are formed (at step 903). To supply the moisture, for example the foregoing moisture supplying unit 39 is used. According to the present embodiment, the moisture supplying unit 39 is disposed at the lowest stage of the thermal process block 26. However, as long as the moisture supplying unit 39 supplies moisture to the resist R before it is exposed, the moisture supplying unit 39 may be disposed at another position for example the interface portion 4.

Figure 11A:
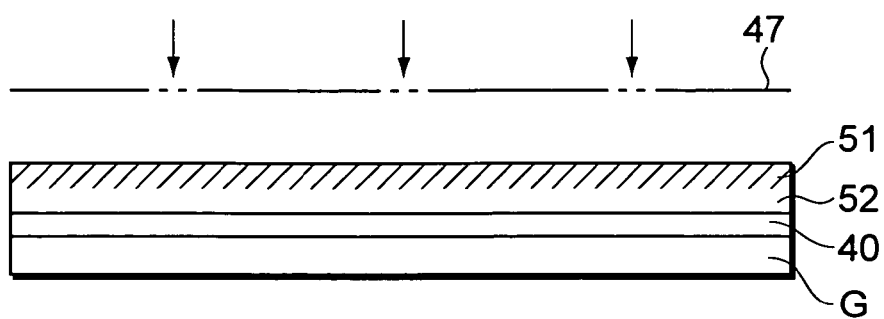
FIG. 11A to FIG. 11D are sectional views showing steps for exposing and developing a resist formed on a substrate according to the second embodiment.
Figure 11B:
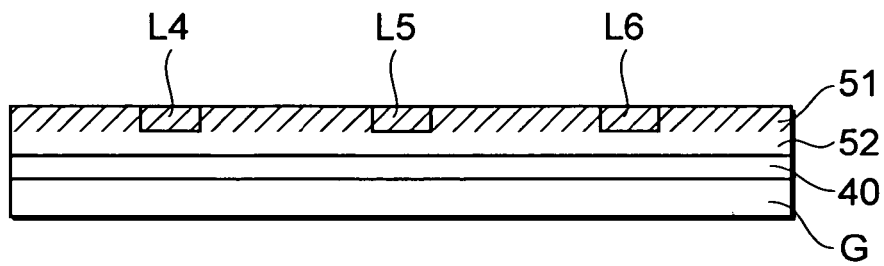

Thereafter, as shown in FIG. 11A, the resist on which the contrast layer has been formed is exposed with the half-tone mask 47 (at step 904). As shown in FIG. 11B, when the resist is exposed, the chemical reaction is promoted in only the moisture containing layer 51 such as the regions L4, L5, and L6. The exposure depths of the regions L4, L5, and L6 are the same. In contrast, when the resist is exposed, the chemical reaction is demoted in the dry layer 52. For convenience, it is assumed that exposure light is irradiated to the resist through the half-tone mask.

Figure 11C:
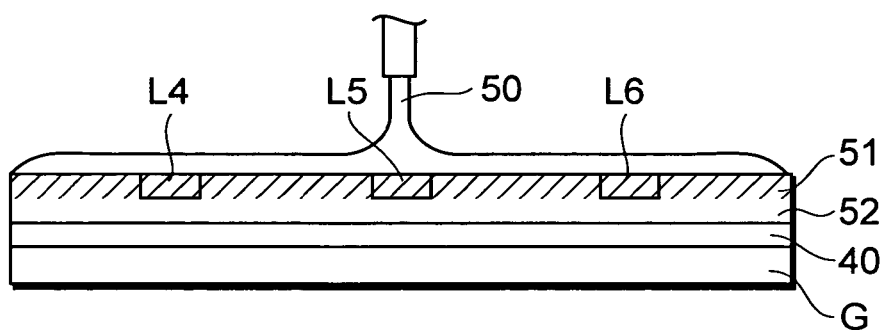
Figure 11D:
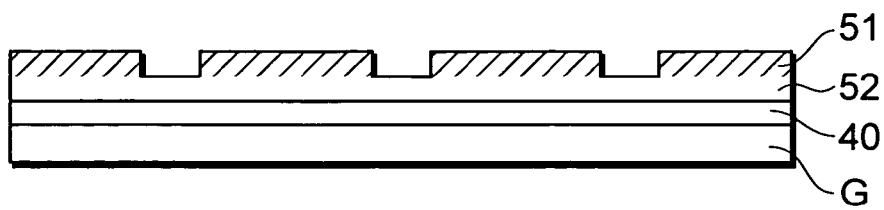

In this state, as shown in FIG. 11C, the developing solution 50 is coated on the moisture containing layer 51. The exposed regions L4, L5, and L6 are dissolved and developed (at step 905). Since the depths of the exposed regions L4, L5, and L6 are the same, when they are developed, as shown in FIG. 1D, the residual film of the half-exposed regions becomes uniform. As a result, the distances of electrodes that will be formed later become uniform.

The depth of the moisture containing layer 51 is equal to the depth of a portion that is developed and removed. The depth of the portion can be controlled by varying the amount of moisture supplied to the resist.

In contrast, according to the related art, after a regular resist is coated, a moisture contrast cannot be formed in the direction of the thickness of the resist. Thus, after the resist is developed, resist patterns whose depths and widths vary corresponding to the exposure depths of the regions L1, L2, and L3 may be left. For example, as shown in FIG. 8A to FIG. 8C, when a developing solution is coated on a resist, the width and depth of the region L2 are smaller than those of the region L1. On the other hand, the width and depth of the region L3 are larger than those of the region L1.

Third Embodiment

Next, with reference to FIG. 12A to FIG. 12C, FIG. 13A to FIG. 13D, FIG. 14A, FIG. 15A to FIG. 15B, and FIG. 16, an embodiment that forms an uneasily dissolvable layer on the front surface side of a resist will be described as a third embodiment of the present invention.

Figure 13A:
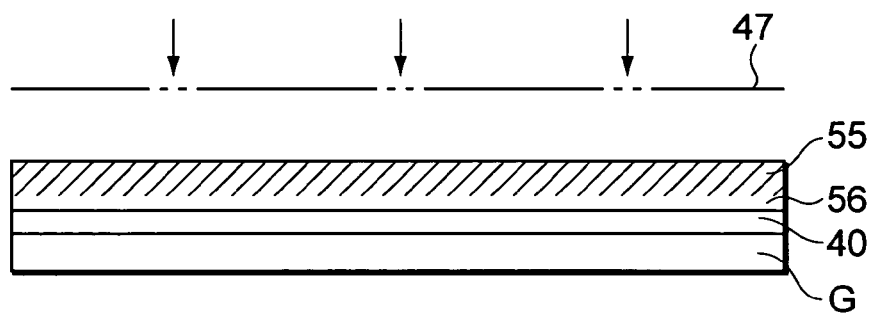
FIG. 13A to FIG. 13D are sectional views showing steps for exposing and developing the resist formed on the substrate according to the third embodiment of the present invention.
Figure 13B:
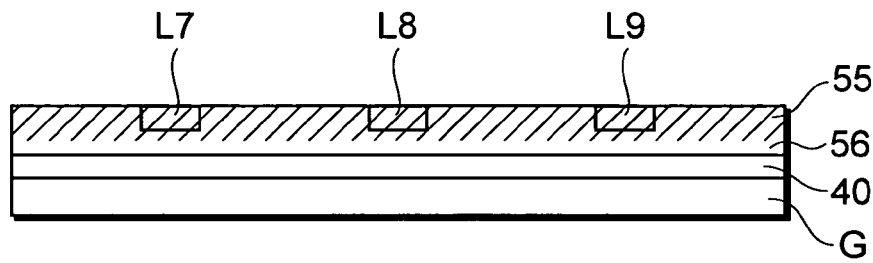
Figure 13C:
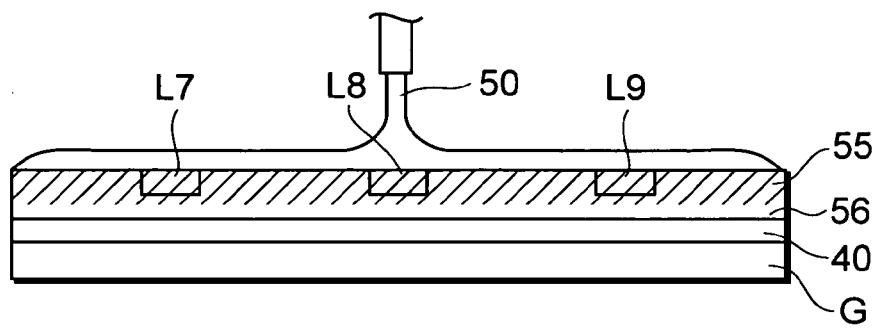
Figure 13D:
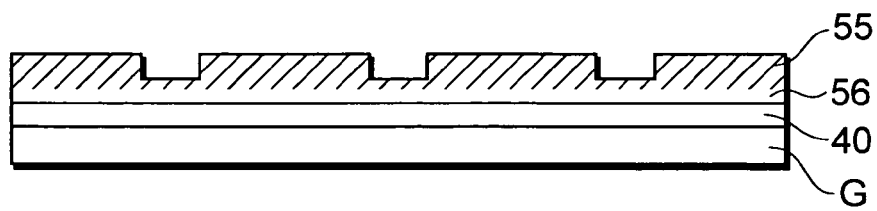
Figure 14:
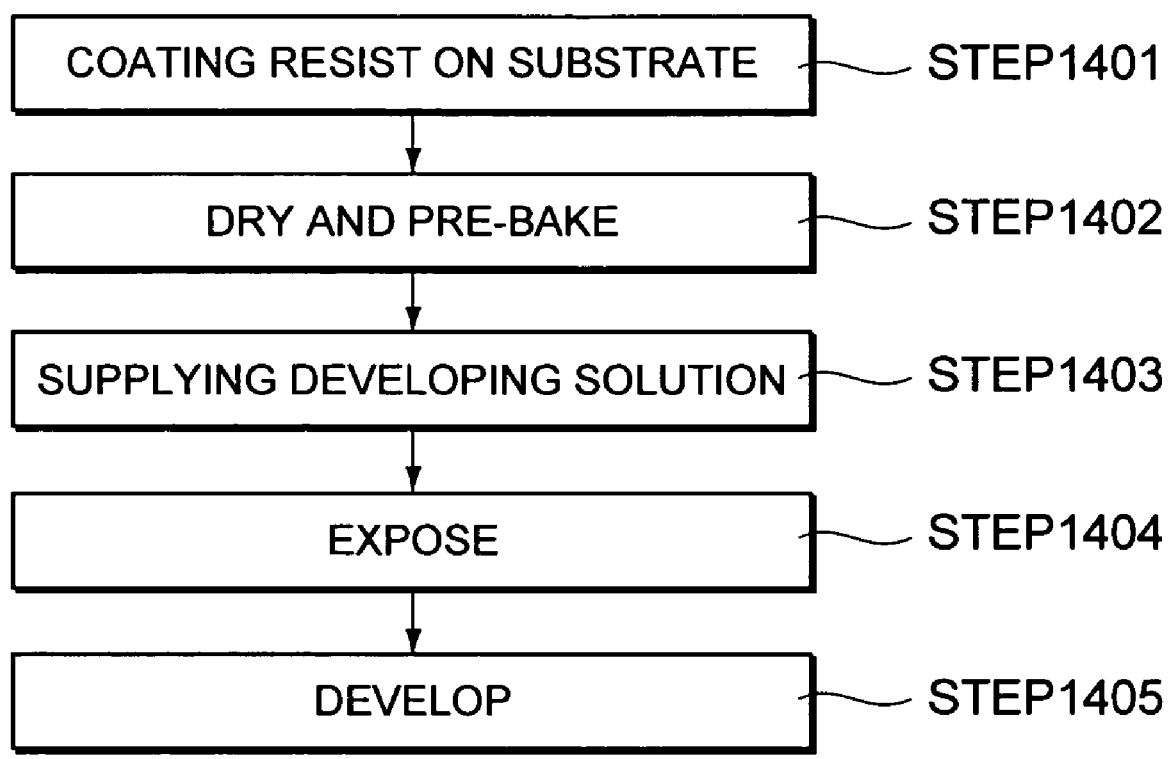
FIG. 14 is a flow chart showing the steps according to the third embodiment of the present invention.
Figure 15A:
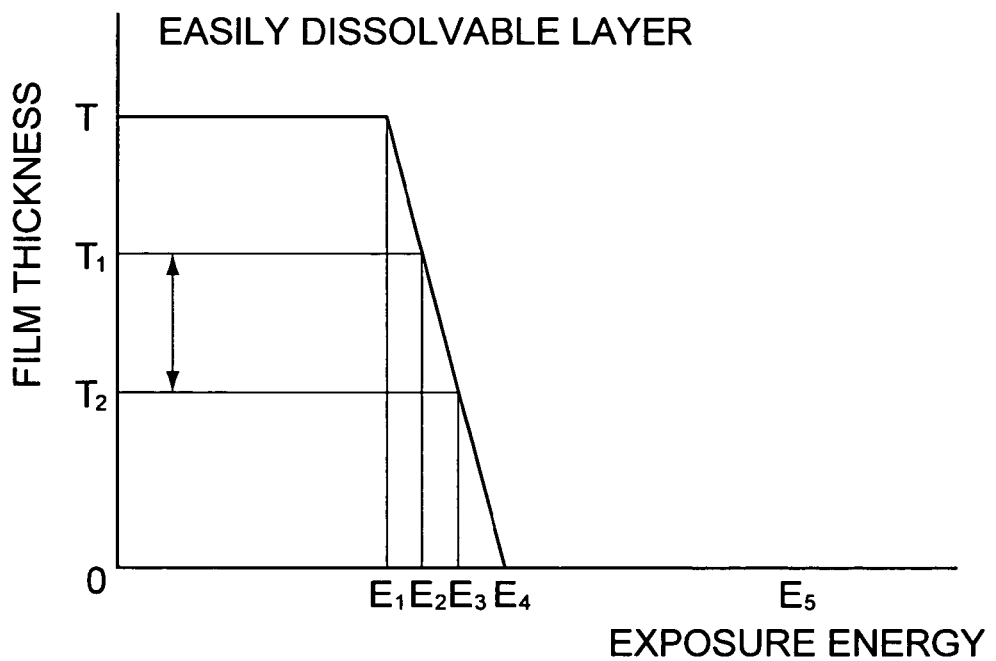
FIG. 15A is a graph showing a characteristic of an easily dissolvable layer.
Figure 15B:
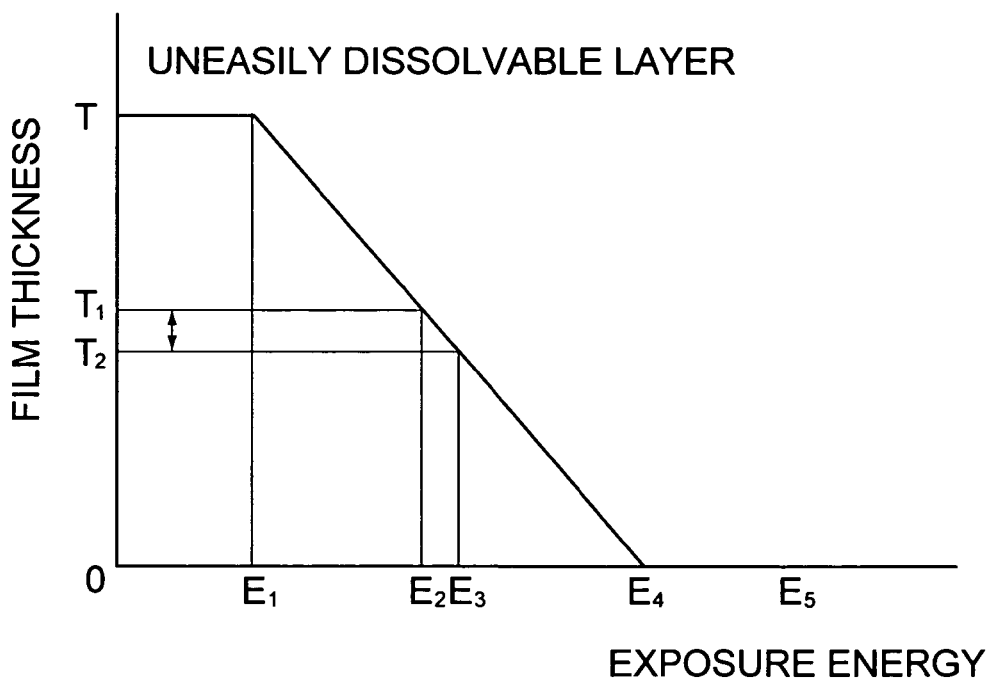
FIG. 15B is a graph showing a characteristic of an uneasily dissolvable layer.
Figure 16:
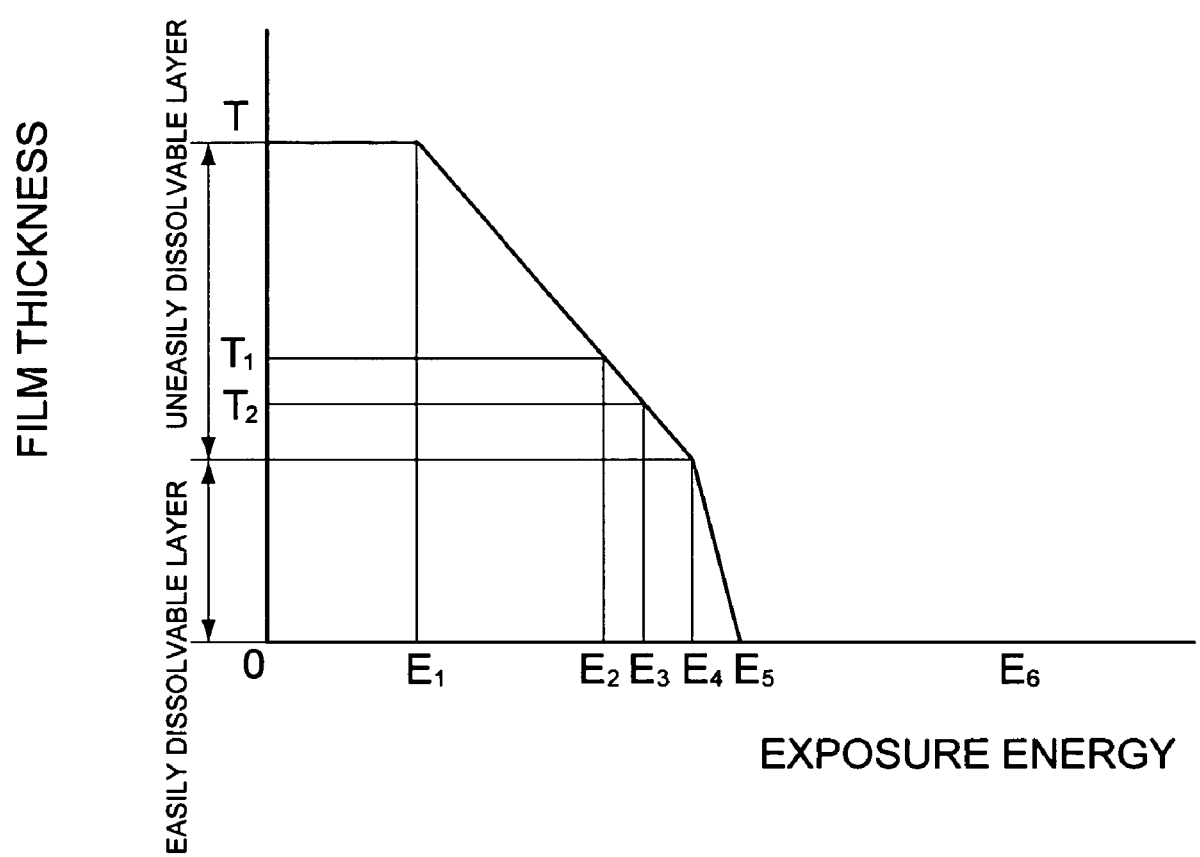
FIG. 16 is a graph showing a characteristic of a contrast of an easily dissolvable layer and an uneasily dissolvable layer.

FIG. 14 is a flow chart showing steps according to the present embodiment. FIG. 12A to FIG. 12C and FIG. 13A to FIG. 13D are sectional views showing the steps of the present embodiment. FIG. 15A, FIG. 15B, and FIG. 16 are graphs showing the relation of exposure energy and film thickness of a resist that has been developed.

Figure 12A:
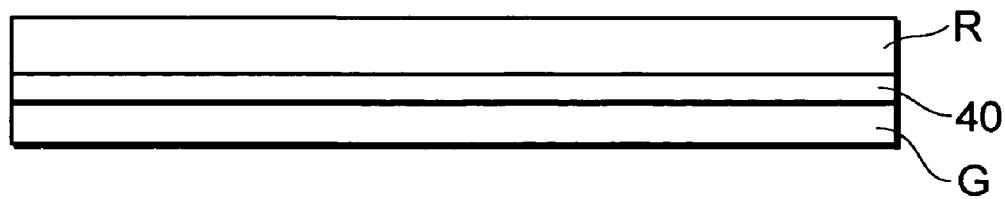
FIG. 12A to FIG. 12C are sectional views showing steps for forming a resist on a substrate according to a third embodiment of the present invention.

As shown in FIG. 12A, a resist R is coated on a substrate (at step 1401). The resist R coated on the substrate is dried by the reduced pressure drying process unit (VD) under reduced pressure. A pre-baking unit of the thermal process block 26 performs a heating process for the resist R (at step 1402).

Figure 12B:
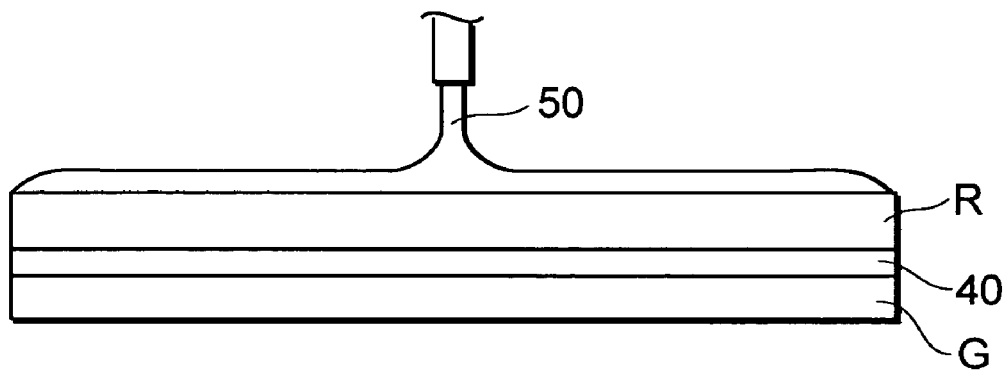
Figure 12C:
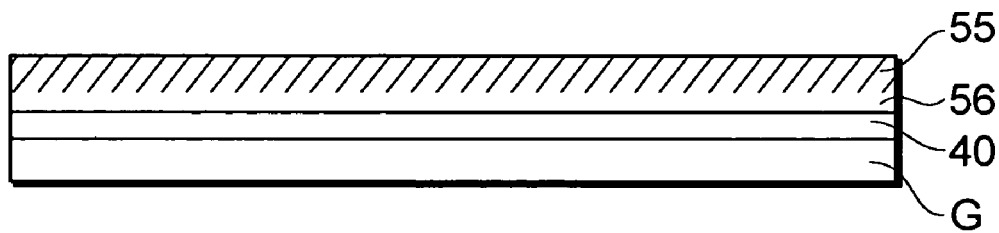

Thereafter, as shown in FIG. 12B, the developing solution 50 used for a developing process is supplied to the resist R. As a result, as shown in FIG. 12C, the front surface side of the resist becomes an uneasily dissolvable state. As a result, an uneasily dissolvable layer 55 is formed on the front surface side of the resist R. An easily dissolvable layer 56 that is a regular resist layer is formed as a lower layer of the uneasily dissolvable layer 55 (at step 1403). Experimental results show that the uneasily dissolvable layer 55 is formed.

Next, as shown in FIG. 13A, a contrast layer composed of the uneasily dissolvable layer 55 and the easily dissolvable layer 56 is exposed with the half-tone mask 47 (at step 1404). As shown in FIG. 13B, although exposure light and irradiation time slightly deviate, exposed regions L7, L8, and L9 reside in the uneasily dissolvable layer and their depths are the same. As will be described later, since the uneasily dissolvable layer 55 gradually reacts with the exposure light, the exposure depths can be easily controlled. In this example, for convenience, it is assumed that the resist is irradiated with exposure light through the half-tone mask.

In this state, as shown in FIG. 13C, the developing solution 50 is supplied to the contrast layer. The exposed regions L7, L8, and L9 are dissolved and developed (at step 1405). In this case, since the depths of the regions L7, L8, and L9 are the same, when they are developed, as shown in FIG. 13D, the residual film of the half-exposed region becomes uniform. Thus, the distances of electrodes that will be formed later become uniform.

Next, with reference to FIG. 15A, FIG. 15B, and 16, the case that an uneasily dissolvable layer is formed will be described.

FIG. 15A is a graph showing the case that the easily dissolvable layer 56 is exposed. In the graph, the vertical axis of the graph represents the thickness of a residual film of the resist R that has been developed, whereas the horizontal axis represents energy of light irradiated in a predetermined time period. When exposure light that is smaller than energy $E_1$ is irradiated to the resist R, it does not react therewith. As a result, the thickness of the residual film that has been developed does not vary. When exposure light whose energy ranges from $E_1$ to $E_4$ is irradiated to the resist R, with a slight increase of the energy, the thickness of the residual film that has been developed sharply decreases. When the energy of exposure light irradiated to the resist R exceeds $E_4$, since all the resist reacts therewith, the thickness of the residual film that has been developed becomes zero.

When the easily dissolvable layer 56 is exposed, exposure light is irradiated so that its energy becomes for example $E_5$ ($E_4$ or higher). When the easily dissolvable layer 56 is half-exposed, since light having energy $E_5$ passes through the half-tone mask 47, light having energy from $E_2$ to $E_3$ is irradiated to the resist layers 55 and 56. The energy ranges from $E_2$ to $E_3$ because the half-tone mask 47 has an error. The thickness of the residual film to which light having energy $E_2$ is irradiated is $T_1$. The thickness of the residual film to which light having energy $E_3$ is irradiated is $T_2$. When the resist layer 56 is exposed, with a small width of energy, the film thickness of the resist that has been developed largely varies in the range from $T_1$ to $T_2$.

FIG. 15B is a graph showing the case that the uneasily dissolvable layer 55 is exposed. The vertical axis of the graph represents the thickness of a residual film of a resist that has been developed, whereas the horizontal axis represents energy of light irradiated in a predetermined time period. Like the case of the easily dissolvable layer 56, even if exposure light is irradiated so that energy becomes $E_1$ or smaller, the uneasily dissolvable layer 55 does not react therewith. In addition, the thickness of the residual film that has been developed does not vary. When the energy of exposure light to be irradiated exceeds $E_4$, all the easily dissolvable layer 56 reacts therewith. As a result, the thickness of the residual film of the resist that has been developed becomes zero.

When the case that the uneasily dissolvable layer 55 is exposed is compared with the case that the easily dissolvable layer 56 is exposed, the former has a characteristic of which the thickness of the film that has been developed gradually varies in the range from El to $E_4$ due to an increase of energy.

When the exposure light is irradiated to the uneasily dissolvable layer 55 in such a manner that the energy becomes $E_5$, like the case of the easily dissolvable layer 56, the exposure light passes through the half-tone mask 47. As a result, the light having energy in the range from $E_2$ to $E_3$ is irradiated. When the exposure light having energy $E_2$ is irradiated, the thickness of the residual film is $T_1$. When exposure light having energy $E_3$ is irradiated, the thickness of the residual film is $T_2$. In this case, although the thickness of the film that has been developed deviates in the range from $T_1$ to $T_2$, when the case that the uneasily dissolvable layer 55 is exposed is compared with the case that the easily dissolvable layer 56 is exposed, the deviation of the thickness of the film of the former is smaller than that of the latter. Thus, according to the present invention, with the uneasily dissolvable layer 55, the depth of the resist to be exposed can be easily controlled. As a result, the uniformity of the residual film of the portion that has been half-exposed can be improved. Thus, the distances of electrodes that will be formed later become uniform.

FIG. 16 is a graph showing the relation of the thickness of a film that has been developed and exposure energy in the case that an uneasily dissolvable layer and an easily dissolvable layer are contrastively formed. In other words, the graph of FIG. 16 is a combination of the graphs of FIG. 15A and FIG. 15B.

FIG. 15B describes the case that all the film is made of the uneasily dissolvable layer 55. However, to reform all the resist R to the uneasily dissolvable layer 55, a sufficient amount of developing solution 50 is required. However, actually, it is necessary that the thickness of a resist that has been half-exposed and developed should be contained in the uneasily dissolvable layer 55. In other words, it is not necessary that all the resist should be the uneasily dissolvable layer 55. Thus, as shown in FIG. 12C, a contrast layer of the uneasily dissolvable layer 55 and the easily dissolvable layer 56 is formed. In this case, as shown in FIG. 16, the relation of exposure energy and the thickness of a residual film that has been developed is represented by the graph of FIG. 16, which is a combination of the graphs of FIG. 15A and 15B. In other words, the region of the uneasily dissolvable layer 55 represents the characteristic shown in FIG. 15B, whereas the region of the easily dissolvable layer 56 represents the characteristic shown in FIG. 15A.

The contrast is formed in such a manner that the thickness of the resist film that has been developed (namely, the region from $T_1$ to $T_2$ shown in FIG. 16) is contained in the uneasily dissolvable layer 55. The uneasily dissolvable layer 55 is formed so as to easily control the exposure depth of the resist. When the thickness of the resist film that has been developed is contained in the uneasily dissolvable layer 55, the object of the present invention can be accomplished. When the contrast of the uneasily dissolvable layer 55 and the easily dissolvable layer 56 are formed, the developing solution can be effectively used. In addition, when the exposure depth is controlled, the thickness of the residual film becomes uniform. As a result, the distances of electrodes become uniform.

The present invention is not limited to the foregoing embodiments. In other words, various modifications are available. According to the first embodiment, the affinitive material and the resist solution are mixed by the mixing portion 13. Alternatively, a resist solution that contains affirmative material may be used.

As described above, according to the present invention, the uniformity of the residual film of a resist that has been half-exposed can be improved and the distances of electrodes that will be formed later become uniform.

Figure 17:
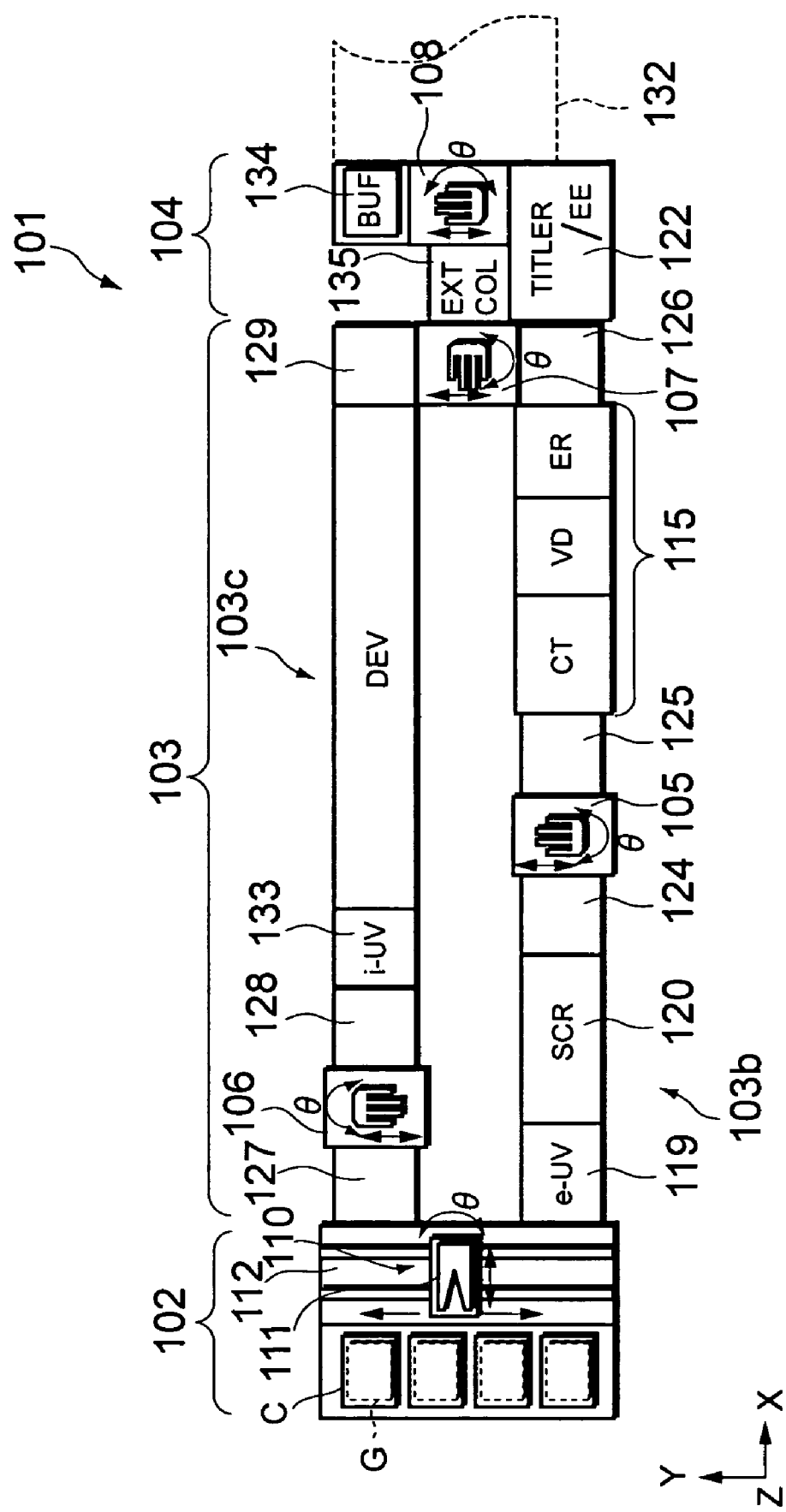
FIG. 17 is a plan view showing the overall structure of a coating and developing process apparatus according to an embodiment of the present invention.
Figure 18:
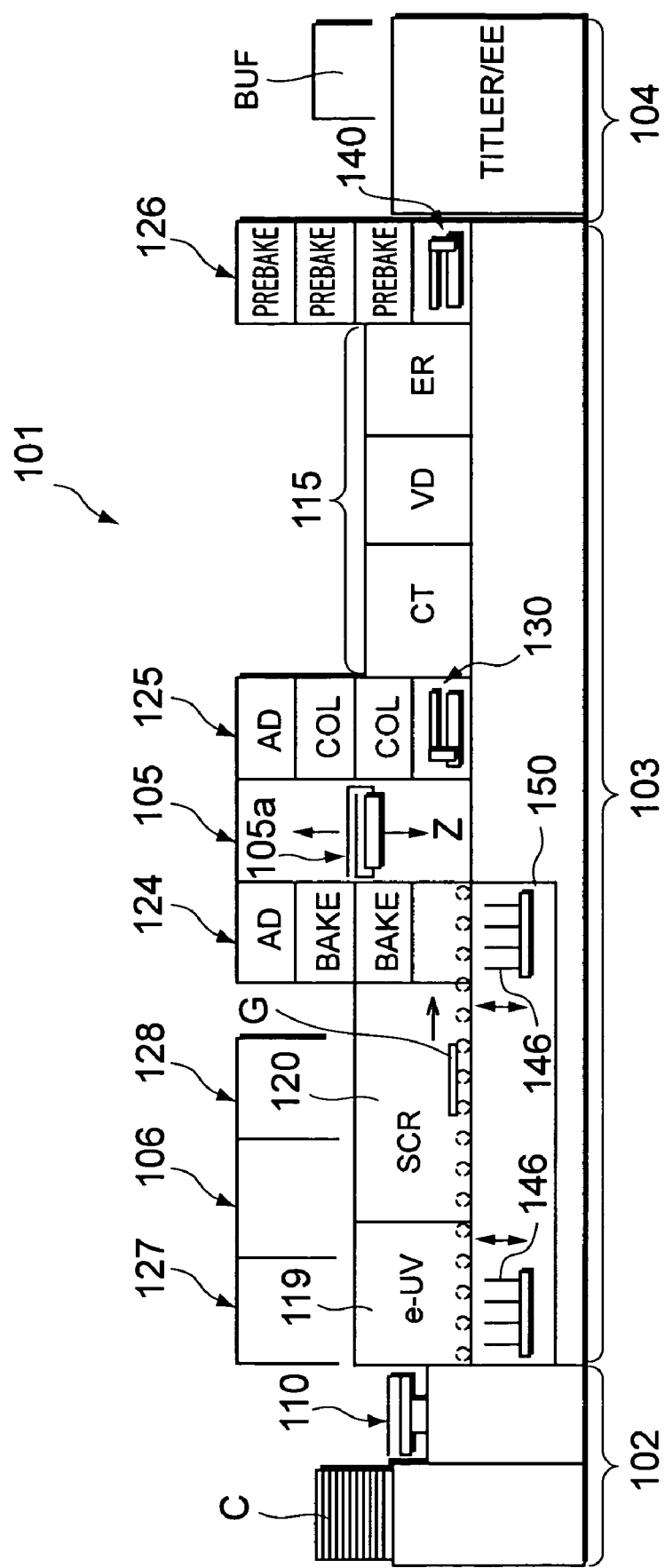
FIG. 18 is a front view showing the coating and developing process apparatus shown in FIG. 17.
Figure 19:
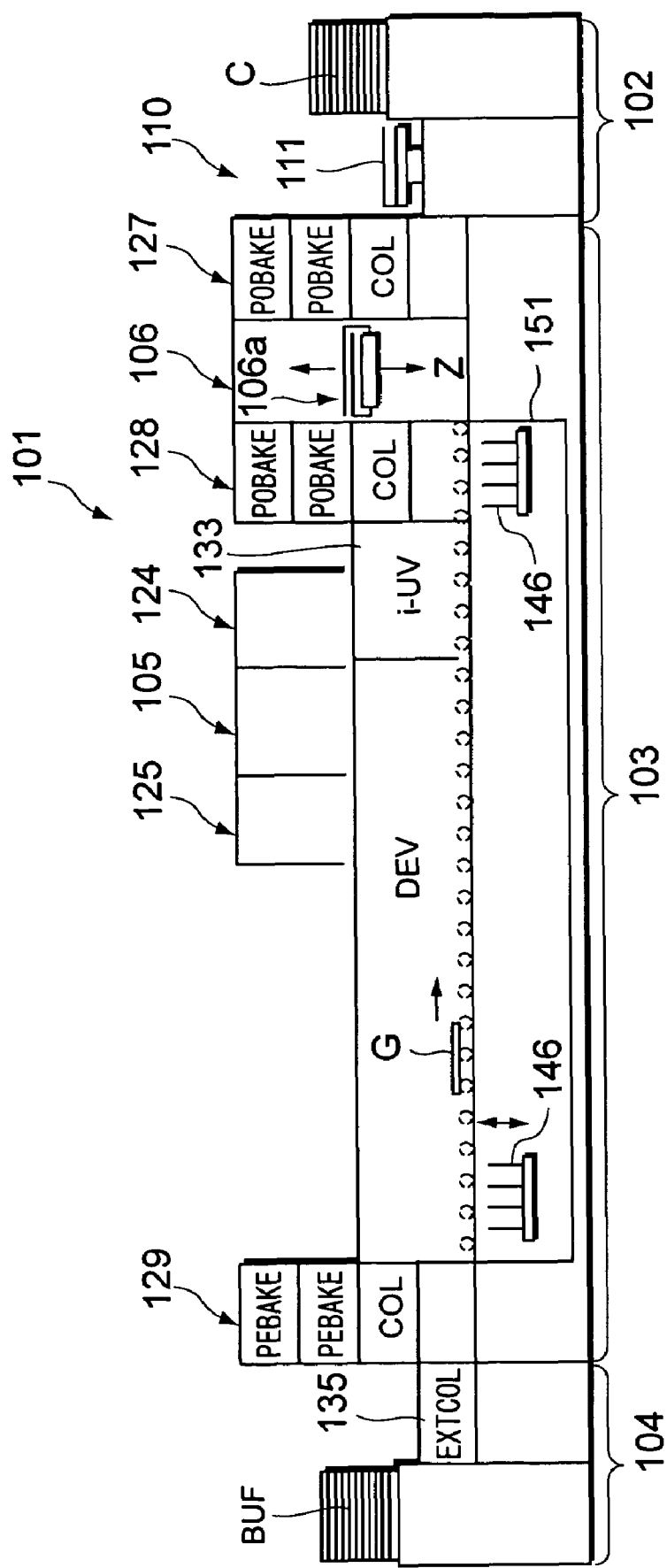
FIG. 19 is a rear view showing the coating and developing process apparatus shown in FIG. 17.

FIG. 17 is a plan view showing a coating and developing process apparatus for an LCD substrate according to the present invention. FIG. 18 is a front view showing the apparatus. FIG. 19 is a rear view showing the apparatus.

The coating and developing process apparatus is designated by reference numeral 101. The coating and developing process apparatus 101 has a cassette station 102, a process portion 103, and an interface portion 104. On the cassette station 102, cassettes C are placed. Each of the cassettes C accommodates a plurality of glass substrate G. The process portion 103 has a plurality of process units that perform a sequence of processes including a resist coating process and a resist developing process for a substrate G. The interface portion 104 transfers a substrate G with an exposing unit 132. The cassette station 102 and the interface portion 104 are disposed at both ends of the process portion 103.

The cassette station 102 has a conveying mechanism 110 that conveys an LCD substrate between a cassette C and the process portion 103. The cassette station 102 loads and unloads a cassette C to and from the outside. The conveying mechanism 110 has a conveying arm 111 that is capable of moving on a conveying path 112 disposed along the direction of which cassettes are arranged. The conveying arm 111 conveys a substrate G between a cassette C and the process portion 103.

The process portion 103 has an upstream portion 103b and a downstream portion 103c. The upstream portion 103b has various process units including a coating process unit (CT) that are arranged in an X direction of the drawing (FIG. 17). The downstream portion 103c has various process units including a developing process unit (DEV) that are arranged in the X direction.

The upstream portion 103b has an excimer UV process unit (e-UV) 119 and a scrub-cleaning process unit (SCR) 120 adjacent to the cassette station 2. The excimer UV process unit (e-UV) 119 removes organic matter from a substrate G. The scrub-cleaning process unit (SCR) 120 performs a cleaning process for the substrate G with a scrubbing brush.

Thermal process blocks 124 and 125 are disposed adjacent to the scrub-cleaning process unit (SCR) 120. The thermal process block 124 and the thermal process block 125 each have many units that perform a thermal process for a glass substrate G. These units are piled up. A vertically conveying unit 105 is disposed between the thermal process blocks 124 and 125. A conveying arm 105a can be moved in a Z direction and a horizontal direction and rotated in a θ direction of the drawing of FIG. 17. Thus, the conveying arm 105a is capable of accessing each unit of the thermal process blocks 124 and 125 and conveying a substrate G to another unit thereof. A vertically conveying unit 107 has the same structure as the vertically conveying unit 105.

As shown in FIG. 18, the thermal process block 124 has two baking units (BAKE) and an adhesion unit (AD) that are piled up in the order. The baking units (BAKE) each perform a heating process for a substrate G before a resist is coated thereon. The adhesion unit (AD) performs a hydrophobic process for a substrate G with HMDS gas. The thermal process block 125 has two cooling units (COL), a conveying unit 130 and an adhesion unit (AD) that are piled up in the order. The cooling units (COL) each perform a cooling process for a substrate G.

A resist process block 115 is disposed adjacent to the thermal process block 125. The resist process block 115 extends in the X direction. The resist process block 115 has a resist coating process unit (CT), a reduced pressure drying process unit (VD), and an edge remover (ER). The resist coating process unit (CT) coats a resist on a substrate G. The reduced pressure drying process unit (VD) dries the coated resist under reduced pressure. The edge remover (ER) removes from the periphery of the substrate G the resist according to the present invention. In addition, the resist process block 115 has a sub arm (not shown) that is moved from the resist coating process unit (CT) to the edge remover (ER). The sub arm conveys a substrate G in the resist process block 115.

A thermal process block 126 is disposed adjacent to the resist process block 115. The thermal process block 126 has various thermal process units that are piled up in the order. The thermal process block 126 has three pre-baking units (PREBAKE) that each perform a heating process for a substrate G after a resist has been coated on the substrate G. A conveying unit 140 is disposed below the pre-baking units (PREBAKE).

As shown in FIG. 19, the downstream portion 103c has a thermal process block 129 adjacent to the interface portion 104. The thermal process block 129 has a cooling unit (COL) and two post-exposure baking units (PEBAKE) that are piled up in the order. The post-exposure baking units (PEBAKE) perform a heating process for a substrate G after an exposing process is performed before a developing process is performed.

A developing process unit (DEV) is disposed adjacent to the thermal process block 129. The developing process unit (DEV) extends in the X direction. The developing process unit (DEV) performs a developing process for a substrate G. Thermal process blocks 128 and 127 are disposed adjacent to the developing process unit (DEV). A vertically conveying unit 106 is disposed between the thermal process blocks 128 and 127. The vertically conveying unit 106 has the same structure as the vertically conveying unit 105. The vertically conveying unit 106 is capable of accessing each thermal process unit of the thermal process blocks 128 and 127. An i-line process unit (i-UV) 133 is disposed adjacent to the developing process unit (DEV).

The thermal process block 128 has a cooling unit (COL) and two post-baking units (POBAKE) that are piled up in the order. The post-baking units (POBAKE) each perform a heating process for a substrate G after a developing process has been performed for the substrate G. Likewise, the thermal process block 127 has a cooling unit (COL) and two post-baking units (POBAKE) that are piled up in the order.

The interface portion 104 has a titler and peripheral exposing unit (Titler/EE) 122 on the front side of the drawing. An extension cooling unit (EXTCOL) 135 is disposed adjacent to the vertically conveying unit 107. A buffer cassette 134 is disposed on the rear side of the drawing. A vertically conveying unit 108 is disposed among the titler and peripheral exposing unit (Titler/EE) 122, the buffer cassette 134, and the exposing unit 132 that is adjacent to a buffer cassette 134. The vertically conveying unit 108 transfers a substrate G among the titler and peripheral exposing unit (Titler/EE) 122, the buffer cassette 134, and the exposing unit 132. The vertically conveying unit 108 has the same structure as the vertically conveying unit 105.

Next, process steps of the coating and developing process apparatus 101 will be described. A substrate G is removed from a cassette C and then conveyed to the upstream portion 103b of the process portion 103. The excimer UV process unit (e-UV) 119 of the upstream portion 103b performs a surface reforming process and an organic matter removing process for the substrate G. The scrub-cleaning process unit (SCR) performs a cleaning process and a drying process for the substrate G while almost horizontally conveying the substrate G. The conveying arm 105a of the vertically conveying unit removes a substrate G from the lowest stage of the thermal process block 124. A baking unit (BAKE) of the thermal process block 124 performs a heating process for the substrate G. The adhesion unit (AD) performs a process for spraying HMDS gas to the substrate G so as to improve adhesiveness of the substrate G to the resist film. Thereafter, the cooling unit (COL) of the thermal process block 125 performs a cooling process for the substrate G.

Thereafter, the substrate G is transferred from the conveying arm 105a to the conveying unit 130. The conveying unit 130 conveys the substrate G to the resist coating process unit (CT). The resist coating process unit (CT) performs a coating process for the substrate G. The reduced pressure drying process unit (VD) performs a reduced pressure drying process for the substrate G. The edge remover (ER) performs a process for removing the resist from the periphery of the substrate.

Thereafter, the substrate G is transferred to the conveying unit 140. The conveying unit 140 transfers the substrate G to the conveying arm of the vertically conveying unit 107. A pre-baking unit (PREBAKE) of the thermal process block 126 performs a heating process for the substrate G. The cooling unit (COL) of the thermal process block 129 performs a cooling process for the substrate G. Thereafter, the extension cooling unit (EXTCOL) 135 performs a cooling process for the substrate G. The exposing unit performs an exposing process for the substrate G.

Thereafter, the substrate G is conveyed to a post-exposure baking unit (PEBAKE) of the thermal process block 129 through the conveying arms of the vertically conveying unit 108 and the vertically conveying unit 107. After the post-exposure baking unit (PEBAKE) performs a heating process for the substrate G, the cooling unit (COL) performs a cooling process for the substrate G. The developing process unit (DEV) performs a developing process, a rinse process, and a drying process for the substrate G while almost horizontally conveying the substrate G through the conveying arm of the vertically conveying unit 107.

Thereafter, the substrate G is transferred from the lowest stage of the thermal process block 128 by a conveying arm 106a of the vertically conveying unit 106. A post-baking unit (POBAKE) of the thermal process block 128 or 127 performs a heating process for the substrate G. The cooling unit (COL) of the thermal process block 128 or 127 performs a cooling process for the substrate G. The substrate G is placed in a cassette C by the conveying mechanism 110.

Figure 20:
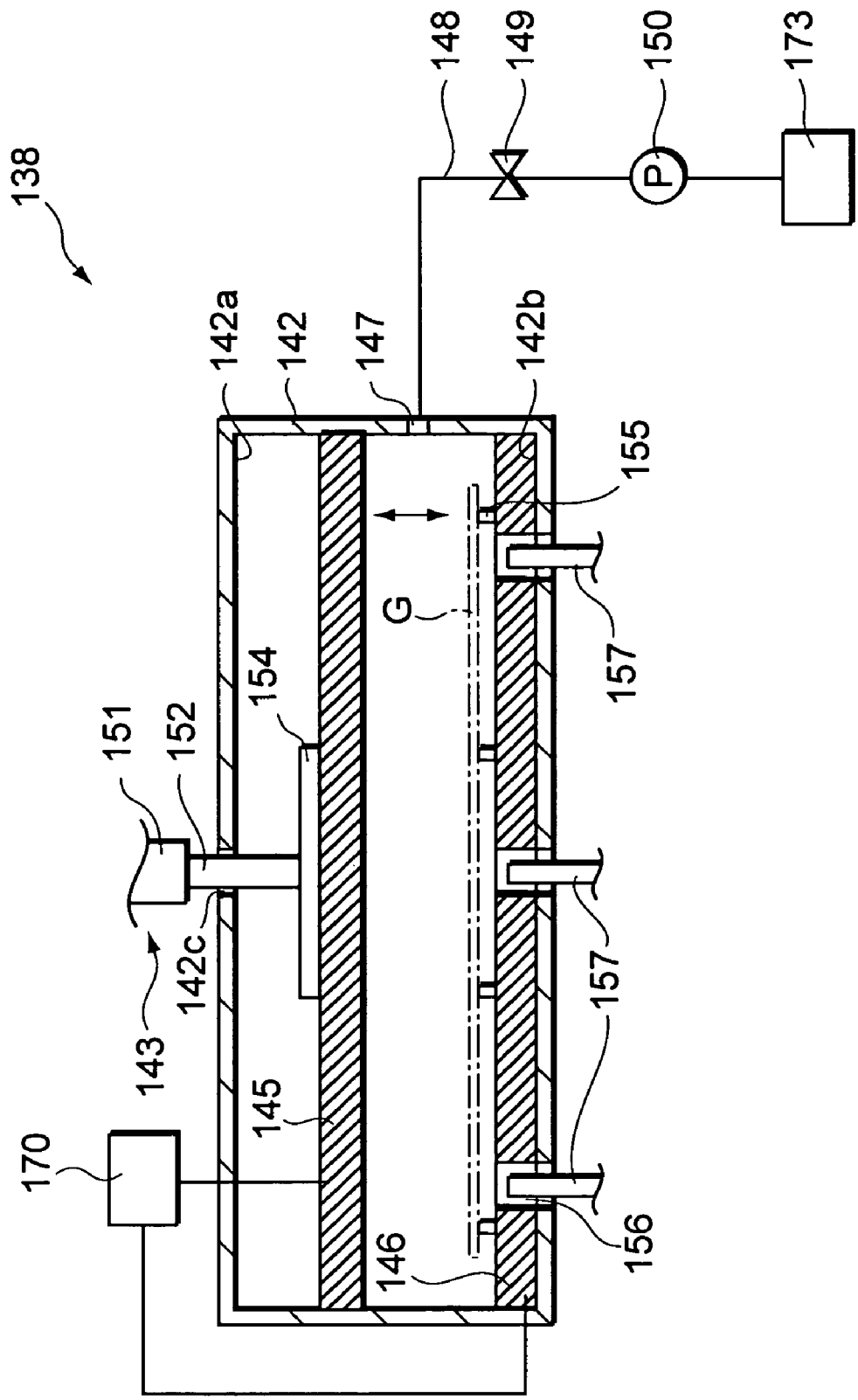
FIG. 20 is a sectional view showing a pre-baking unit.

Next, with reference to FIG. 20, a pre-baking unit disposed in the thermal process block of the substrate process apparatus according to the present invention will be described. FIG. 20 is a sectional view showing the internal structure of the pre-baking unit.

The pre-baking unit is designated by reference numeral 138. The pre-baking unit 138 heats a resist R coated on a substrate G. The pre-baking unit 138 has a processing chamber 142 and an upper driving mechanism 143. The processing chamber 142 performs a heating process for a substrate G. The processing chamber 142 has an upper plate 145, a lower plate 146, and an exhaust opening 147. The upper plate 145 heats a resist R from the front side of a substrate G. The lower plate 146 heats the resist R from the rear side of the substrate G. The exhaust opening 147 exhausts gas from the processing chamber 142.

The upper plate 145 can be raised and lowered in the processing chamber 142 by an upper air cylinder 151 that composes the upper driving mechanism 143. An upper piston 152 of the upper air cylinder 151 is mounted to a supporting member 154 through a through-hole 142c of a ceiling 142a of the processing chamber 142. By vertically moving the upper piston 152, the upper plate 145 can be raised and lowered.

The lower plate 146 is disposed on a floor 142b of the processing chamber 142. The lower plate 146 has proximity pins 155 and through-holes 156. The proximity pins 155 form a gap with the substrate G. Through the through-holes 156, supporting pins 157 support the substrate G placed on the proximity pins 155. The supporting pins 157 can be raised and lowered by for example an air cylinder or a stepping motor (not shown).

The upper plate 145 and the lower plate 146 are made of a metal for example aluminum. The upper plate 145 and the lower plate 146 each have a heating mechanism (not shown) such as a heating wire. A heating control portion 170 is disposed at each of the plate 145 and the plate 146. The heating temperatures and the heating times of the plates 145 and 146 are controlled by the heating control portion 170. The exhaust opening 147 is connected to a pump 150 through a pipe 148. The pump 150 has a pressure controlling portion 173 that controls an exhaust gas pressure when the substrate G is heated. The pressure in the processing chamber 142 is controlled by the pressure controlling portion 173 through the pump 150 controlling Next, with reference to FIG. 21A and FIG. 21B, control systems that control heating temperatures and heating times of the plates will be described.

Figure 21A:
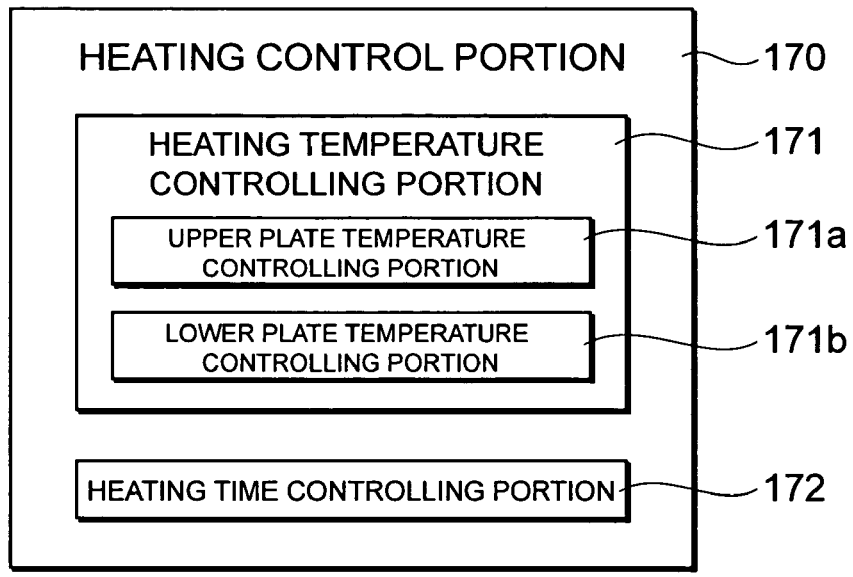
FIG. 21A and FIG. 21B are schematic diagrams showing control systems for a heating process.
Figure 21B:
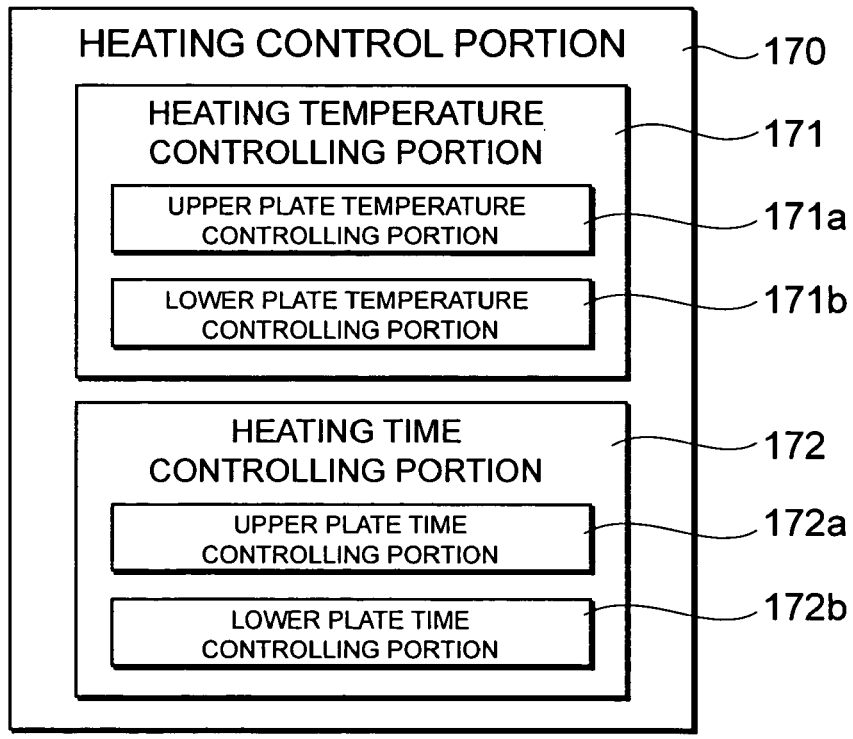

As shown in FIG. 21A, the heating control portion 170 has a heating temperature controlling portion 171 and a heating time controlling portion 172. The heating temperature controlling portion 171 is divided into an upper plate temperature controlling portion 171a and a lower plate temperature controlling portion 171b. The upper plate temperature controlling portion 171a controls the temperature of the upper plate 145. The lower plate temperature controlling portion 171b controls the temperature of the lower plate 146. The upper plate temperature controlling portion 171a and the lower plate temperature controlling portion 171b independently control the temperatures of the upper plate 145 and the lower plate 146. Thus, the resist can be heated at an optimum temperature according to the type thereof. The upper plate temperature controlling portion 171a and the lower plate temperature controlling portion 171b are connected to heating wires or the like of the plates 145 and 146, respectively. The upper plate temperature controlling portion 171a and the lower plate temperature controlling portion 171b control the intensity of currents that flow in the heating wires so as to control the temperatures of the plates 145 and 146. The heating time controlling portion 172 that controls the heating times of the upper plate 145 and the lower plate 146 is mounted on a heat generating mechanism such as a heating wire of each of the plates 145 and 146. When a predetermined time period has elapsed, the heating time controlling portion 172 stops the currents that flow in for example heating wires so as to control the heating times of the plates 145 and 146. Alternatively, as shown in FIG. 21B, the heating time controlling portion 172 may have an upper plate heating time controlling portion 172a and a lower plate heating time controlling portion 172b. The upper plate heating time controlling portion 172a and the lower plate heating time controlling portion 172b independently control the heating times of the plates 145 and 146. As a result, the resist can be heated at an optimum temperature according to the type thereof.

Next, a process for a substrate will be described.

Figure 22:
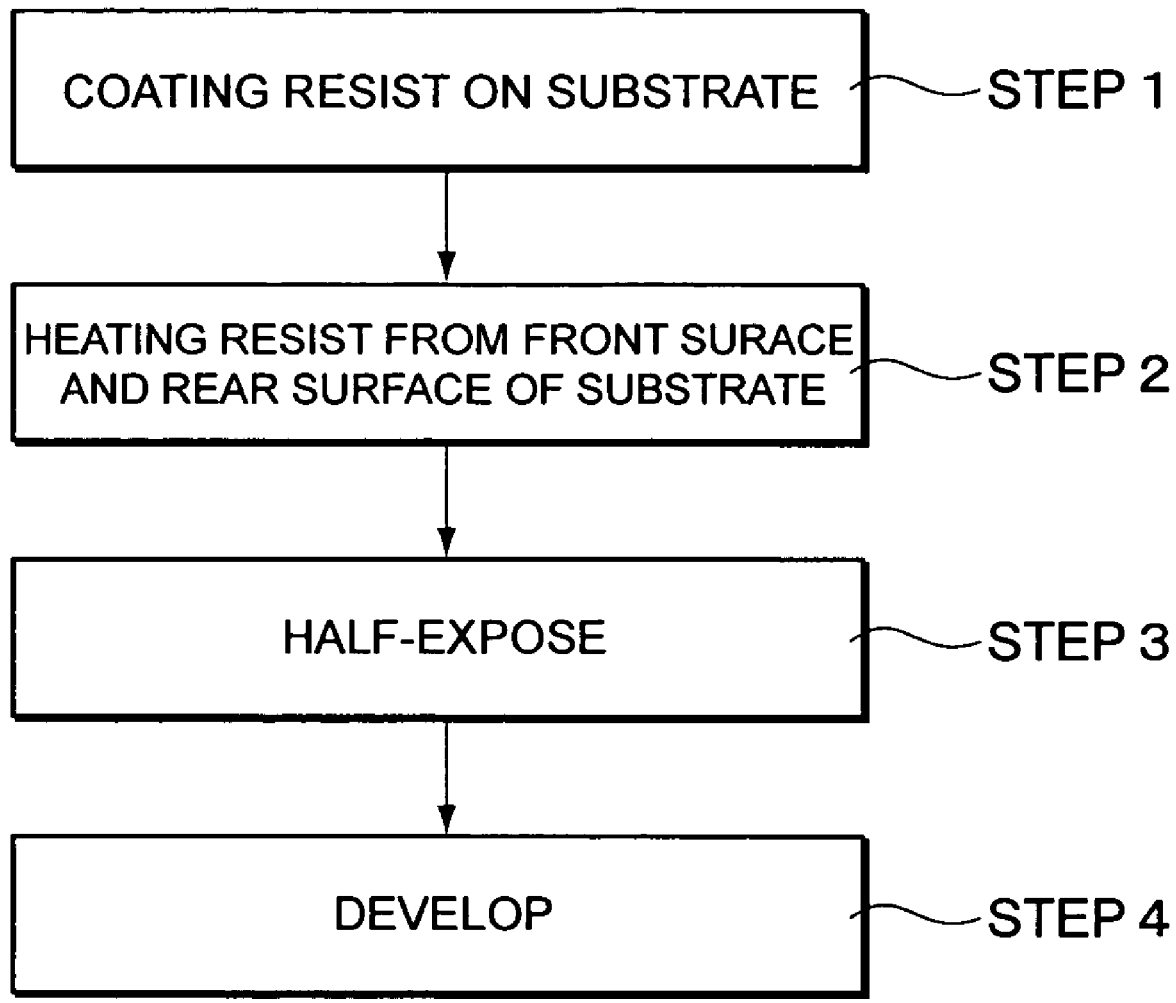
FIG. 22 is a flow chart showing steps of a substrate processing method according to the present invention.

FIG. 22 is a flow chart showing steps according to the present invention. The resist process block 115 coats a resist R on the front surface of a substrate G in accordance with for example the spin coat method (at step 1). An example of the material of the resist R is a novolak type resin.

Figure 23A:
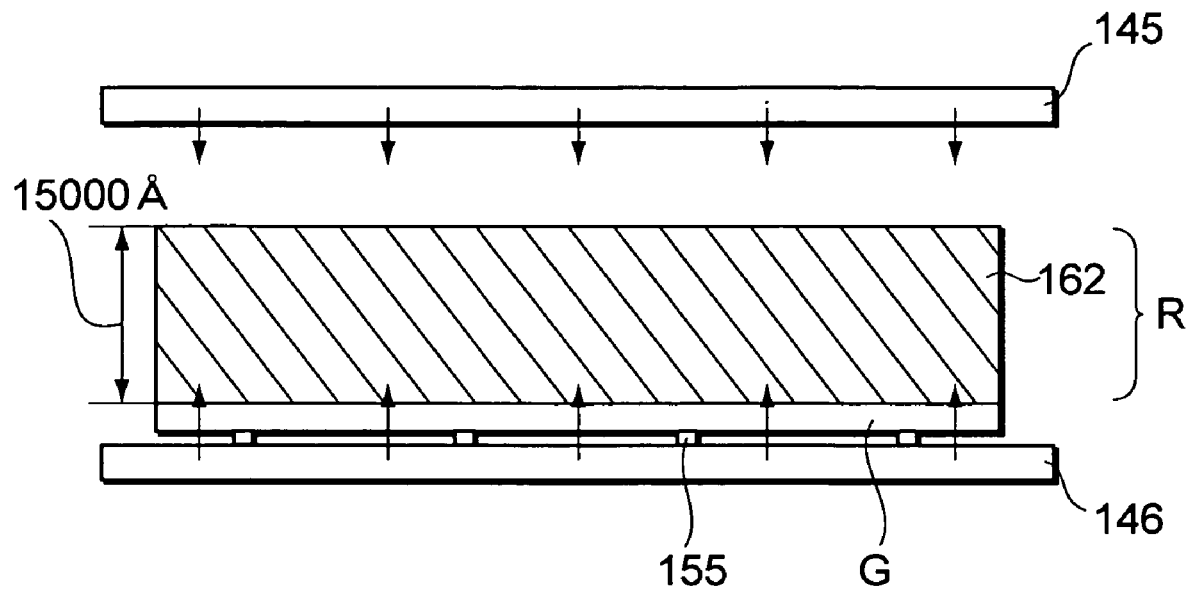
FIG. 23A and FIG. 23B are schematic diagrams showing a heating process for a resist.

Thereafter, the upper plate 145 and the lower plate 146 of the pre-baking unit 138 of the thermal process block 126 heat the resist R (at step 2). When a substrate is loaded into the pre-baking unit 138, the upper driving mechanism 143 may raise and lower the upper plate 145 so that the substrate G can be easily loaded thereinto. The substrate G is placed on the supporting pins 157. As shown in FIG. 23A, the lower driving mechanism places the substrate G on the proximity pins 155. In the state, the upper plate 145 and the lower plate 146 heat the resist R. For easy understanding of the drawing, the substrate G and the resist R are exaggeratedly illustrated in such a manner that the ratio of the thickness of the substrate G to the film thickness of the resist R becomes large. When the resist R is heated, it sufficiently contains moisture. The resist R that sufficiently contains moisture is designated by reference numeral 162. When the resist R is heated, the upper plate 145 may be properly raised and lowered by the upper driving mechanism 143.

FIG. 24 is a list showing heating conditions at step 2. The upper row of the list shows optimum control ranges of the heating control portion 170 and the pressure controlling portion 173. The lower row of the list shows optimum values in the case that a novolak type resin is used as the material of the resist according to the present embodiment. As the optimum control ranges of the plate temperatures, it is preferred that the upper plate 145 should heat the resist R in the range from 70° C. to 200° C. and the lower plate 146 should heat the resist R in the range from 90° C. to 150° C. This is because the optimum heating temperature of resist depend on the type thereof. Thus, it is necessary to set the upper plate temperature controlling portion 171a and the lower plate temperature controlling portion 171b of the heating temperature controlling portion 171 so that the heating temperatures can be controlled in the foregoing ranges. To set the temperature ranges of the upper plate temperature controlling portion 171a and the lower plate temperature controlling portion 171b in such ranges, the upper plate temperature controlling portion 171a and the lower plate temperature controlling portion 171b can heat the resist at their optimum temperatures depending on the type thereof.

It is preferred that the heating time controlling portion 172 should set the plate heating times in the range from 60 seconds to 300 seconds depending on the type of the resist. It is preferred that the pressure controlling portion 173 should set the exhaust gas pressure of the exhaust opening 147 in the range from atmospheric pressure to 5 Pa to 100 Pa that depend on the type of resist.

As the optimum values of the novolak type resin resist R according to the present embodiment, it is preferred that the upper plate 145 should heat the resist R in the range from 70° C. to 200° C., the lower plate 146 should heat the resist R at around 135° C., the heating time should be around 180 seconds, and the exhaust gas pressure should be reduced from the normal pressure by 10 Pa to 50 Pa. Thus, it is necessary to set the heating temperature controlling portion 171, the heating time controlling portion 172, and the pressure controlling portion 173 so that the upper plate 145 and the lower plate 146 heat the resist R in the foregoing ranges.

Figure 23B:
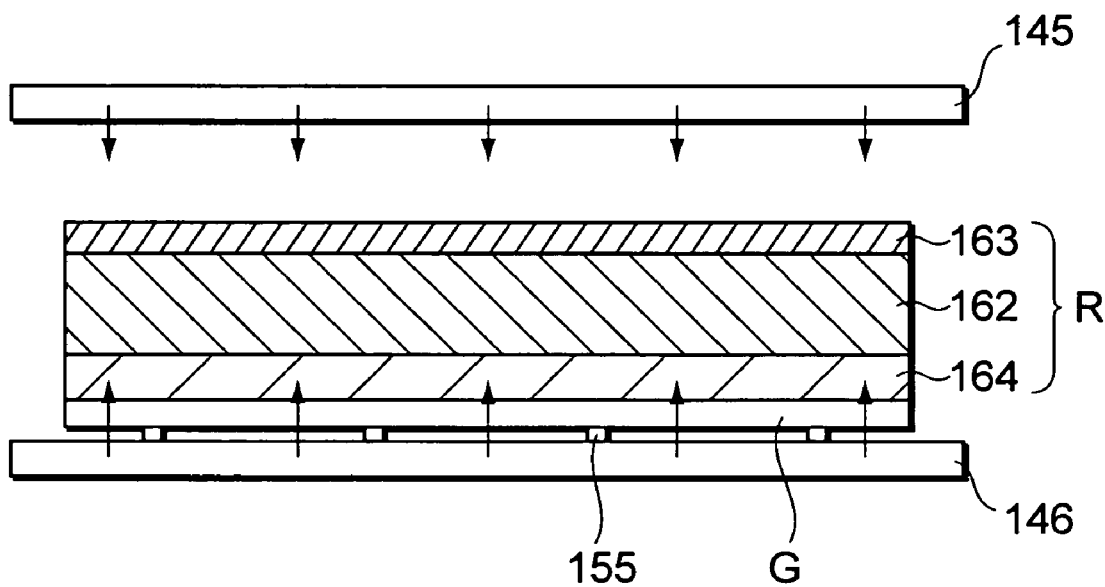

When the resist R is heated in such conditions, as shown in FIG. 23B, the resist R is heated by the upper plate 145. As a result, a baked portion 163 of which the front surface of the resist R is baked and hardened is formed. In addition, the resist R is heated by the lower plate 146. As a result, moisture is evaporated from the resist R. Thus, a dried portion 164 whose moisture content is relatively small is formed. Since the baked portion 163 is formed, moisture is prevented from evaporating from heating by the lower plate 146. As a result, a moisture containing portion 162 whose moisture content is relatively large is left between the baked portion 163 and the dried portion 164.

In this state, the heating process for the resist R is stopped. Thereafter, the resist R is exposed (at step 3). The resist R is exposed as shown in FIG. 25A to FIG. 25C.

Figure 25A:
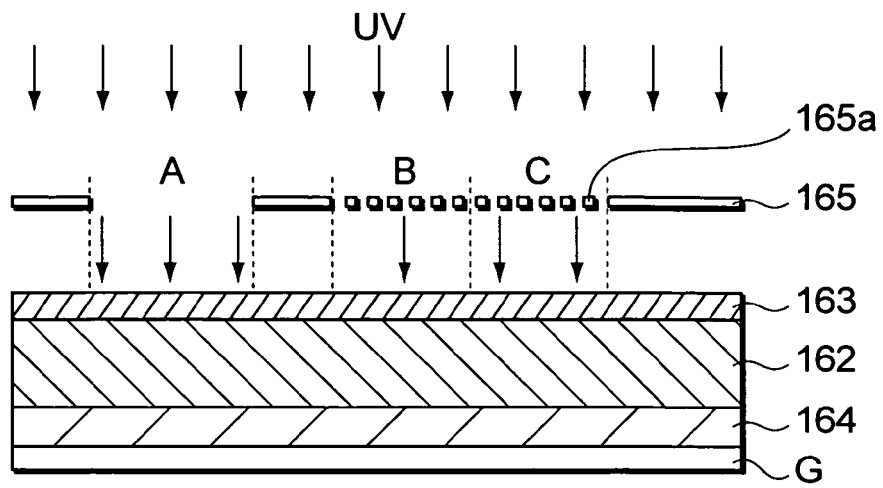
FIG. 25A to FIG. 25C are sectional views showing steps for irradiating exposure light to a resist.

FIG. 25A shows steps of which exposure regions A, B, and C of the resist R are exposed. According to the present embodiment, in the case that the amount of exposure light irradiated to the exposure region B of the resist R is different from the amount of exposure light irradiated to the exposure region C of the resist R, it is assumed that the amount of light irradiated to the exposure region C is larger than the amount of light irradiated to the exposure region B.

The resist R is exposed by the exposing unit 132. The resist R is covered by a mask 165. Ultraviolet ray is irradiated to the resist R through the mask 165. The resist R is exposed to the exposure regions A of the resist R. In the exposure region A ordinary exposure is performed. Thus, a hole is formed in the mask 165 corresponding to the exposure region A. As a result, light is fully irradiated to the exposure region A. In contrast, the resist R is half-exposed to the exposure regions B and C of the resist R. Thus, a half tone 165a is disposed about the exposure regions B and C of the resist R. As a result, almost half of light penetrates the exposure regions B and C of the resist R.

Figure 25B:
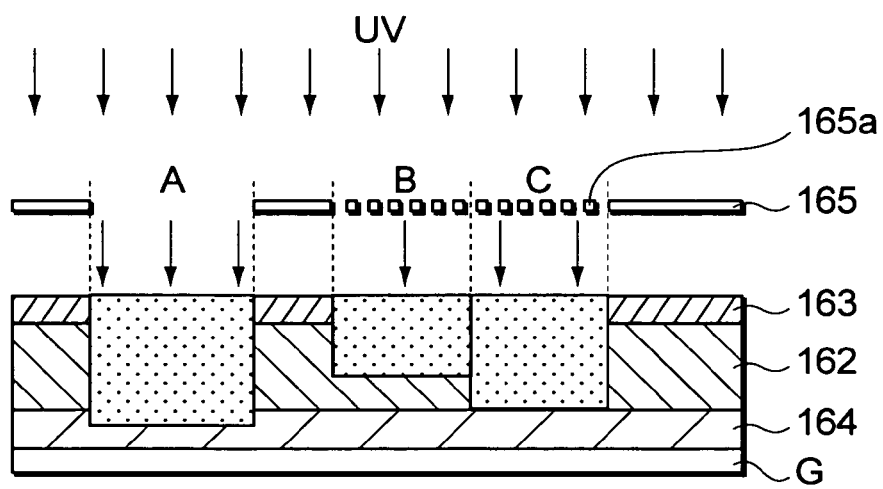
Figure 25C:
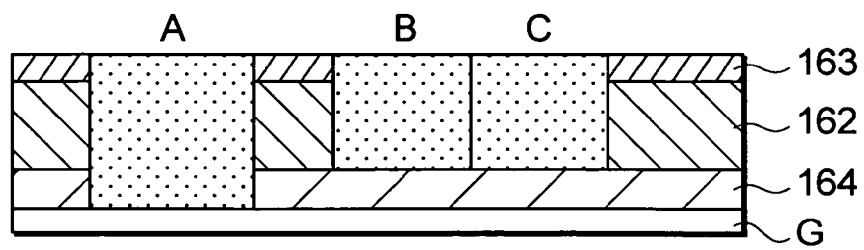

FIG. 25B shows a step of which the resist R is exposed. In the exposure region C of the resist R, up to the baked portion 163 and the moisture containing portion 162 have been exposed. In the exposure region A of the resist R, the dried portion 164 has been slightly exposed. In the exposure region B of the resist R, up to the half of the moisture containing portion 162 has been exposed. Since extent to resist R is exposed corresponds to the exposure amount, extent to reaction taking place becomes different in each of the exposure regions.

FIG. 25C shows a step of which ultraviolet rays (g-line and i-line) have been irradiated to the resist R and it has been exposed. In the exposure region A of the resist R, all the baked portion 163, the moisture containing portion 162, and the dried portion 164 have been exposed. The intensity of the exposure light irradiated to the exposure regions B and C of the resist R is smaller than the intensity of the exposure light irradiated to the exposure region A of the resist R. Thus, although the baked portion 163 and the moisture containing portion 162 have been exposed, the dried portion 164 has not been exposed. In comparison with the step shown in FIG. 25B, in the exposure region C of the resist R, up to the moisture containing portion 162 has been exposed. In the exposure regions B and C of the resist R, even if the amount of irradiated light varies, the exposure depths of the resist R do not vary.

Figure 26A:
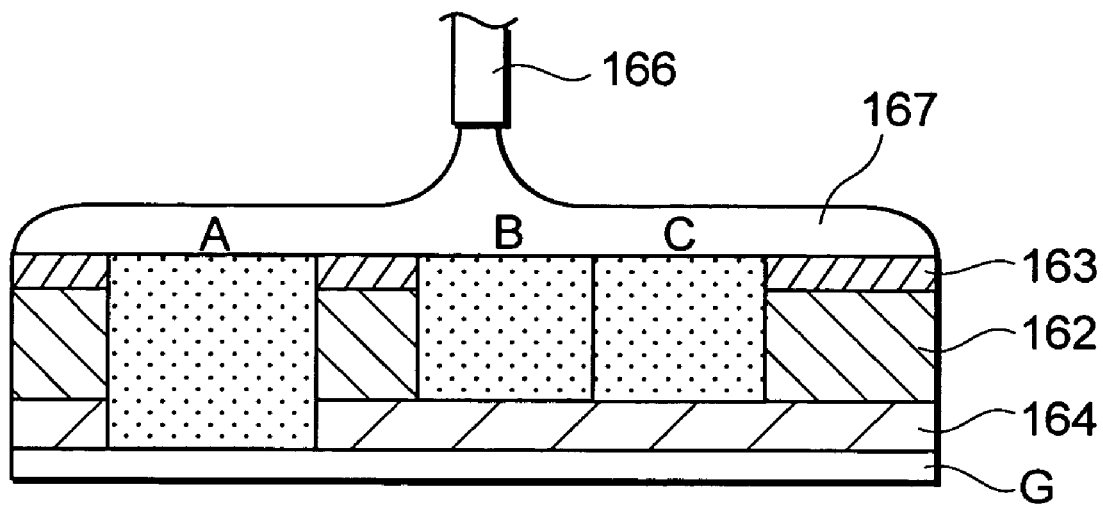
FIG. 26A and FIG. 26B are sectional views showing steps for supplying developing solution to a resist.
Figure 26B:
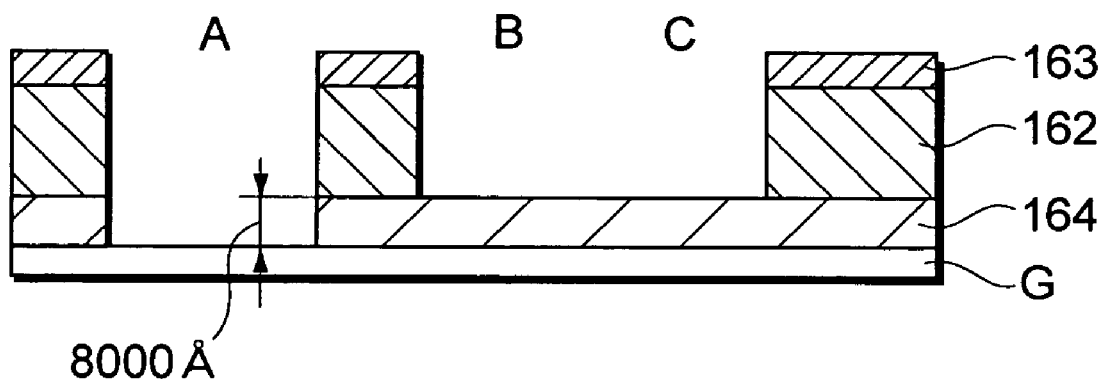

Thereafter, the resist R is developed (at step 4). FIG. 26A and FIG. 26B show steps of which the resist R is developed. FIG. 26A shows a step of which a developing solution is supplied to an exposed resist R. The resist R is developed by the developing process unit (DEV) disposed in the downstream portion 103c of the coating and developing process apparatus 101. A developing solution 167 is discharged from a nozzle 166. The developing solution 167 is sprayed on the front surface of the resist R. As shown in FIG. 26B, the developing solution 167 dissolves an exposed portion of the resist R. In the process, when the resist is exposed, a masked portion is not dissolved, but is left. The exposure region A of the resist R is fully dissolved. In the exposure regions B and C of the resist R, only the dried portion 164 that has not been exposed is not dissolved, but is left. According to the present embodiment, the thickness of the residual film of the exposure regions B and C is the thickness of the dried portion 164. The thickness of the dried portion 164 is around 8000 angstroms. Thus, the thickness of the residual film of the exposure regions B and C becomes constant even if the amount of exposure in the exposure region B is different from the amount of exposure in the exposure region C.

Figure 28:
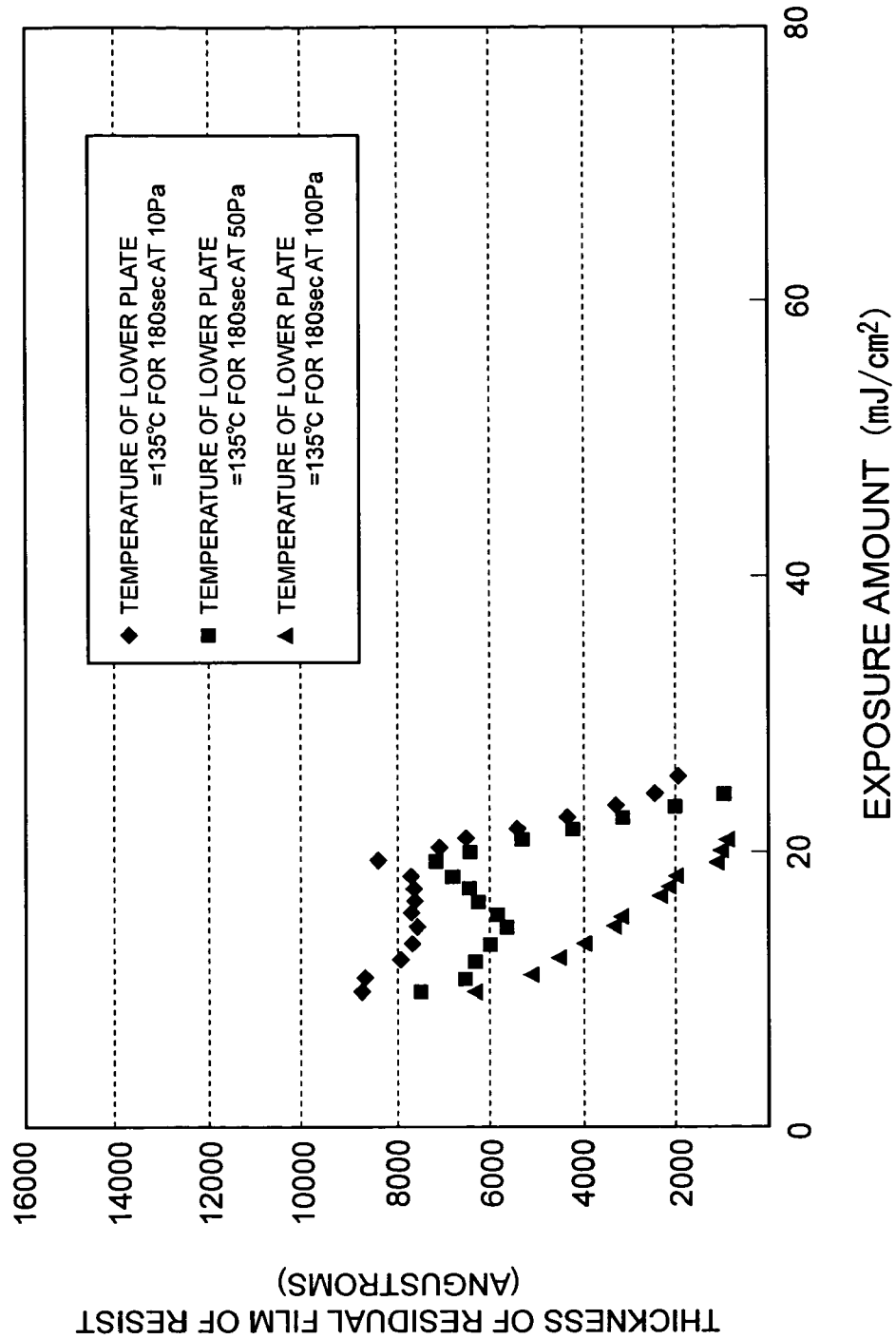
FIG. 28 is a graph showing the relation of the exposure amount and the thickness of a residual film of a resist that has been developed.
Figure 29:
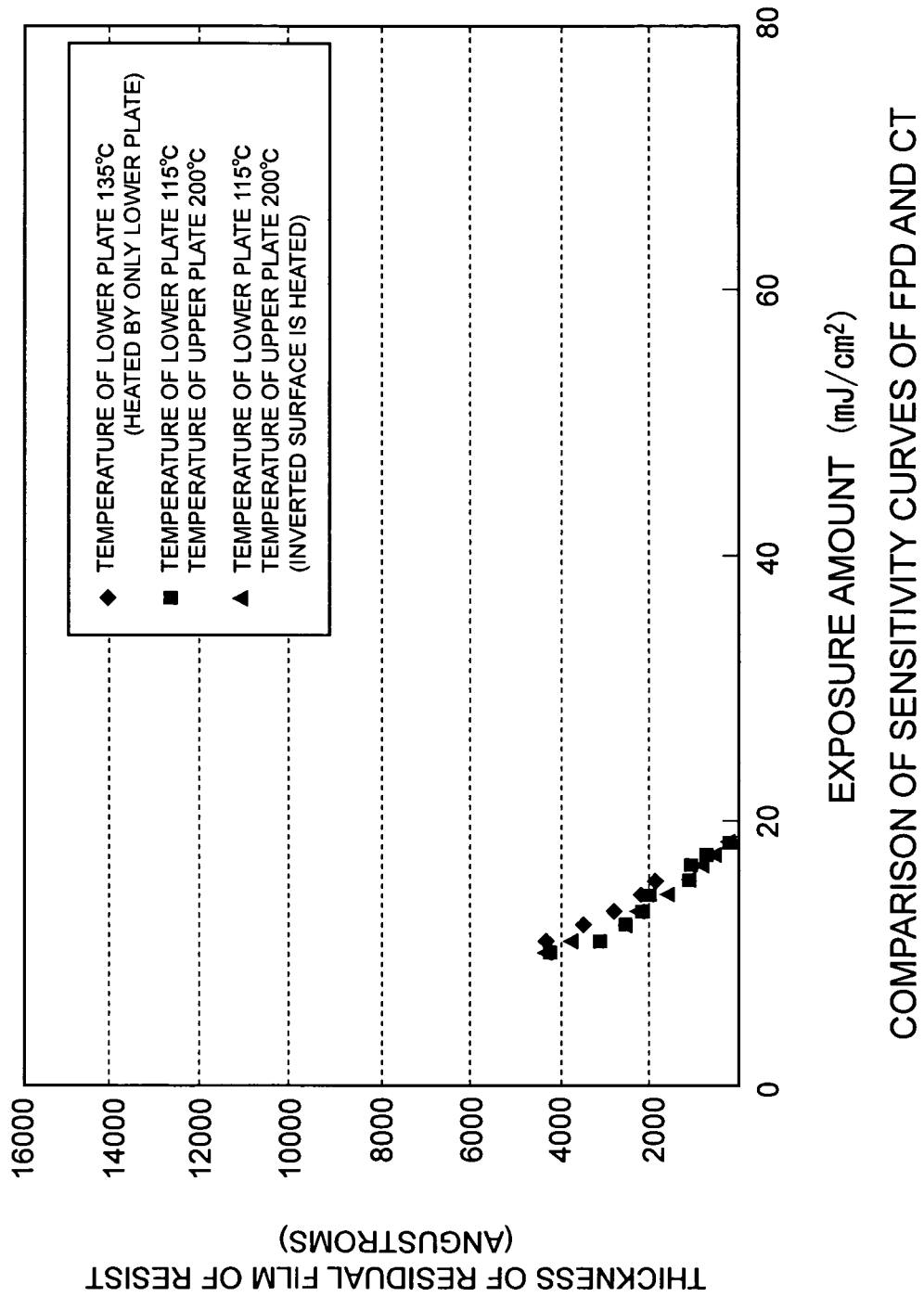
FIG. 29 is a graph showing the relation of the exposure amount and the thickness of a residual film of a resist that has been developed.

FIG. 27 to FIG. 29 are graphs showing experimental results of the present embodiment. The graphs represent the relation of an exposure amount and the thickness of a residual film of a resist. The horizontal axis represents an exposure amount, whereas the vertical axis represents the thickness of a residual film of a resist. Like the present embodiment, in the experiments, a novolak type resin was used for a resist.

FIG. 27 shows the relation of an exposure amount and the thickness of a residual film of a resist R that is heated in such a manner that the temperature of the lower plate 146 is set to 135° C. and the temperature of the upper plate 145 is varied from 70° C. to 135° C. to 200° C. FIG. 27 also shows the relation of an exposure amount and the thickness of a residual film of a resist R that is heated without the upper plate 145.

When the temperature of the upper plate 145 is varied from 70° C. to 135° C. to 200° C. and the exposure amount is in the range from 10 to 20 (mJ/cm$^2$), the thickness of the residual film of the resist is constant, almost 3000 angstroms. It is clear that the temperature of the upper plate 145 does not largely affect the thickness of the residual film of the resist. Thus, when the exposure amount of the half-exposure is set in the range from 10 to 20 (mJ/cm$^2$), preferably in the range from 15 to 20 (mJ/cm$^2$), the thickness of the residual film of the resist can be kept constant even if the exposure amount deviates.

FIG. 28 shows the relation of an exposure amount and the thickness of a residual film of a resist R that is heated in such a manner that the temperature of the lower plate 146 is set to 135° C., the temperature of the upper plate 145 is set in the range from 70° C. to 200° C., the resist R is heated by the upper plate 145 and the lower plate 146 for 180 seconds, and the exhaust gas pressure is varied from 10 Pa to 50 Pa to 100 Pa.

When the exhaust gas pressure is 10 Pa and the exposure amount is in the range from 10 to 20 (mJ/cm$^2$), the thickness of the residual film of the resist is almost constant, 8000 angstroms. When the exhaust gas pressure is 50 Pa and the exposure amount is in the range from 10 to 20 (mJ/cm$^2$), the thickness of the residual film of the resist slightly varies from 6000 to 7000 angstroms. In contrast, when the exhaust gas pressure is 100 Pa, even if the exposure amount is in the range from 10 to 20 (mJ/cm$^2$), the thickness of the residual film of the resist largely decreases from 1000 angstroms to 6000 angstroms as the exposure amount increases. Thus, when the exhaust gas pressure at which the resist R is heated is set in the range from 10 to 50 Pa, preferably around 10 Pa and the exposure amount is set in the range from 10 to 20 (mJ/cm$^2$), the thickness of the residual film of the resist becomes constant. When the exhaust gas pressure is set to the foregoing value, the thickness of the residual film of the resist becomes ideal, around 8000 angstroms.

FIG. 29 shows the relation of an exposure amount and the thickness of a residual film of a resist R that is heated in such a manner that the lower plate 146 is set to 115° C., the upper plate 145 is not used, the upper plate 145 is set to 200° C., and the substrate is inverted so that the resist R is heated by the lower plate 146.

In any case, the thickness of the residual film of the resist does not become constant, but decreases as the exposure amount increases. However, when the exhaust gas pressure and the heating time are set to their proper values, the thickness of the residual film of the resist might become constant.

As described above, according to the present invention, the uniformity of the residual film of a portion that has been half-exposed can be improved.

Figure 30:
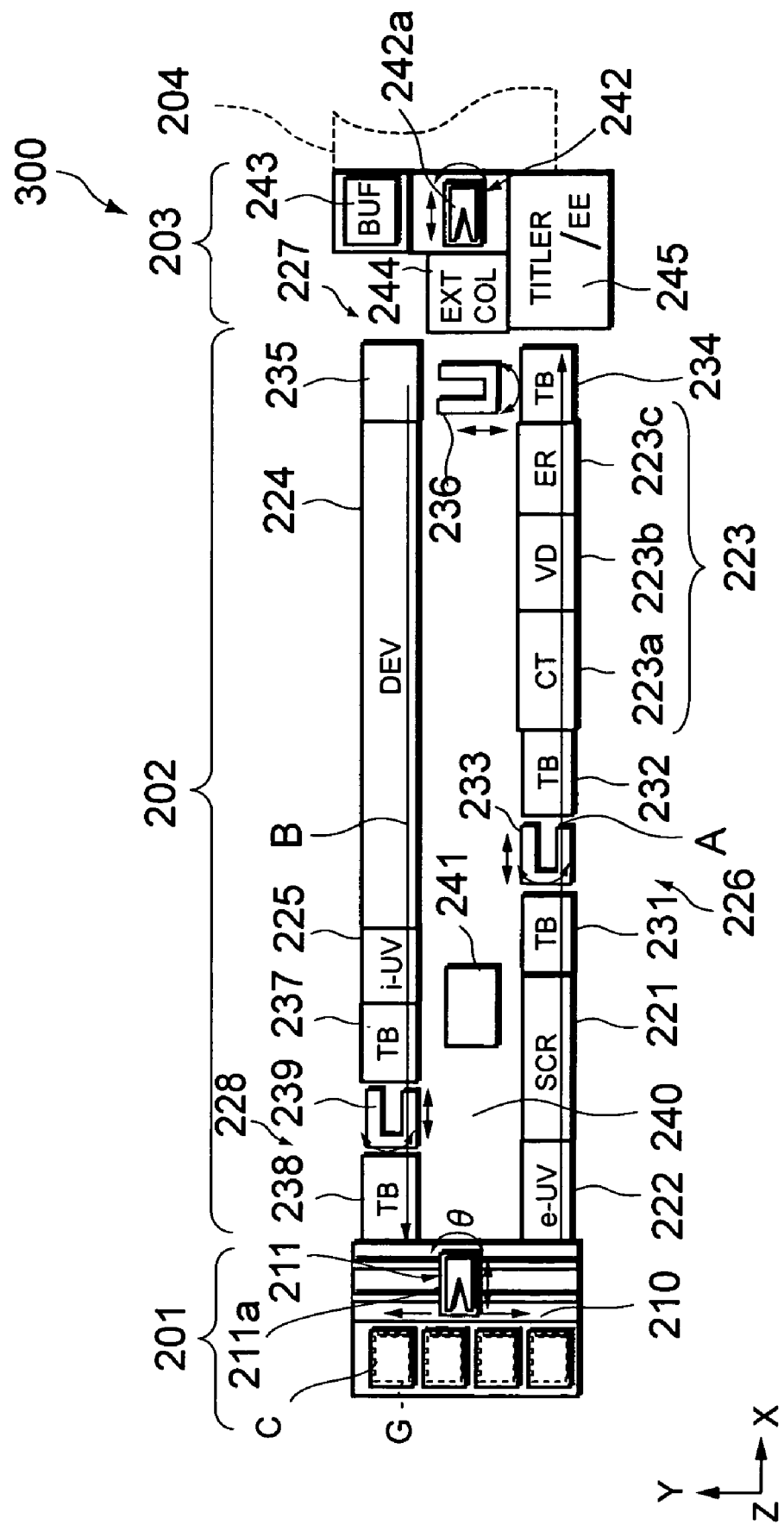
FIG. 30 is a plan view showing the overall structure of a resist coating and developing process apparatus according to another embodiment of the present invention.

FIG. 30 is a plan view showing a resist coating and developing process apparatus for an LCD glass substrate according to another embodiment of the present invention.

The resist coating and developing process apparatus is designated by reference numeral 300. The resist coating and developing process apparatus 300 has a cassette station (loading and unloading portion) 201, a process station (process portion) 202, and an interface station (interface portion) 203. On the cassette station 201, cassettes C are placed. Each of the cassettes C accommodates a plurality of LCD substrates G.

The process station 202 has a plurality of process units that perform a sequence of processes including a process for coating a resist on a substrate and a process for developing the coated substrate. The interface station 203 transfers a substrate G with an exposing unit 204. The cassette station 201 and the interface station 203 are disposed on both ends of the process station 202. In FIG. 30, it is assumed that the longitudinal direction of the resist coating and developing process apparatus 300 is an X direction and the direction perpendicular to the X direction is an Y direction.

The cassette station 201 has a conveying unit 211 that loads and unloads a substrate G to and from a cassette C and the process station 202. The cassette station 201 loads and unloads a cassette C to and from the outside. The conveying unit 211 has a conveying arm 211a. The conveying unit 211 is capable of moving on a conveying path 210 disposed in which cassettes C are arranged in the Y direction. The conveying arm 211a loads and unloads a substrate G between a cassette C and the process station 202.

The process station 202 has two parallel conveying lines A and B that extend in the X direction and through which a substrate G is conveyed. Along the conveying line A, a scrub-cleaning process unit (SCR) 221, a first thermal process unit section 226, a resist process unit 223, and a second thermal process unit section 227 are disposed in the order adjacent to the cassette station 201 and the interface station 203. In addition, along the conveying line B, a second thermal process unit section 227, a developing process unit (DEV) 224, an i-line UV irradiating unit (i-UV) 225, and a third thermal process unit section 228 are disposed in the order adjacent to the interface station 203 and the cassette station 201. An excimer UV irradiating unit (e-UV) 222 is disposed so as to remove organic matter before the substrate G is scrub-cleaned. The i-line UV irradiating unit (i-UV) 225 is disposed so as to perform a discoloring process for a resist that has been developed.

The scrub-cleaning process unit (SCR) 221 performs a cleaning process and a drying process for a substrate G while almost horizontally conveying the substrate G unlike with the related art of which a substrate G is rotated in a scrub-cleaning process unit (SCR) 221. Likewise, the developing process unit (DEV) 224 performs a developing solution coating process, a developing solution rinsing process, and a driving process for a substrate G while almost horizontally conveying it without rotating it therein. In the scrub-cleaning process unit (SCR) 221 and the developing process unit (DEV) 224, a substrate G is conveyed by a roller conveying mechanism or a belt conveying mechanism. A loading opening and an unloading opening through which a substrate G is loaded and unloaded are formed on opposite shorter sides of each of the scrubber cleaning process unit (SCR) 221 and the developing process unit (DEV) 224. A substrate G is conveyed to the i-line UV irradiating unit (i-UV) 225 by the same conveying mechanism as the developing process unit (DEV) 224.

Figure 31:
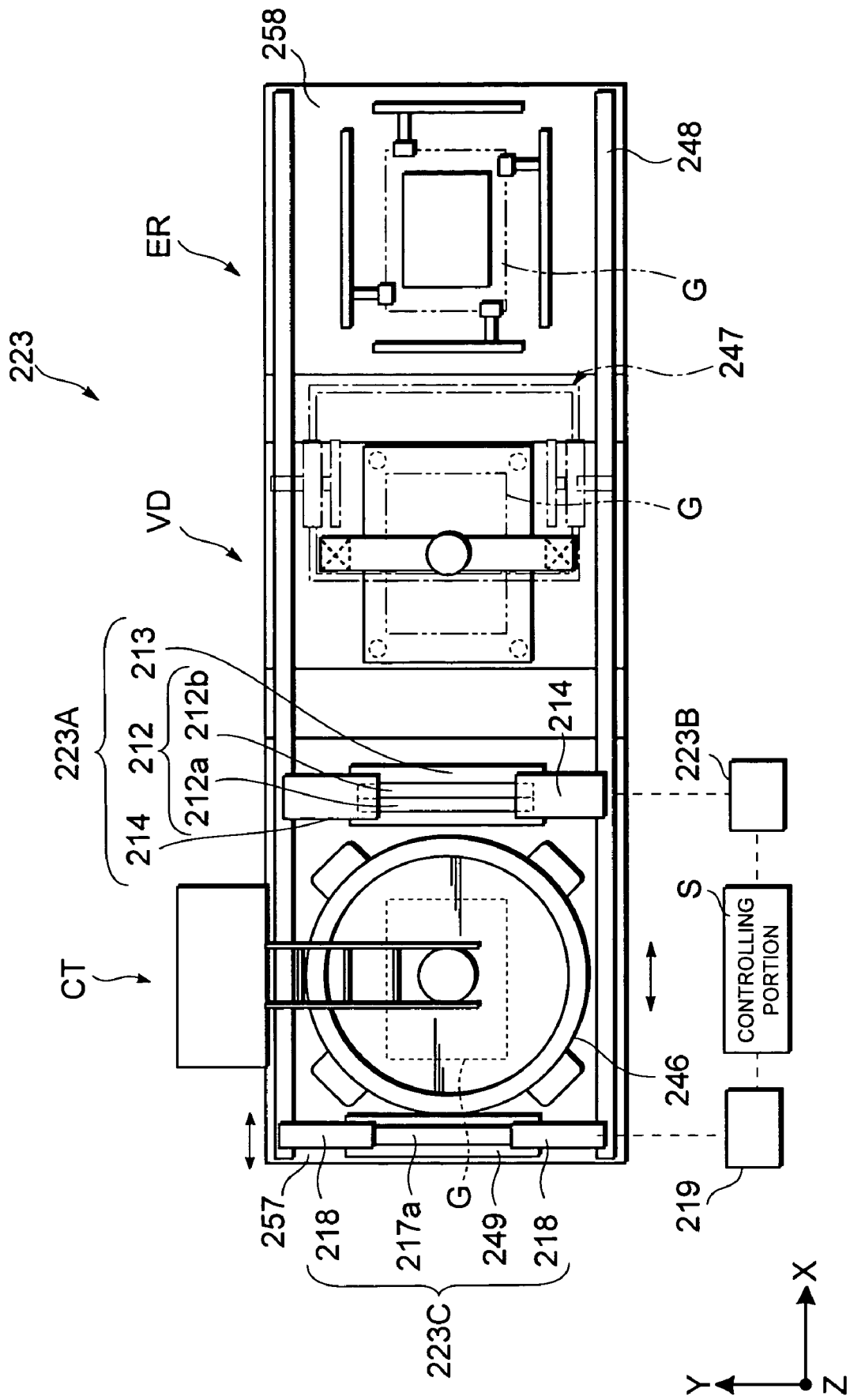
FIG. 31 is a plan view showing a resist process unit of the resist coating and developing process apparatus.

As shown with a plan view of FIG. 31, the resist process unit 223 has a resist coating process unit (CT) 223a, a reduced pressure drying process unit (VD) 223b, and a peripheral resist removing unit (ER) 223c. The resist coating process unit (CT) 223a has a resist coating mechanism 223A that coats a resist on a substrate G placed in a cup 246. The reduced pressure drying process unit (VD) 223b has a reduced pressure chamber that dries a resist film formed on a substrate G under reduced pressure. The peripheral resist removing unit (ER) 223c has a solvent discharging head that scans four sides of the substrate G disposed on a stage and removes an excessive resist from the periphery of a substrate G. A pair of sub arms 247 are guided by guide rails 248. The sub arms 247 horizontally conveys a substrate G along the guide rails 248. The guide rails 248 are fixed at both ends in the Y direction of the resist coating process unit (CT) 223a, the reduced pressure drying process unit (VD) 223b, the peripheral resist removing unit (ER) 223c and extends in the X direction. A loading opening 257 and an unloading opening 258 through which a substrate G is loaded and unloaded are formed on opposite shorter sides of the resist process unit 223. The guide rails 248 extend from the loading opening 257 to the unloading opening 258. The sub arms 247 transfer a substrate G with those units.

Figure 32:
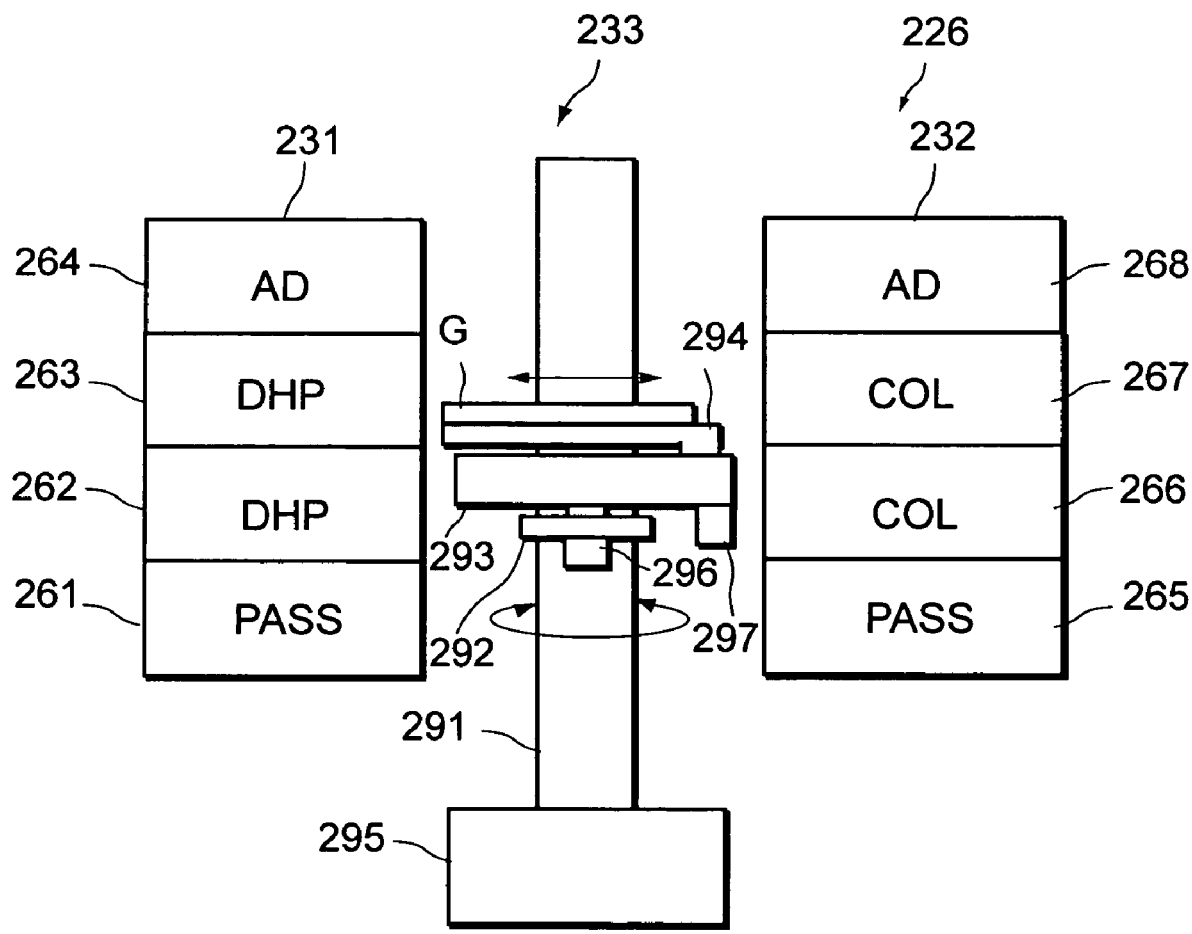
FIG. 32 is a front view showing a first conveying unit of the resist coating and developing process apparatus.

As shown with a side view of FIG. 32, the first thermal process unit section 226 has two thermal process unit blocks (TB) 231 and 232 each of which has thermal process units that each perform a thermal process for a substrate G. The thermal process units are piled up. The thermal process unit block (TB) 231 is disposed adjacent to the scrub-cleaning process unit (SCR) 221. The thermal process unit block (TB) 232 is disposed adjacent to the resist process unit 223. A first conveying unit 233 is disposed between the thermal process unit blocks (TB) 231 and 232.

The thermal process unit block (TB) 231 has four units of a pass unit (PASS) 261, two dehydration baking units (DHP) 262 and 263, and an adhesion process unit (TB) 264 that are piled up in the order. The pass unit (PASS) 261 transfers a substrate G with another unit. The dehydration baking units (DHP) 262 and 263 each perform a dehydration baking process for a substrate G. The adhesion process unit (TB) 264 performs a hydrophobic process for a substrate G. The thermal process unit block (TB) 232 has four units of a pass unit (PASS) 265, two cooling units (COL) 266 and 267, and an adhesion process unit (AD) 268 that are piled up in the order. The pass unit (PASS) 265 transfers a substrate G with another unit. The cooling units (COL) 266 and 267 each cool a substrate G. The adhesion process unit (AD) 268 performs a hydrophobic process for a substrate G. The first conveying unit 233 receives a substrate G from the scrub-cleaning process unit (SCR) 221 through the pass unit (PASS) 261, loads and unloads the substrate G to and from the thermal process units, and transfers the substrate G with the resist process unit 223 through the pass unit (PASS) 265.

The first conveying unit 233 has a guide rail 291, a raising and lowering member 292, a base member 293, and a substrate holding arm 294. The guide rail 291 extends upward. The raising and lowering member 292 is raised and lowered along the guide rail 291. The base member 293 rotates on the raising and lowering member 292. The substrate holding arm 294 is capable of advancing and retreating on the base member 293 and holding the substrate G. The raising and lowering member 292 is raised and lowered by a motor 295. The base member 293 is rotated by a motor 296. The substrate holding arm 294 is advanced and retreated by a motor 297. Since the first conveying unit 233 is disposed so that it is moved upward and downward, advanced, retreated, and rotated, the first conveying unit 233 is capable of accessing any unit of the thermal process unit blocks (TB) 231 and 232.

Next, the second thermal process unit section 227 and the third thermal process unit section 228 (not shown) will be described mainly for different points from the first thermal process unit section 226.

The second thermal process unit section 227 has two thermal process unit blocks (TB) 234 and 235. The thermal process unit blocks (TB) 234 and 235 each have a plurality of thermal process units that are piled up. Each of the thermal process units performs a thermal process for a substrate G. The thermal process unit block (TB) 234 is disposed adjacent to the resist process unit 223. The thermal process unit block (TB) 235 is disposed adjacent to the developing process unit (DEV) 224. A second conveying unit 236 is disposed between the two thermal process unit blocks (TB) 234 and 235. The second conveying unit 236 has the same structure as the first conveying unit 233.

The thermal process unit block (TB) 234 has four units of a pass unit (PASS) and three pre-baking units (PREBAKE) that are piled up in the order. The pass unit (PASS) transfers a substrate G with another unit. The pre-baking units (PREBAKE) each perform a pre-baking process for a substrate G. The thermal process unit block (TB) 235 has four units of a pass unit (PASS), a cooling unit (COL), and two pre-baking units (PREBAKE) that are piled up in the order. The pass unit (PASS) transfers a substrate G with another unit. The cooling unit (COL) cools a substrate G. The pre-baking units (PREBAKE) each perform a pre-baking process for a substrate G. The second conveying unit 236 receives a substrate G from the resist process unit 223 through the pass unit (PASS), loads and unloads the substrate G to and from the thermal process units, transfers the substrate G to the developing process unit (DEV) 224 through the pass unit (PASS), and transfers the substrate G with an extension cooling stage (EXT COL) 244 that is a substrate transferring portion of the interface station 203 (that will be described later).

The third thermal process unit section 228 has two thermal process unit blocks (TB) 237 and 238. Each of the thermal process unit blocks (TB) 237 and 238 has many thermal process units each of which performs a thermal process for a substrate G. The thermal process unit block (TB) 237 is disposed adjacent to the developing process unit (DEV) 224. The thermal process unit block (TB) 238 is disposed adjacent to the cassette station 201. A first conveying unit 233 is disposed between the two thermal process unit blocks (TB) 237 and 238.

The thermal process unit block (TB) 237 has four units of a pass unit (PASS) and three post-baking units (POBAKE) that are piled up in the order. The pass unit (PASS) transfers a substrate G with another unit. The post-baking units (POBAKE) each perform a post-baking process for a substrate G. The thermal process unit block (TB) 238 has four units of a pass and cooling unit (PASS·COL) and three post-baking units (POBAKE) that are piled up in the order. The pass and cooling unit (PASS·COL) transfers a substrate G with another unit and cools it. The post-baking units (POBAKE) each perform a post-baking process for a substrate G. A third conveying unit 239 receives a substrate G from the i-line UV irradiating unit (i-UV) 225 through the pass unit (PASS), loads and unloads the substrate G to and from the thermal process units, and transfers the substrate G with the cassette station 201 through the pass and cooling unit (PASS·COL) unit.

A substrate G is loaded into the scrub-cleaning process unit (SCR) 221 and the excimer UV irradiating unit (e-UV) 222 by the conveying unit 211 of the cassette station 201. A substrate G is unloaded from the scrub-cleaning process unit (SCR) 221 into the pass unit (PASS) 261 of the thermal process unit block (TB) 231 by the foregoing roller conveying mechanism. In the pass unit (PASS) 261, the substrate G is raised by pins (not shown) that are protruded and conveyed by the first conveying unit 233. A substrate G is transferred to the pass unit (PASS) 265 by the first conveying unit 233 and then loaded into the resist process unit 223 by the sub arms 247 through the loading opening 257. In the resist process unit 223, a substrate G is conveyed to the pass unit (PASS) of the thermal process unit block (TB) 234 through the unloading opening 258 by the sub arms 247. The substrate G is conveyed to protruded pins (not shown). The pins (not shown) that holds the substrate G in the pass unit (PASS) of the thermal process unit block (TB) 235 are lowered so as to load the substrate G into the developing process unit (DEV) 224. The substrate G is transferred by for example the roller conveying mechanism that extends to the pass unit (PASS). A substrate G is unloaded from the i-line UV irradiating unit (i-UV) 225 to the pass unit (PASS) of the thermal process unit block (TB) 237 by for example the roller conveying mechanism. The substrate G is raised by the pins (not shown) that are protruded and conveyed by the third conveying unit 239. After all processes have been performed for a substrate G, it is conveyed to the pass and cooling unit (PASS·COL) of the thermal process unit block (TB) 238 and unloaded by the conveying unit 211 of the cassette station.

In the process station 202, the foregoing two conveying lines A and B, individual process units, and conveying units are disposed so as to perform the foregoing processes for a substrate G in the foregoing order. A space portion 240 is disposed between the conveying lines A and B. A shuttle (substrate holding member) 241 is disposed. The shuttle 241 reciprocates in the space portion 240. The shuttle 241 is capable of holding a substrate G and transferring it with the conveying lines A and B.

The interface station 203 has a conveying unit 242, a buffer stage (BUF) 243, and an extension cooling stage (EXT·COL) 244. The conveying unit 242 loads and unloads a substrate G to and from the process station 202 and the exposing unit 204. The buffer stage (BUF) 243 holds a buffer cassette. The extension cooling stage (EXT·COL) 244 is a substrate transferring portion having a cooling function. An external unit block 245 is disposed adjacent to the conveying unit 242. The external unit block 245 has a titler (TITLER) and a periphery exposing unit (EE) that are piled up in the order. The conveying unit 242 has a conveying arm 242a. The conveying arm 242a loads and unloads a substrate G to and from the process station 202 and the exposing unit 204.

In the resist coating and developing process apparatus 300, a substrate G is removed from a cassette C placed on the cassette station 201 and directly loaded into the excimer UV irradiating unit (e-UV) 222 of the process station 202 by the conveying unit 211. The excimer UV irradiating unit (e-UV) 222 performs a pre-scrubbing process for the substrate G. Thereafter, the substrate G is loaded into the scrub-cleaning process unit (SCR) 221 disposed below the excimer UV irradiating unit (e-UV) 222 by the conveying unit 211. The scrub-cleaning process unit (SCR) 221 scrub-cleans the substrate G. The scrub-cleaning process unit (SCR) 221 performs a cleaning process and a drying process for the substrate G while almost horizontally conveying the substrate G without rotating it. Thus, the scrubber cleaning process unit (SCR) 221 has the same process capability as two rotating type scrub-cleaning process units with a smaller space than those. After the scrub-cleaning process unit (SCR) 221 has performed the scrub-cleaning process for the substrate G, the substrate G is conveyed to the pass unit (PASS) 261 of the thermal process unit block (TB) 231 of the first thermal process unit section 226 by for example the roller conveying mechanism.

In the pass unit (PASS) 261, the substrate G is raised by pins (not shown) that are protruded and conveyed to the first thermal process unit section 226. In the first thermal process unit section 226, the following processes are performed. First of all, the substrate G is conveyed to one of the dehydration baking units (DHP) 262 and 263 of the thermal process unit block (TB) 231 and a heating process is performed therefore. Thereafter, the substrate G is conveyed to one of the cooling units (COL) 266 and 267 of the thermal process unit block (TB) 232 and a cooling process is performed therefor. Thereafter, the substrate G is conveyed to one of the adhesion process unit (TB) 264 of the thermal process unit block (TB) 231 and the adhesion process unit (AD) 268 of the thermal process unit block (TB) 232 and an adhesion process (hydrophobic process) is performed with MHDS therefor. Thereafter, the substrate G is conveyed to one of the cooling units (COL) 266 and 267 and a cooling process is performed therefor. Thereafter, the substrate G is conveyed to the pass unit (PASS) 265 of the thermal process unit block (TB) 232. At that point, the conveying process is performed by the first conveying unit 233. The adhesion process may not be performed. In such a case, the substrate G is conveyed to the pass unit (PASS) 265 after a dehydrating and baking process and a cooling process are performed for the substrate G.

Thereafter, in the pass unit (PASS) 265, the substrate G is loaded into the resist process unit 223 by the sub arms thereof. Thereafter, the substrate G is loaded into the resist coating process unit (CT) 223*a*. The resist coating process unit (CT) 223*a* spin-coats resist solution to the substrate G. The sub arms 247 convey the substrate G to the reduced pressure drying process unit (VD) 223*b*. The reduced pressure drying process unit (VD) 223*b* dries the substrate G under reduced pressure. The sub arms 247 convey the substrate G to the peripheral resist removing unit (ER) 223*c*. The peripheral resist removing unit (ER) 223*c* removes an excessive resist from the periphery of the substrate G. After the peripheral resist has been removed, the sub arms 247 unloads the substrate G from the resist process unit 223. The reduced pressure drying process unit (VD) 223*b* is disposed downstream of the resist coating process unit (CT) 223*a*. After a pre-baking process is performed for a substrate G on which a resist that has been coated or after a post-baking process is performed for a substrate G that has been developed, shapes of a lift pin, a fixing pin, or the like may be transferred to the substrate G. However, with the reduced pressure drying process unit (VD), a drying process can be performed under reduced pressure without a heating process, the solvent gradually evaporates from the resist. As a result, the resist is not quickly dried. Consequently, the resist can be dried without adversely affecting it. Thus, such shapes can be effectively prevented from being transferred to the substrate.

After the coating process has been performed in such a manner, the substrate G is unloaded from the resist process unit 223 by the sub arms 247 and transferred to the pass unit (PASS) of the thermal process unit block (TB) 234 of the second thermal process unit section 227. The substrate G is conveyed from the pass unit (PASS) to one of the pre-baking unit (PREBAKE) of the thermal process unit block (TB) 234 and the pre-baking unit (PREBAKE) of the thermal process unit block (TB) 235 by the second conveying unit 236 and a pre-baking process is performed therefor. Thereafter, the substrate G is conveyed to the cooling unit (COL) of the thermal process unit block (TB) 235. In the thermal process unit block (TB) 235, the substrate G is cooled at a predetermined temperature.

Thereafter, the substrate G is conveyed to the extension cooling stage (EXT·COL) 244 of the interface station 203 by the second conveying unit 236. Thereafter, the substrate G is conveyed to the periphery exposing unit (EE) of the external unit block 245 by the conveying unit 242 of the interface station 203 and an exposing process is performed for the substrate G so as to remote an excessive resist form the periphery of the substrate G. Thereafter, the substrate G is conveyed to the exposing unit 204 by the conveying unit 242. In the exposing unit 204, the resist film on the substrate G is exposed and a predetermined pattern is formed thereon. The substrate G may be placed in the buffer cassette on the buffer stage (BUF) 243 and the buffer cassette may be conveyed to the exposing unit 204.

After the substrate G has been exposed, it is loaded into the titler (TITLER) disposed at the upper stage of the external unit block 245 by the conveying unit 242 of the interface station 203. In the titler (TITLER), predetermined information is written to the substrate G. The substrate G is placed on the extension cooling stage (EXT·COL) 244. Thereafter, the substrate G is loaded from the extension cooling stage (EXT·COL) 244 into the process station 202. In other words, the substrate G is conveyed to the pass unit (PASS) of the thermal process unit block (TB) 235 of the second thermal process unit section 227 by the second conveying unit 236. In the pass unit (PASS), the substrate G that are raised by pins is lowered by the pins that are recessed. Thereafter, the substrate G is loaded into the developing process unit (DEV) 224 by for example the roller conveying mechanism that extends from the developing process unit (DEV) 224 to the pass unit (PASS) and a developing process is performed therefor. The developing process unit (DEV) 224 performs a developing solution coating process, a developing solution removing process, and a drying process for the substrate G while almost horizontally conveying the substrate G through for example the roller conveying method without need to rotate the substrate G. Thus, the developing process unit (DEV) 224 has the same capability as three rotating type developing process units with a smaller space than those.

After the developing process has been performed for the substrate G, it is conveyed from the developing process unit (DEV) 224 to the i-line UV irradiating unit (i-UV) 225 by a continuous conveying mechanism for example a roller conveying mechanism. The i-line UV irradiating unit (i-UV) 225 performs a discoloring process for the substrate G. Thereafter, the substrate G is conveyed to the pass unit (PASS) of the thermal process unit block (TB) 237 of the third thermal process unit section 228 by a conveying mechanism for example a roller conveying mechanism of the i-line UV irradiating unit (i-UV) 225.

The substrate G is conveyed from the pass unit (PASS) to one of the post-baking unit (POBAKE) of the thermal process unit block (TB) 237 and the post-baking unit (POBAKE) of the thermal process unit block (TB) 238 by the third conveying unit 239 and post-baking process is performed therefor. Thereafter, the substrate G is conveyed to the pass and cooling unit (PASS·COL) of the thermal process unit block (TB) 238. The pass and cooling unit (PASS·COL) cools the substrate G at a predetermined temperature. Thereafter, the substrate G is placed in a predetermined cassette C on the cassette station 201.

As shown in FIG. 31, the resist coating process unit (CT) 223*a* has a cup 246, a resist coating mechanism 223A, a first driving portion 223B, and a drying mechanism 223C. The cup 246 holds a substrate G when a resist is coated thereon. The resist coating mechanism 223A coats a resist on a substrate G. The first driving portion 223B moves the resist coating mechanism 223A in the X direction. The drying mechanism 223C dries a resist coated on a substrate G.

The resist coating mechanism 223A has a long resist nozzle 212, a pair of holding members 214, and a nozzle accommodating member 213. The resist nozzle 212 coats a resist on a substrate G. The holding members 214 hold both ends of the resist nozzle 212 that extends in the Y direction. The nozzle accommodating member 213 accommodates the resist nozzle 212 and the holding members 214. The resist coating mechanism 223A extends in the Y direction. The resist coating mechanism 223A is hooked on the guide rails 248 that extend in the X direction.

The resist nozzle 212 has long first and second resist nozzles 212a and 212b. Both ends of the first resist nozzle 212a and the second resist nozzle 212b are held by the holding members 214. The first and second resist nozzles 212a and 212b are adjacently disposed. The first resist nozzle 212a and the second resist nozzle 212b extend in the Y direction. The first and second resist nozzles 212a and 212b have discharge openings or slits (not shown). The first and second resist nozzles 212a and 212b are connected to first and second resist tanks through respective pumps or the like (not shown). Resists are supplied to the first and second resist nozzles 212a and 212b by the respective pumps.

One of the holding members 214 is connected to the first driving portion 223B that moves the resist nozzle 212 along the guide rails 248 in the X direction. In FIG. 31, the first driving portion 223B is represented as a block. In reality, the first driving portion 223B comprises an endless belt, a pair of pulleys, and a motor (they are not shown). The endless belt is connected to the holding member 214 and a rotating shaft of the motor through the pulleys. The motor causes the resist nozzle 212 to move in the X direction. The motor is connected to a controlling portion S that controls driving of the motor.

The drying mechanism 223C has a long drying nozzle 217a, a holding member 218, and a nozzle accommodating member 249. The drying nozzle 217a guides air so as to dry a resist. The holding member 218 holds both ends of the drying nozzle 217a. The nozzle accommodating member 249 accommodates the holding member 218. The drying mechanism 223C extends in the Y direction. The drying mechanism 223C is hooked on the guide rails 248. The drying nozzle 217a has discharge openings or slits (not shown). A blower fan is connected to the drying nozzle 217a through a connection pipe (not shown). A heater may be used instead of the drying nozzle 217a. With the drying nozzle 217a or heater, a resist can be dried or heated.

One of the holding members 218 is connected to a second driving portion 219. The second driving portion 219 moves the drying nozzle 217a in the X direction along the guide rails 248. Like the first driving portion 223B, the second driving portion 219 is represented as a block. Likewise, the second driving portion 219 has an endless belt, a pair of pulleys, and a motor. The endless belt is connected to the holding member 218 and a rotating shaft of the motor through the pulleys. The motor causes the drying nozzle 217a to move in the X direction. The motor is connected to the controlling portion S that controls driving of the motor.

Figure 33:
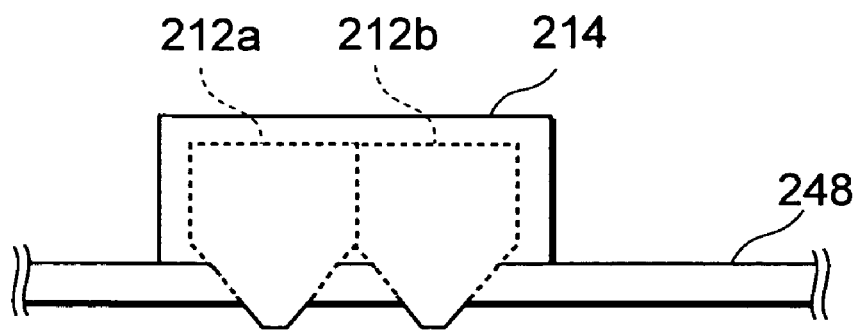
FIG. 33 is a side view showing a resist coating mechanism of the resist coating processing apparatus.

FIG. 33 is a side view showing the resist coating mechanism 223A. As shown in FIG. 33, lower portions of the first resist nozzle 212a and the second resist nozzle 212b are formed in almost V-letter shapes. Lower end portions of the first resist nozzle 212a and the second resist nozzle 212b protrude downward from for example the guide rails 248. Thus, maintenance work for the first resist nozzle 212a and the second resist nozzle 212b can be easily performed.

Figure 34:
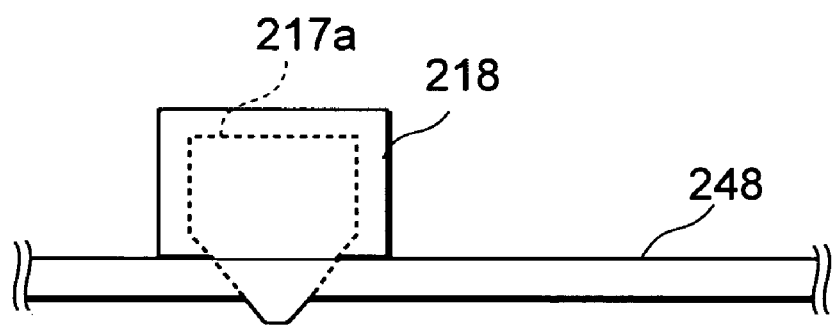
FIG. 34 is a side view showing a drying mechanism of the resist coating processing apparatus.

FIG. 34 is a side view showing the drying mechanism 223C. As shown in FIG. 34, a nearly V-letter shaped lower end portion of the drying nozzle 217a protrudes downward from for example the guide rails 248. Thus, maintenance work for the drying nozzle 217a can be easily performed.

Figure 35:
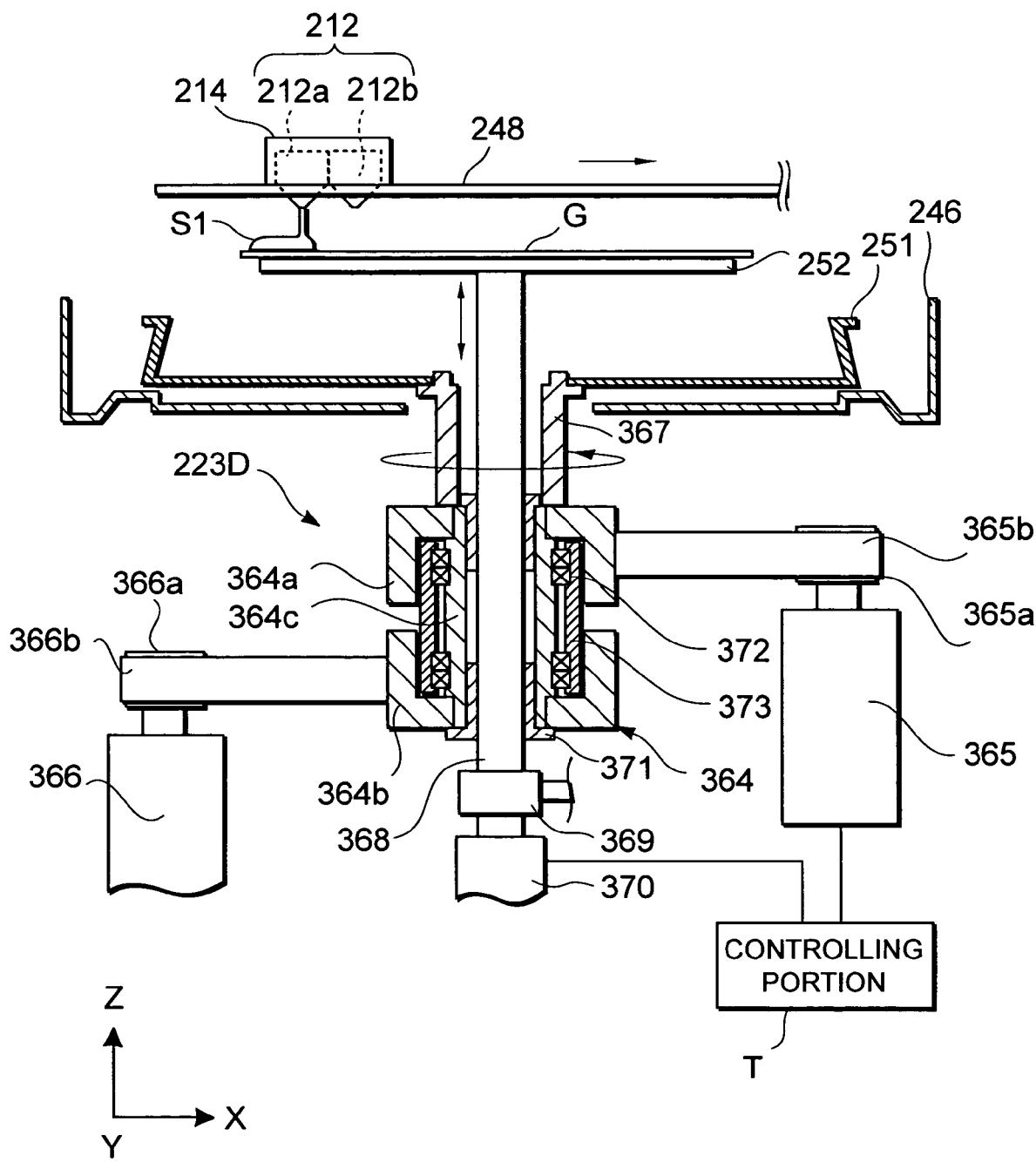
FIG. 35 is a sectional view showing a rotating mechanism of the resist coating processing apparatus.

As shown in FIG. 35, a rotating cup 251 is accommodated in the cup 246 of the resist coating mechanism 223A. The rotating cup 251 accommodates a substrate G when a resist is coated thereon. In the rotating cup 251, a chuck plate 252 that vacuum-sucks a substrate G is disposed. Below the cup 246, a rotating mechanism 223D is disposed. The rotating mechanism 223D rotates a substrate G when a resist coating process is performed.

The rotating mechanism 223D has a column-shaped rotating shaft member 368. An upper end of the rotating shaft member 368 is secured to the chuck plate 252. The rotating shaft member 368 can be raised and lowered by an air cylinder 370. The air cylinder 370 is disposed at a lower portion of the rotating shaft member 368. The rotating shaft member 368 is connected to a vacuum pump (not shown) through a vacuum seal portion 369. Thus, a substrate G can be vacuum chucked on the front surface of the chuck plate 252. Driving of the air cylinder 370 is controlled by a controlling portion T.

The rotating shaft member 368 is mounted on a spindle member 364 through a bearing 371 such as a ball spline. A hollow rotating cylinder member 367 secured at a lower portion of the rotating cup 251 is disposed at an upper portion of the spindle member 364. The spindle member 364 is composed of a cylinder member 364c, an upper pulley 364a, and a lower pulley 364b.

The cylinder member 364c is disposed inside the spindle member 364. The upper pulley 364a is disposed at an upper outer portion of the spindle member 364. The lower pulley 364b is disposed at an outer lower portion of the spindle member 364. The cylinder member 364c is mounted on a fixing collar 373 disposed in an inner space of the spindle member 364 through a plurality of bearings 372. The upper pulley 364a is connected to a driving pulley 365a rotated and driven by a motor 365 through a timing belt 365b. Likewise, the lower pulley 364b is connected to a driving pulley 366a rotated and driven by a motor 366 through a timing belt 366b. The rotations of the motors 365 and 366 are controlled by the controlling portion T. The motors 365 and 366 synchronously rotate at the same rotating speed and in the same direction. Thus, the spindle member 364, the rotating cylinder member 367, the rotating cup 251, the bearing 371, the rotating shaft member 368, and the chuck plate 252 are integrally rotated.

Figure 36:
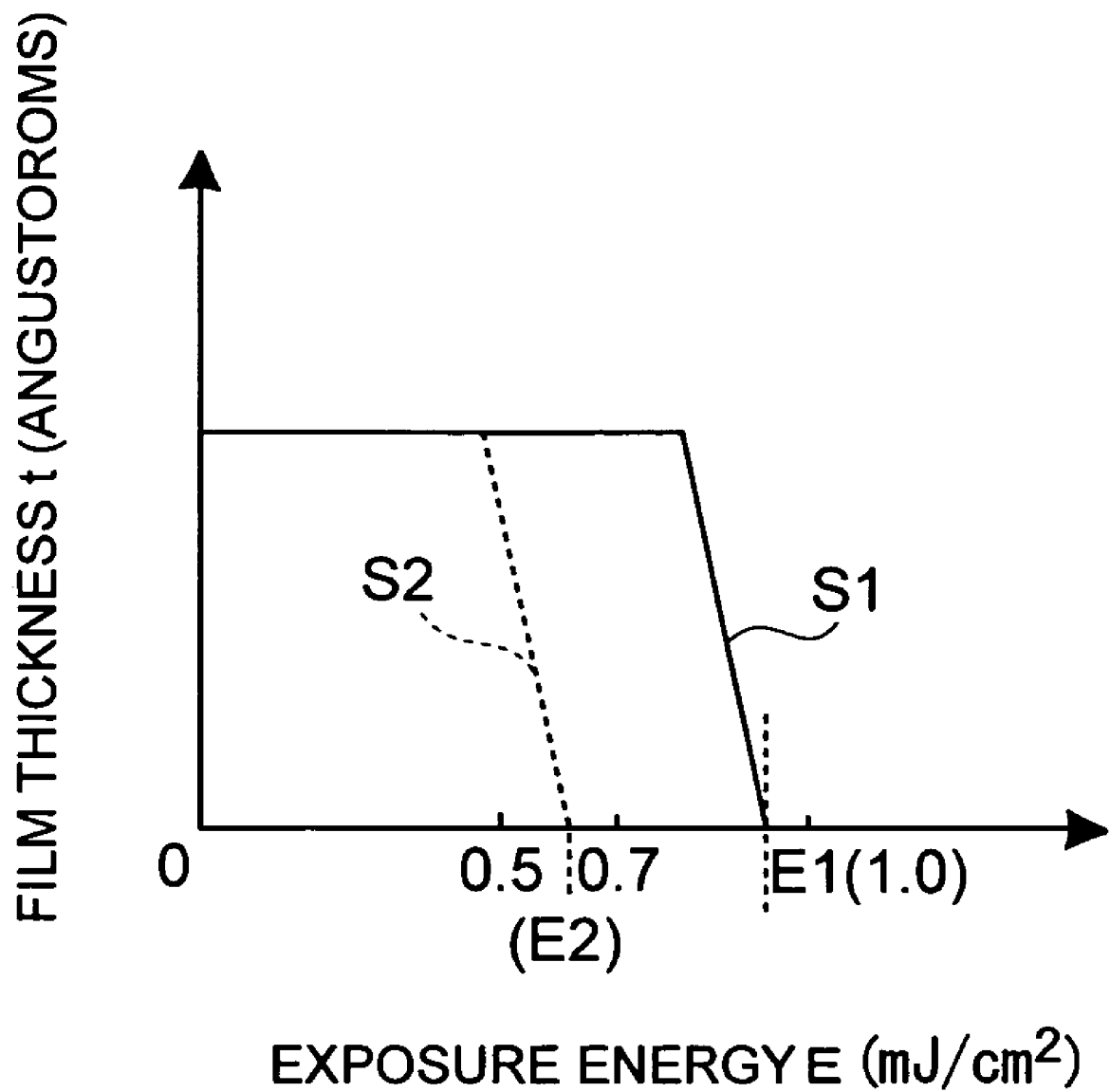
FIG. 36 is a graph showing the relation of exposure energy of light irradiated to a resist and the film thickness of the resist that has been developed.

FIG. 36 is a graph showing the relation of exposure energy E (mJ/cm$^2$) of irradiated light with which an exposing process is performed and a film thickness t 25 (angstroms) of a resist that has been developed. A first resist S1 and a second resist S2 stored in a first resist tank and a second resist tank are coated on a substrate G. The first resist S1 exposure-reacts when exposure energy E is equal to or larger than first exposure energy E1 (for example, exposure energy in a full exposing process). In contrast, the second resist S2 exposure-reacts when exposure energy E is equal to or larger than second exposure energy E2 that is smaller than the first exposure energy E1 (assuming that the intensity of the exposure energy E1 is 1.0, the second exposure energy E2 is in the range from 0.5 E1 to 0.7 E1). When the first and second resists S1 and S2 that have exposure-reacted are developed, they are dissolved. Thus, when the exposure energy E is 0.7 E1, the first resist S1 does not exposure-react (after it is developed, the film thickness t does not vary). In contrast, the second resist S2 exposure-reacts (after it is developed, the film thickness t becomes 0).

Next, with reference to the accompanying drawings, operations of the resist coating process unit (CT) and the exposing unit 204 will be described.

Figure 37A:
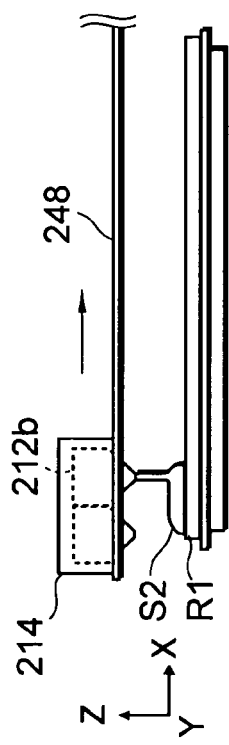
FIG. 37A to FIG. 37F are sectional views showing steps of a resist coating process.

First of all, as shown in FIG. 37A, by driving a pump (not shown) or the like, a substrate G is sucked to the chuck plate 252. Thereafter, by driving a pump (not shown), a resist contained in the first resist tank is discharged from the first resist nozzle 212a. During that, by driving the motor of the first driving portion 223B, the first resist nozzle 212a is moved along the substrate G that extends in the X direction.

At that point, the moving speed of the first resist nozzle 212*a* is controlled by the controlling portion S so that the film thickness of the first resist S1 becomes uniform (this operation applies to the following). Thus, the first resist S1 is coated on the substrate G.

Figure 37B:
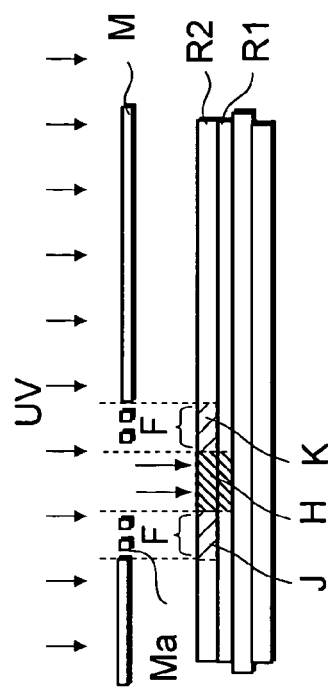

Next, as shown in FIG. 37B, by driving the motor 365 and the motor 366 shown in FIG. 35, the chuck plate 252 is rotated. As a result, the first resist S1 is uniformly dispersed and dried on the substrate G.

Figure 37C:
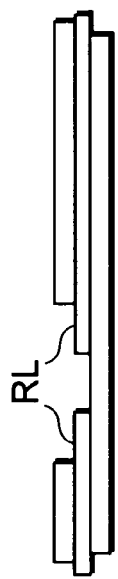

Thereafter, as shown in FIG. 37C, by driving the motor of the second driving portion 219, the drying nozzle 217*a* is moved in the X direction. During that, a blower fan connected to the drying nozzle 217*a* through the connection pipe (not shown) is operated. As a result, air is supplied to a front surface Sa of the first resist S1. Consequently, the first resist S1 is dried and a first resist layer R1 is formed on the substrate G.

Figure 37D:
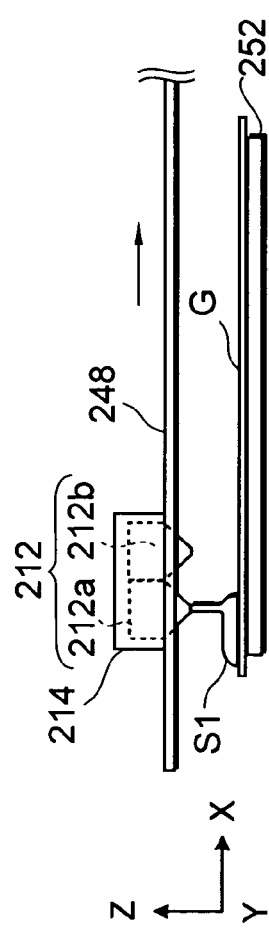

Thereafter, as shown in FIG. 37D, by driving the pump (not shown), the resist contained in the second resist tank is discharged from the second resist nozzle 212*b*. During that, by driving the first driving portion 223B, the second resist nozzle 212*b* is moved in the X direction along the substrate G. As a result, a second resist S2 is coated on the front surface of the dried first resist layer R1. In the first driving portion 223B, the front surface of the second resist S2 is dried and a second resist layer R2 is formed thereon (see FIG. 37E).

Figure 37E:
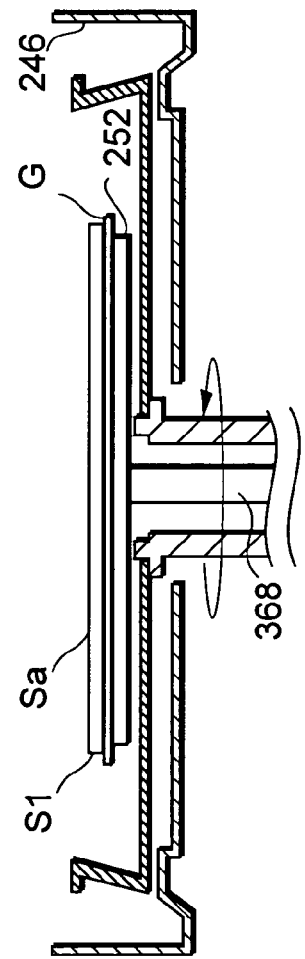
Figure 37F:
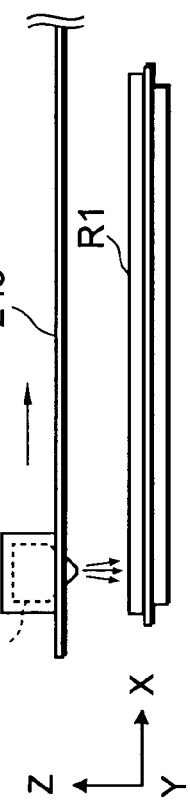

Thereafter, as shown in FIG. 37E, in the exposing unit 204, the resist coated substrate G is exposed through a half-exposure mask M (ultraviolet ray UV is irradiated). The half-exposure mask M has an opening Ma with which exposure amount is controlled. In other words, the half-exposure mask M has a portion that does not allow first exposure energy E1 to pass, a portion that allows first exposure energy E1 to fully pass, and a portion that allows second exposure energy E2 to pass (50 percent to 70 percent of first exposure energy E1) (hereinafter, a region to which the second exposure energy E2 is irradiated is referred to as a half-exposure region F). Thus, when the substrate G is exposed with the half-exposure mask M (hereinafter referred to as half-exposure), a region H of the first and second resist layers R1 and R2 and regions J and K of the second resist layer R2 exposure-react. As a result, as shown in FIG. 37F, after the exposed substrate G is developed, the regions H, J, and K are dissolved. Thus, a flat surface RL appears.

According to the present embodiment, the substrate G on which the first and second resists S1 and S2 that exposure-react with the first and second exposure energies E1 and E2 (E2=0.5E1 to 0.7E1) have been coated can be obtained. Thus, in the half-exposure region F, the first resist layer R1 does not exposure-react, whereas the regions J and K of the second resist layer R2 exposure-react. As a result, the exposure-reactions of the first resist layer R1 and the second resist layer R2 can be clearly separated. Thus, the uniformity of the residual film of the resists that have been developed can be improved.

Thus, unlike with the related art, the distances of a plurality of electrodes etched can be prevented from becoming non-uniform. As a result, switching times can be prevented from varying on the substrate G. Thus, colors can be prevented from shading in a picture displayed on a liquid crystal display.

According to the present embodiment, the resist coating process unit (CT) 223*a* has the drying nozzle 217*a*. After the first resist S1 has been coated, before the second resist S2 is coated, the drying nozzle 217*a* dries the first resist S1. Thus, since the second resist S2 can be coated on the dried first resist S7, the first resist layer R1 and the second resist S2 can be prevented from being mixed. As a result, after the resists have been developed, the uniformity of the thickness of the residual films of the resists can be further improved.

According to the present embodiment, the resist coating process unit (CT) 223*a* has the motors 365 and 366 that rotate the chuck plate 252. Thus, the first resist S1 coated on the substrate G can be dispersed by the rotations of the motor 255 and thereby quickly dried. In addition, the front surface of the first resist S1 coated on the substrate G become uniform. Thus, since the second resist S2 can be coated on the flat surface of the first resist layer R1, the first resist layer R1 and the second resist S2 can be prevented from being mixed.

According to the present embodiment, the second exposure energy E2 is set to equal to or larger than 50 percent and equal to or smaller than 70 percent of the first exposure energy E1. Thus, an incorrect reaction of the second resist S2 that tends to take place when the second exposure energy E2 is smaller than 50 per cent of the first exposure energy E1 can be prevented. In addition, when the second exposure energy E2 exceeds 70 percent of the first exposure energy E1, the first exposure energy E1 becomes close to the second exposure energy E2. Thus, the exposure reaction of the first resist layer R1 and the exposure reaction of the second resist layer R2 cannot be separated. However, according to the present embodiment, their exposure reactions can be separated.

Next, with reference to the accompanying drawings, a further embodiment of the present invention will be described. In the following description, for simplicity, similar members to the foregoing embodiments will be denoted by similar reference numerals and their description will be omitted.

Figure 38:
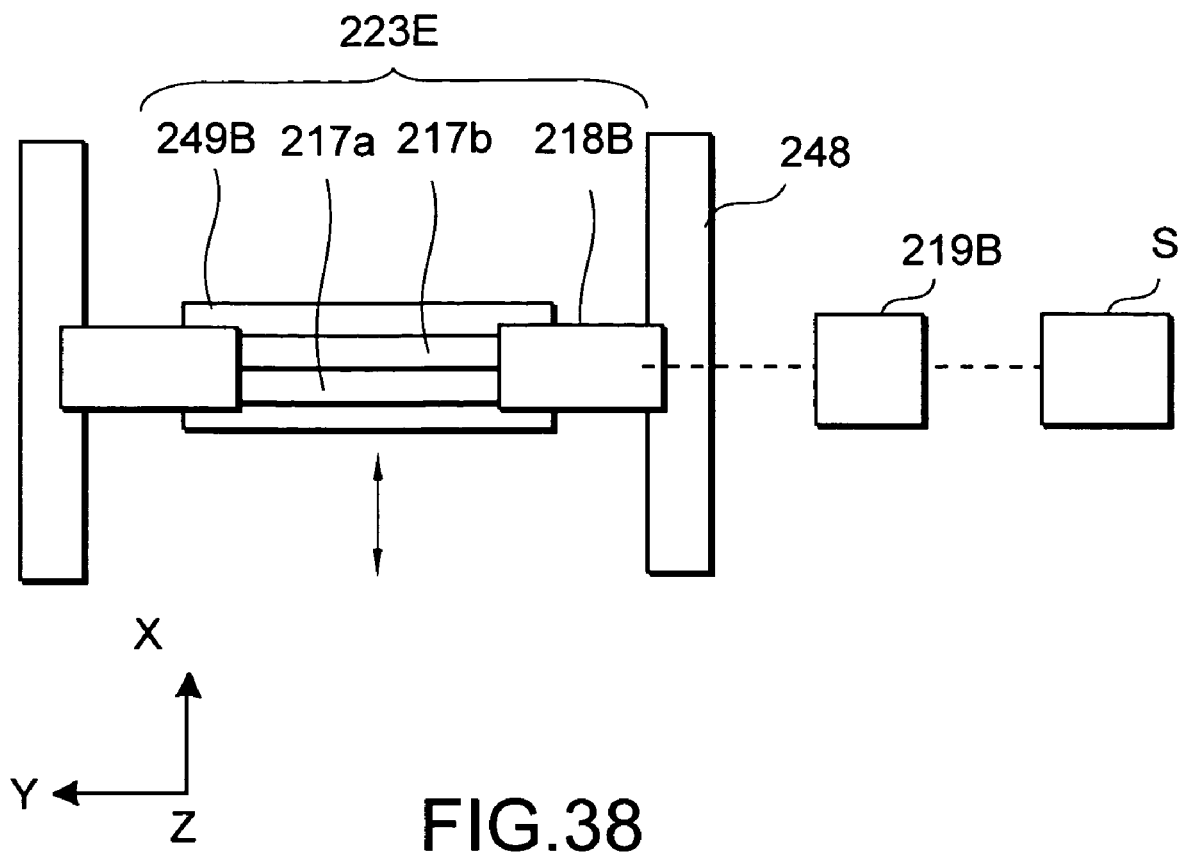
FIG. 38 is a plan view showing coating and drying nozzles of a resist coating process apparatus according to another embodiment of the present invention.

As shown in FIG. 38, the resist coating process unit (CT) has a coating and drying mechanism 223E instead of the drying mechanism 223C. The coating and drying mechanism 223E coats organic solvent on a resist and dries it. The coating and drying mechanism 223E has a drying nozzle 217*a*, a coating nozzle 217*b*, a pair of holding members 218B, and a nozzle accommodating member 249B. The coating nozzle 217*b* coats organic material on a resist. The holding members 218B hold both ends of the drying nozzle 217*a* and the coating nozzle 217*b*. The nozzle accommodating member 249B accommodates the drying nozzle 217*a*, the coating nozzle 217*b*, and the holding members 218B. The coating and drying mechanism 223E extends in the Y direction. The coating and drying mechanism 223E is hooked on the guide rails 248. The coating nozzle 217*b* is disposed adjacent to the drying nozzle 217*a* in such a manner that they extend in the Y direction. The holding members 218B are disposed on the guide rails 248 so that it can be moved in the X direction. As the organic material, for example polyvinyl alcohol (PVA) or the like is used.

One of the holding members 218B is connected to a third driving portion 219B. The third driving portion 219B moves the drying nozzle 217*a* and the coating nozzle 217*b* along the guide rails 248 that extend in the X direction. The third driving portion 219B has an endless belt, a pair of pulleys, and a motor. The endless belt is connected between the holding member 218B and a rotating shaft of the motor through the pulleys. The motor causes the drying nozzle 217*a* and the coating nozzle 217*b* to move in the X direction. The motor is connected to the controlling portion S. The controlling portion S controls driving of the motor. The coating nozzle 217*b* is connected to a PVA tank that stores polyvinyl alcohol through a pump (not shown).

Figure 39:
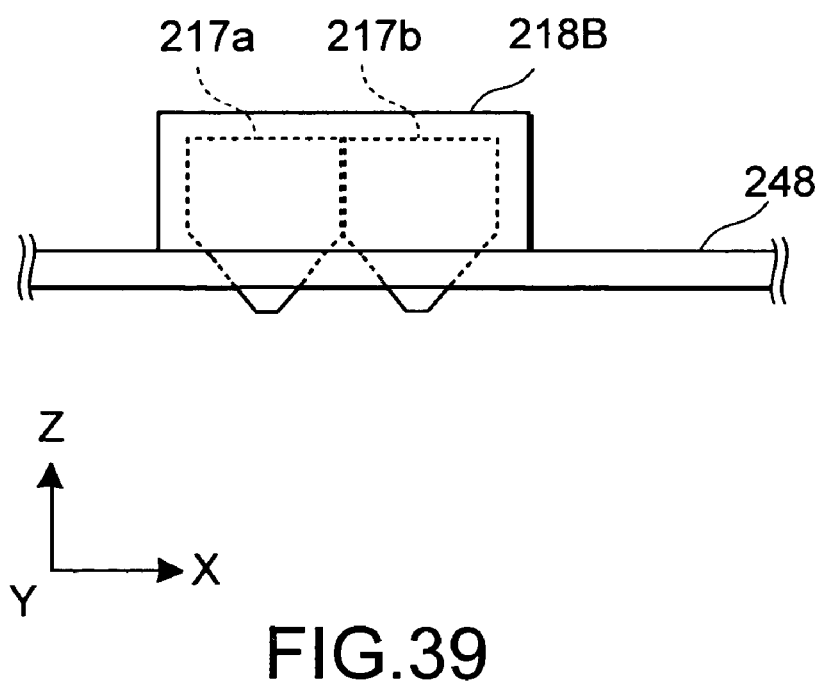
FIG. 39 is a side view showing the coating and drying nozzles of the resist coating process apparatus.

FIG. 39 is a side view showing the coating and drying mechanism 223E. As shown in FIG. 39, the drying nozzle 217*a* and the coating nozzle 217*b* have nearly V-letter shaped lower end portions that protrude downward from the guide rails 248. Thus, maintenance work for the drying nozzle 217*a* and the coating nozzle 217*b* can be easily performed.

Figure 40A:
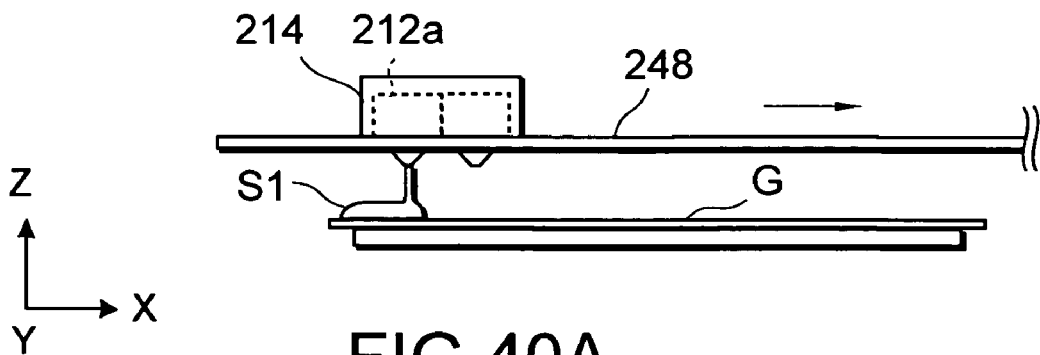
FIG. 40A to FIG. 40D are sectional views showing steps of the resist coating process.

As shown in FIG. 40A, according to the present embodiment, the first driving portion 223B is driven so as to move the first resist nozzle 212a in the X direction along the substrate G and coat the first resist S1 on the substrate G.

Figure 40B:
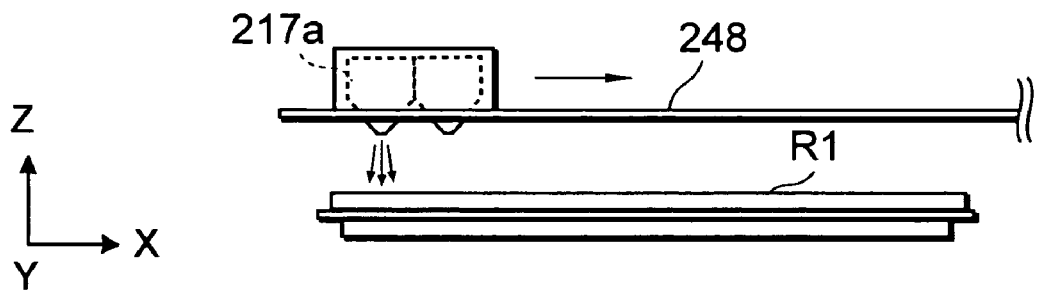

Thereafter, as shown in FIG. 40B, the motor of the third driving portion 219B is driven so as to move the drying nozzle 217a in the X direction, dry the front surface of the first resist S1, and form the first resist layer R1.

Figure 40C:
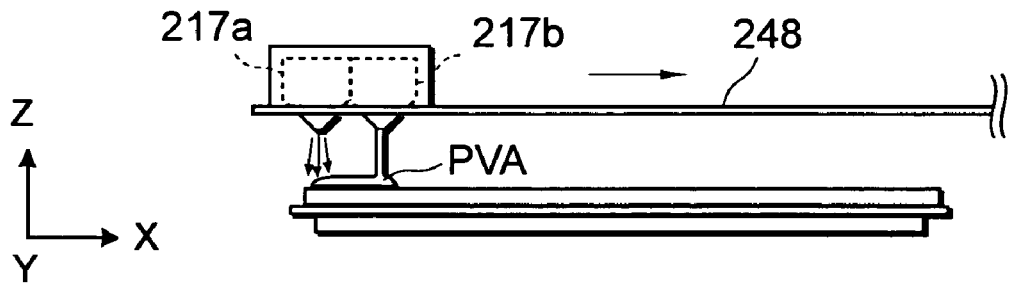

Thereafter, as shown in FIG. 40C, the motor of the third driving portion 219B is driven so as to move the drying nozzle 217a and the coating nozzle 217b in the X direction along the substrate G. At that point, the pump connected to the foregoing PVA tank is driven so as to supply polyvinyl alcohol from the PVA tank to the coating nozzle 217b. At that point, a blower fan (not shown) is operated so as to supply air from the drying nozzle 217a. Thus, while polyvinyl alcohol is being coated on the front surface of the first resist layer R1, the first resist layer R1 is dried and a transparent polyvinyl alcohol layer RP is formed thereon.

Figure 40D:
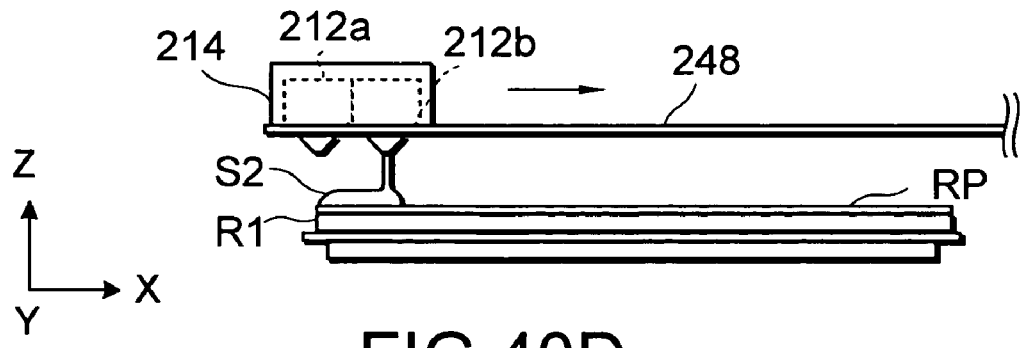

Thereafter, as shown in FIG. 40D, the motor of the first driving portion 223B is driven so as to move the second resist nozzle 212b in the X direction and coat the second resist S2 on the front surface of the polyvinyl alcohol layer RP. Since the other steps of the present embodiment are almost the same as those of the foregoing embodiment, their description will be omitted.

According to the present embodiment, a substrate G on which first resist S1 and second resist S2 that exposure-react with first exposure energy E1 and second exposure energy E2 (E2=0.5 E1 to 0.7 E1) are coated in the order can be obtained. Thus, in a half-exposure region F that is half-exposed, an exposure reaction of the first resist layer R1 and an exposure reaction of the resist layer R2 can be separated. Thus, the uniformity of the thickness of a residual film of the developed resists can be improved.

According to the present embodiment, after the first resist layer R1 is formed before the second resist layer R2 is formed, a polyvinyl alcohol layer RP is formed. Thus, the polyvinyl alcohol layer RP prevents the first resist layer R1 and the second resist S2 from being mixed.

According to the present embodiment, when the first resist S1 and the second resist S2 are coated, the resist nozzle 212 is moved in the X direction. Thus, when a resist is coated on a substrate, it is not necessary to rotate the substrate. As a result, since the rotating mechanism 223D can be omitted, the cost of the resist coating process unit (CT) can be reduced.

According to the present embodiment, the resist coating process unit (CT) has a drying nozzle 217a. The drying nozzle 217a is capable of drying the front surface of the first resist S1. Thus, the second resist S2 can be coated on the front surface of the dried first resist layer R1. As a result, the first resist layer R1 and the second resist S2 can be prevented from being mixed.

The present invention is not limited to the foregoing embodiments. Instead, various modifications are available.

According to the present embodiment, air is supplied by the drying nozzle 217a so as to dry the first resist S1 coated on the substrate G. Alternatively, while a heater (not shown) is being moved along the guide rails 248, the substrate G may be dried thereby. Alternatively, the inner pressure of the resist coating process unit (CT) may be reduced by a pump (not shown) and the resist may be dried through the drying nozzle 217a under reduced pressure. In this case, a drying process can be effectively performed for the resist.

According to the foregoing embodiment, a polyvinyl alcohol layer RP is formed on the front surface of the first resist layer R1. Alternatively, HMDS gas may be sprayed on the front surface of the first resist layer R1 so as to perform a hydrophobic process for the first resist layer R1 instead of forming the polyvinyl alcohol layer RP. In this case, the first resist layer R1 and the second resist S2 can be prevented form being mixed. Such a spraying process may be performed by for example the adhesion process unit (TB) 264 shown in FIG. 32.

As described above, according to the present invention, since an exposure reaction of a first resist and an exposure reaction of a second resist are separated, the uniformity of a residual film of half-exposed resists can be improved.

Although the present invention has been shown and described with respect to a best mode embodiment thereof, it should be understood by those skilled in the art that the foregoing and various other changes, omissions, and additions in the form and detail thereof may be made therein without departing from the spirit and scope of the present invention.

What is claimed is:

1. A substrate processing apparatus, comprising:
resist solution supplying means for supplying a resist;
affinitive material supplying means for supplying an affinitive material, the affinitive material being affinitive with a developing solution;
mixing means for mixing the resist supplied from the resist solution supplying means and the affinitive material supplied from the affinitive material supplying means, to obtain a mixed resist;
resist film forming means for coating the mixed resist on a substrate so as to form a mixed resist film thereon; and
controlling means for controlling a distribution of a dissolving characteristic of the mixed resist against the developing solution used for developing the mixed resist in a direction of a thickness of the mixed resist film, prior to developing the substrate to which the mixed resist is coated.

2. The substrate processing apparatus as set forth in claim 1,
wherein the controlling means performs a predetermined process for the mixed resist coated on the substrate so as to nonuniformly distribute the material in the direction of the thickness of the mixed resist film.

3. The substrate processing apparatus as set forth in claim 2,
wherein the predetermined process has at least one of a heating process and a pressure reducing process.

4. The substrate processing apparatus as set forth in claim 1,
wherein the controlling means supplies the developing solution used for the developing process to the mixed resist coated on the substrate.

* * * * *